(12) United States Patent
Miyairi et al.

(10) Patent No.: US 7,993,991 B2
(45) Date of Patent: Aug. 9, 2011

(54) MANUFACTURING METHOD OF THIN FILM TRANSISTOR AND MANUFACTURING METHOD OF DISPLAY DEVICE

(75) Inventors: Hidekazu Miyairi, Kanagawa (JP); Shigeki Komori, Kanagawa (JP); Toshiyuki Isa, Kanagawa (JP); Ryu Komatsu, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 233 days.

(21) Appl. No.: 12/326,661

(22) Filed: Dec. 2, 2008

(65) Prior Publication Data

US 2009/0152559 A1 Jun. 18, 2009

(30) Foreign Application Priority Data

Dec. 3, 2007 (JP) ................................ 2007-312348

(51) Int. Cl.
*H01L 21/00* (2006.01)
*G02F 1/136* (2006.01)

(52) U.S. Cl. ................... 438/151; 257/E21.414; 439/43

(58) Field of Classification Search .................... 257/66, 257/43, 59, E21.414, E29.273; 438/158, 438/149, 151; 349/43, 38, 152
See application file for complete search history.

(56) References Cited

U.S. PATENT DOCUMENTS

| | | | |
|---|---|---|---|
| 4,409,134 A | 10/1983 | Yamazaki | |
| 34,658 A | 7/1994 | Yamazaki et al. | |
| 6,008,065 A | 12/1999 | Lee et al. | |
| 6,485,997 B2 | 11/2002 | Lee et al. | |
| 6,493,048 B1 | 12/2002 | Baek et al. | |
| 6,509,215 B2 | 1/2003 | Fujikawa et al. | |
| 6,623,653 B2 | 9/2003 | Furuta et al. | |
| 6,630,687 B1 | 10/2003 | Koyama et al. | |
| 6,635,581 B2 | 10/2003 | Wong | |
| 7,023,021 B2 | 4/2006 | Yamazaki et al. | |
| 7,223,643 B2 | 5/2007 | Ohnuma et al. | |
| 7,315,344 B2 | 1/2008 | Lim | |
| 7,588,970 B2 | 9/2009 | Ohnuma et al. | |
| 7,608,490 B2 | 10/2009 | Yamazaki et al. | |
| 7,776,664 B2 | 8/2010 | Fujikawa et al. | |
| 7,807,516 B2 | 10/2010 | Ohnuma et al. | |
| 7,821,613 B2 | 10/2010 | Kimura | |

(Continued)

FOREIGN PATENT DOCUMENTS

JP 64-084669 3/1989

(Continued)

OTHER PUBLICATIONS

C.W. Kim et al.; "42.1: A Novel Four-Mask-Count Process Architecture for TFT-LCDs"; *SID Digest '00 : SID International Symposium Digest of Technical Papers*; pp. 1006-1009; 2000.

(Continued)

*Primary Examiner* — Thomas L Dickey
*Assistant Examiner* — Nikolay Yushin
(74) *Attorney, Agent, or Firm* — Fish & Richardson P.C.

(57) ABSTRACT

A manufacturing method of a thin film transistor and a display device using a small number of masks is provided. A first conductive film, an insulating film, a semiconductor film, an impurity semiconductor film, and a second conductive film are stacked. Then, a resist mask having a recessed portion is formed thereover using a multi-tone mask. First etching is performed to form a thin-film stack body, and second etching in which the thin-film stack body is side-etched is performed to form a gate electrode layer. The resist is made to recede, and then, a source electrode, a drain electrode, and the like are formed; accordingly, a thin film transistor is manufactured.

10 Claims, 44 Drawing Sheets

U.S. PATENT DOCUMENTS

| | | |
|---|---|---|
| 7,824,939 B2 | 11/2010 | Hosoya et al. |
| 7,842,528 B2 | 11/2010 | Fujikawa et al. |
| 2001/0049064 A1 | 12/2001 | Lee et al. |
| 2003/0013236 A1 | 1/2003 | Nakata et al. |
| 2005/0263768 A1 | 12/2005 | Ahn |
| 2005/0270434 A1 | 12/2005 | Jung et al. |
| 2006/0290867 A1 | 12/2006 | Ahn et al. |
| 2007/0002249 A1 | 1/2007 | Yoo et al. |
| 2007/0023790 A1 | 2/2007 | Ohnuma et al. |
| 2007/0037070 A1 | 2/2007 | Ohnuma et al. |
| 2007/0085475 A1 | 4/2007 | Kuwabara et al. |
| 2007/0126969 A1 | 6/2007 | Kimura et al. |
| 2007/0139571 A1 | 6/2007 | Kimura |
| 2007/0146591 A1 | 6/2007 | Kimura et al. |
| 2007/0222936 A1 | 9/2007 | Shih |
| 2009/0101906 A1 | 4/2009 | Hosoya et al. |
| 2009/0108260 A1 | 4/2009 | Lin et al. |
| 2009/0148970 A1 | 6/2009 | Hosoya et al. |
| 2009/0261334 A1 | 10/2009 | Ahn |

FOREIGN PATENT DOCUMENTS

| | | |
|---|---|---|
| JP | 03-011744 | 1/1991 |
| JP | 03-161938 | 7/1991 |
| JP | 07-307477 A | 11/1995 |
| JP | 2000-307118 A | 11/2000 |
| JP | 2003-179069 | 6/2003 |
| JP | 2007-133371 | 5/2007 |
| WO | 2008/099528 | 8/2008 |

OTHER PUBLICATIONS

"International Search Report (Application No. PCT/JP2008/071746; PCT11111) Dated Dec. 22, 2008,".

Written Opinion (Application No. PCT/JP2008/071746; PCT11111) Dated Dec. 22, 2008.

108 110 112

100 102 104 106

114

116C  116B  116A

FIG. 25A-1
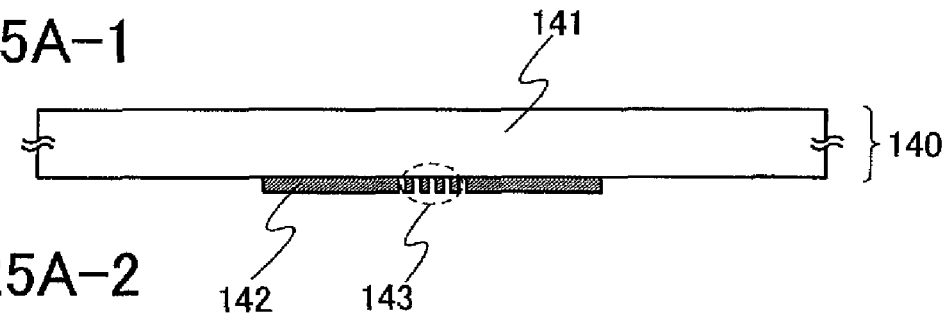
FIG. 25A-2
FIG. 25B-1
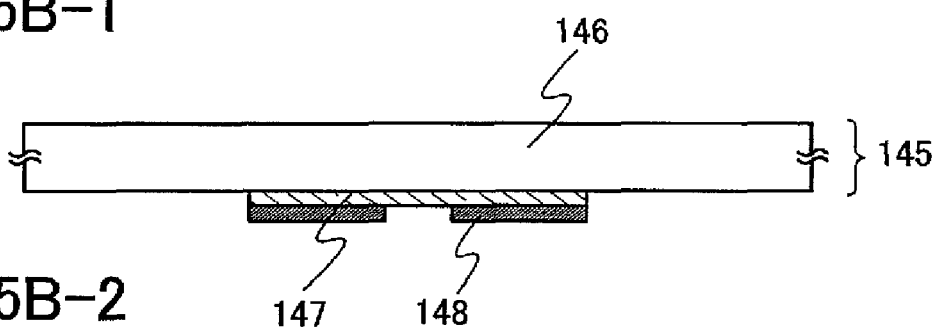
FIG. 25B-2

100 102 104 106

MANUFACTURING METHOD OF THIN FILM TRANSISTOR AND MANUFACTURING METHOD OF DISPLAY DEVICE

TECHNICAL FIELD

The present invention relates to a manufacturing method of a thin film transistor and a display device including the thin film transistor.

BACKGROUND ART

In recent years, thin film transistors that are formed using a semiconductor thin film having a thickness of several nanometers to several hundreds of nanometers over a substrate having an insulating surface such as a glass substrate have been attracting attentions. Thin film transistors are widely used for electronic devices such as ICs (integrated circuits) and electro-optical devices. In particular, thin film transistors are urgently developed as switching elements of image display devices typified by liquid crystal display devices, EL (electro luminescence) display devices, and the like. In an active matrix liquid crystal display device, specifically, a voltage is applied to a pixel electrode connected to a selected switching element and an opposite electrode corresponding to the pixel electrode, and thus, a liquid crystal layer disposed between the pixel electrode and the opposite electrode is modulated optically. The optical modulation can be recognized as a display pattern by an observer. An active matrix liquid crystal display device here means a liquid crystal display device which employs a method in which a display pattern is formed on a screen by driving pixel electrodes arranged in matrix using switching elements.

The application range of the active matrix liquid crystal display devices is expanding, and demands for larger screen size, higher definition, and higher aperture ratio are increasing. In addition, it is demanded that the active matrix liquid crystal display device has high reliability and that a production method of the active matrix liquid crystal display device offers high yield and reduces production cost. As a method for increasing productivity and reducing production cost, simplification of the process can be given.

In an active matrix liquid crystal display device, thin film transistors are mainly used as switching elements. In manufacturing thin film transistors, reduction in the number of photomasks used in photolithography is important for simplification of the process. If one photomask is added, the following steps are further needed: resist application, prebaking, light exposure, development, postbaking, and the like, and moreover other steps before and after the aforementioned steps, such as film formation and etching and further resist removal, cleaning, drying, and the like. The number of steps is significantly increased only by adding one photomask in the manufacturing process. Therefore, many techniques for reducing the number of photomasks in a manufacturing process have been developed.

Many conventional techniques for reducing the number of photomasks use a complicated technique such as backside light exposure, resist reflow, or a lift-off method, which requires a special apparatus. There has been a concern that yield is reduced due to various problems caused by usage of such a complicated technique. Moreover, there has often been no option but to sacrifice electric characteristics of thin film transistors.

As typical means for reducing the number of photomasks in a manufacturing process of a thin film transistor, a technique using a multi-tone mask (called a half-tone mask or a gray-tone mask) is widely known. As a technique for reducing the number of manufacturing steps by using a multi-tone mask, Patent Document 1 (Japanese Published Patent Application No. 2003-179069) is, for example, disclosed.

DISCLOSURE OF INVENTION

An object of the present invention is, in a manufacturing method of a thin film transistor, to reduce the number of photomasks used in photolithography than the number of photomasks used conventionally without employing a complicated technique.

Further, the present invention can be particularly applied to a thin film transistor used in a pixel of a display device (also referred to as a pixel TFT). Therefore, another object of the present invention is, in manufacturing a display device, to reduce the number of photomasks used in photolithography than the number of photomasks used conventionally.

In the present invention, a first conductive film and a thin-film stack body in which an insulating film, a semiconductor film, an impurity semiconductor film, and a second conductive film are stacked in this order over the first conductive film are formed; first etching is performed to expose the first conductive film and form a pattern of the thin film stack body; and second etching is performed to form a pattern of the first conductive film. Here, the second etching is performed under such conditions as to side-etch the first conductive film.

Here, as the first etching, either dry etching or wet etching may be used. Note that the first etching can be performed by one step when dry etching is employed as the first etching, while the first etching may be performed by plural steps when wet etching is employed as the first etching. Further, as the second etching, either dry etching or wet etching may be used. However, as described above, the first conductive film needs to be side-etched by the second etching. Therefore, it is preferable to employ wet etching as the second etching.

Here, since the second etching is performed under such conditions as to side-etch the first conductive film, the first conductive film recedes to an inner side than the thin-film stack body having the formed pattern. Accordingly, a side surface of the first conductive film after the second etching exists more on the inside than a side surface of the thin-film stack body having the formed pattern. Furthermore, the distance between the side surface of the first conductive film having the formed pattern and the side surface of the thin-film stack body having the formed pattern is almost uniform.

Note that the "pattern of the first conductive film" means, for example, a top view layout of a metal wiring which forms a gate electrode, a gate wiring, a capacitor electrode, and a capacitor wiring.

According to one aspect of the present invention, a manufacturing method of a thin film transistor includes the steps of: forming a first conductive film; forming an insulating film over the first conductive film; forming a semiconductor film over the insulating film; forming an impurity semiconductor film over the insulating film; forming a second conductive film over the impurity semiconductor film; forming a first resist mask over the second conductive film; first etching the insulating film, the semiconductor film, the impurity semiconductor film, and the second conductive film using the first resist mask to expose at least a surface of the first conductive film; second etching a portion of the first conductive film to form a gate electrode layer in such a manner that a width of the gate electrode is narrower than a width of the insulating film; forming a second resist mask over the second conductive film; and third etching the second conductive film, the impurity semiconductor film, and a part of the semiconductor film using the second resist mask to form source and drain electrode layers, source and drain region layers, and a semiconductor layer.

According to one aspect of the present invention, a manufacturing method of a thin film transistor includes the steps of: forming a first conductive film; forming an insulating film over the first conductive film; forming a semiconductor film over the insulating film; forming an impurity semiconductor film over the insulating film; forming a second conductive film over the impurity semiconductor film; forming a first resist mask over the second conductive film; first etching the insulating film, the semiconductor film, the impurity semiconductor film, and the second conductive film using the first resist mask to expose at least a surface of the first conductive film; forming a second resist mask over the second conductive film; after forming the second resist mask, second etching a portion of the first conductive film to form a gate electrode layer in such a manner that a width of the gate electrode is narrower than a width of the insulating film; and third etching the second conductive film, the impurity semiconductor film, and a part of the semiconductor film using the second resist mask to form source and drain electrode layers, source and drain region layers, and a semiconductor layer.

According to one aspect of the present invention, a manufacturing method of a thin film transistor includes the steps of: forming a first conductive film; forming an insulating film over the first conductive film; forming a semiconductor film over the insulating film; forming an impurity semiconductor film over the insulating film; forming a second conductive film over the impurity semiconductor film; forming a first resist mask including a recessed portion, over the second conductive film; first etching the insulating film, the semiconductor film, the impurity semiconductor film, and the second conductive film using the first resist mask to expose at least a surface of the first conductive film; second etching a portion of the first conductive film to form a gate electrode layer in such a manner that a width of the gate electrode is narrower than a width of the insulating film; forming a second resist mask by making the first resist mask recede to expose a part of the second conductive film overlapping with the recessed portion of the first resist mask; and third etching the second conductive film, the impurity semiconductor film, and a part of the semiconductor film using the second resist mask to form a source and drain electrode layer, source and drain region layers, and a semiconductor layer.

According to one aspect of the present invention, a manufacturing method of a thin film transistor includes the steps of: forming a first conductive film; forming an insulating film over the first conductive film; forming a semiconductor film over the insulating film; forming an impurity semiconductor film over the insulating film; forming a second conductive film over the impurity semiconductor film; forming a first resist mask including a recessed portion, over the second conductive film; first etching the insulating film, the semiconductor film, the impurity semiconductor film, and the second conductive film using the first resist mask to expose at least a surface of the first conductive film; forming a second resist mask by making the first resist mask recede to expose a part of the second conductive film overlapping with the recessed portion of the first resist mask; after forming the second resist mask, second etching a portion of the first conductive film to form a gate electrode layer in such a manner that a width of the gate electrode is narrower than a width of the insulating film; and third etching the second conductive film, the impurity semiconductor film, and a part of the semiconductor film using the second resist mask to form a source and drain electrode layer, source and drain region layers, and a semiconductor layer.

In the manufacturing methods having the above-described structures according to the present invention, in the case where the first resist mask has a recessed portion, the first resist mask is preferably formed using a multi-tone mask. By using the multi-tone mask, a resist mask having a recessed portion can be formed by a simple process.

By employing the manufacturing method of a thin film transistor having any of the above-described structures according to the present invention, an element region is formed by the first etching, and the second etching can make a side surface of the gate electrode layer more on the inside than a side surface of the element region by an almost uniform distance.

In any of the structures using the first etching and the second etching according to the present invention, it is preferable that the first etching be performed by dry etching and the second etching be performed by wet etching. The processing by the first etching is preferably performed with high precision, and side-etching needs to be performed in the processing by the second etching. For high-precision processing, dry etching is preferable. Since a chemical reaction is utilized in wet etching, side-etching is more likely to occur in wet etching than in dry etching.

A display device can be manufactured by selectively forming a pixel electrode so as to be connected to the source and drain electrode layer of the thin film transistor manufactured by the present invention having any of the above-described structures.

According to one aspect of the present invention, a manufacturing method of a display device includes the steps of forming a thin film transistor by any of the methods having the above-described structures, forming a protective insulating film to cover the thin film transistor, forming an opening portion in the protective insulating film so as to expose part of the source and drain electrode layer, and selectively forming a pixel electrode over the opening portion and the protective insulating film.

In the manufacturing method of a display device having the above-described structure according to the present invention, the protective insulating film is preferably formed by stacking an insulating film by a CVD method or a sputtering method and an insulating film by a spin coating method. More preferably, the protective insulating film is formed by stacking a silicon nitride film by a CVD method or a sputtering method and an organic resin film by a spin coating method. By formation of the protective insulating film in this manner, the thin film transistor can be protected from an impurity element or the like which may adversely affect electric characteristics of the thin film transistor, and planarity of a surface over which a pixel electrode is formed can be improved; accordingly, reduction in yield can be prevented.

A thin film transistor manufactured by using any of the manufacturing methods having the above-described structures according to the present invention includes a gate insulating film which covers a gate electrode layer, a semiconductor layer over the gate insulating film, a source region and a drain region over the semiconductor layer, a source electrode and a drain electrode over the source region and the drain region, and a cavity in contact with a side surface of the gate electrode layer. The vicinity of an edge of the gate electrode can have a lower dielectric constant (low-k) by providing the cavity.

Note that in this specification, a "film" is one formed over an entire surface without being formed into a pattern, and a "layer" means one which has been formed into a pattern with a desired shape using a resist mask or the like. However, as for each layer of stacked films, a "film" and a "layer" are used in an indistinguishable manner in some cases.

Note that etching is performed under such conditions as to cause unintended etching as little as possible.

Note that in this specification, a "gate wiring" means a wiring connected to a gate electrode of a thin film transistor. The gate wiring is formed using a gate electrode layer. Further, the gate wiring is sometimes referred to as a scanning line.

Note that in this specification, a "source wiring" is a wiring connected to a source electrode and a drain electrode of a thin film transistor. The source wiring is formed using a source and drain electrode layer. Further, the source wiring is sometimes called a signal line.

With the use of the present invention, the number of steps for manufacturing a thin film transistor can be significantly reduced. Further, since the thin film transistor manufactured using the present invention can be applied to a display device, the manufacturing steps of a display device can be significantly reduced as well. More specifically, with the use of the present invention, the number of photomasks can be reduced. It is also possible to manufacture a thin film transistor using one photomask (multi-tone mask). Accordingly, the number of steps for manufacturing a thin film transistor or a display device can be significantly reduced.

In addition, a complicated step using backside light exposure, resist reflow, a lift-off method, or the like is not needed unlike the conventional technique which is aimed at reducing the number of photomasks. Therefore, the number of manufacturing steps can be significantly reduced without reducing yield of a thin film transistor.

In the conventional technique which is aimed at reducing the number of photomasks, electric characteristics of a thin film transistor have often been sacrificed. In the present invention, the number of steps for manufacturing a thin film transistor can be significantly reduced while electric characteristics of the thin film transistor are maintained.

Furthermore, by the aforementioned effects of the present invention, manufacturing cost can be significantly reduced.

Since a thin film transistor manufactured by the manufacturing method of the present invention has a cavity which is in contact with an end portion of a gate electrode layer, leakage current between a gate electrode and a drain electrode can be made low.

BRIEF DESCRIPTION OF THE DRAWINGS

In the accompanying drawings:

FIGS. 25A-1 and 25A-2 and FIGS. 25B-1 and 25B-2 each illustrate a multi-tone mask used for a manufacturing method of the present invention;

BEST MODE FOR CARRYING OUT THE INVENTION

Figure 1A:
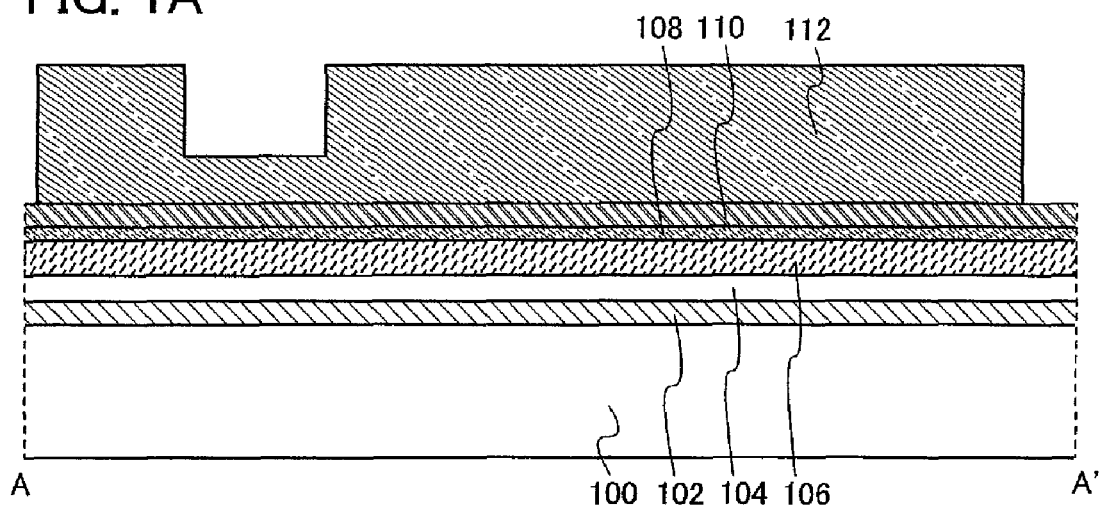
FIGS. 1A to 1C illustrate an example of a manufacturing method of a thin film transistor and a display device according to the present invention.

Embodiment modes and an embodiment of the present invention will be described below with reference to the drawings. However, the present invention is not limited to the following description. It is easily understood by those skilled in the art that the mode and details can be changed in various ways without departing from the scope and spirit of the present invention. Accordingly, the present invention should not be interpreted as being limited to the description of the embodiment modes and embodiment to be given below. Note that the same reference numerals are commonly used to denote the same components among different drawings in structures of the present invention explained below. The same hatching pattern is applied to similar parts, and the similar parts are not especially denoted by reference numerals in some cases.

Embodiment Mode 1

In Embodiment Mode 1, an example of a manufacturing method of a thin film transistor and a manufacturing method of a display device in which the thin film transistors are arranged in matrix will be described with reference to FIG. 1A to FIG. 25B-2.

Figure 20:
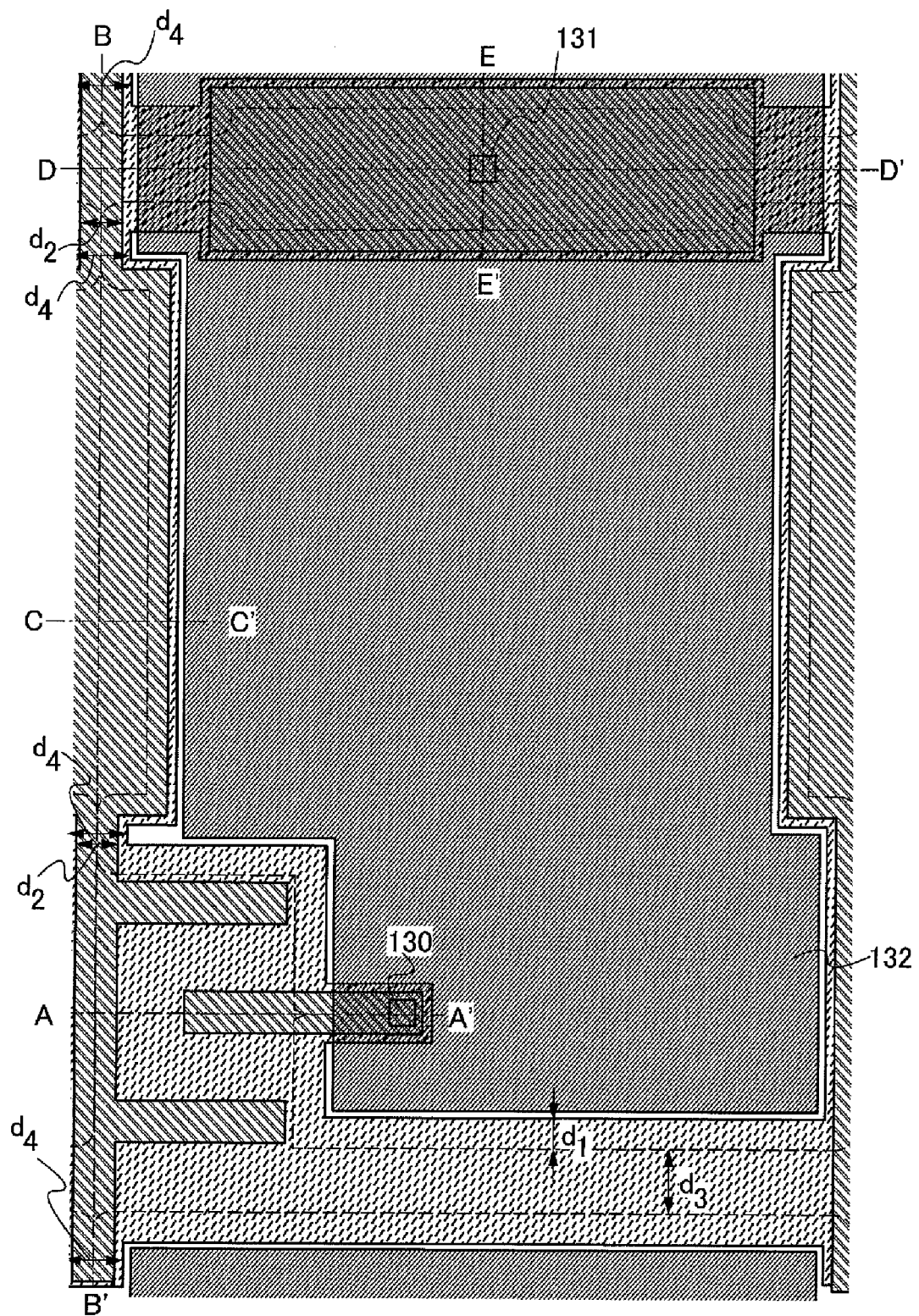
FIG. 20 illustrates an example of a manufacturing method of a thin film transistor and a display device according to the present invention.

FIG. 16 to FIG. 20 are top views of thin film transistors according to this embodiment mode. FIG. 20 is a completion drawing in the situation that formation of a pixel electrode is finished. FIG. 1A to FIG. 3C are cross-sectional views taken along the line A-A in FIG. 16 to FIG. 20. FIG. 4A to FIG. 6C are cross-sectional views taken along the line B-B' in FIG. 16 to FIG. 20. FIG. 7A to 9C are cross-sectional views taken along the line C-C' in FIG. 16 to FIG. 20. FIG. 10A to FIG. 12C are cross-sectional views taken along the line D-D' in FIG. 16 to FIG. 20. FIG. 13A to FIG. 15C are cross-sectional views taken along the line E-E' in FIG. 16 to FIG. 20.

First, a first conductive film 102, a first insulating film 104, a semiconductor film 106, an impurity semiconductor film 108, and a second conductive film 110 are formed over a substrate 100. These films may each have a single layer or stacked layers including a plurality of films.

The substrate 100 is an insulating substrate. In the case where the present invention is applied to a display device, a glass substrate or a quartz substrate can be used as the substrate 100. In this embodiment mode, a glass substrate is used.

The first conductive film 102 is formed of a conductive material. The first conductive film 102 is formed using a conductive material such as a metal material, e.g., titanium, molybdenum, chromium, tantalum, tungsten, aluminum, copper, neodymium, niobium, or scandium, or an alloy material including any of these metal materials as a main component. Note that the material of the first conductive film 102 needs to be a material which has such heat resistance as to withstand a later step (such as formation of the first insulating film 104) and is not unintentionally etched or eroded in a later step (such as etching of the second conductive film 110). Only in these conditions, the material of the first conductive film 102 is not limited to a particular material.

In addition, the first conductive film 102 can be formed by, for example, a sputtering method, a CVD method (including a thermal CVD method, a plasma CVD method, and the like), or the like. However, the formation method of the first conductive film 102 is not limited to a particular method.

Further, the first insulating film 104 serves as a gate insulating film.

The first insulating film 104 is formed of an insulating material. The first insulating film 104 can be formed using, for example, a silicon oxide film, a silicon nitride film, a silicon oxynitride film, a silicon nitride oxide film, or the like. Note that similar to the first conductive film 102, the material of the first insulating film 104 needs to be a material which has heat resistance and is not unintentionally etched or eroded in a later step. Only in these conditions, the material of the first insulating film 104 is not limited to a particular material.

In addition, the first insulating film 104 can be formed by, for example, a CVD method (including a thermal CVD method, a plasma CVD method, and the like), a sputtering method, or the like; however, the formation method of the first insulating film 104 is not limited to a particular method.

The semiconductor film 106 is formed of a semiconductor material. The semiconductor film 106 can be formed using, for example, amorphous silicon formed using a silane gas or the like. Note that similarly to the first conductive film 102 and the like, the material of the semiconductor film 106 needs to be a material which has heat resistance and is not unintentionally etched or eroded in a later step. Only in these conditions, the material of the semiconductor film 106 is not limited to a particular material. Therefore, germanium may be used. Note that the crystallinity of the semiconductor film 106 is not particularly limited as well.

In addition, the semiconductor film 106 can be formed by, for example, a CVD method (including a thermal CVD method, a plasma CVD method, and the like), a sputtering method, or the like. However, the formation method of the semiconductor film 106 is not limited to a particular method.

The impurity semiconductor film 108 is a semiconductor film containing an impurity element imparting one conductivity type, and is formed using a semiconductor material gas to which the impurity element imparting one conductivity type is added or the like. For example, the impurity semiconductor film 108 is a silicon film containing phosphorus or boron, which is formed using a silane gas containing phosphine (chemical formula: $PH_3$) or diborane (chemical formula: $B_2H_6$). Note that similarly to the first conductive film 102 and the like, the material of the impurity semiconductor film 108 needs to be a material which has heat resistance and is not unintentionally etched or eroded in a later step. Only in these conditions, the material of the impurity semiconductor film 108 is not limited to a particular material. Note that the crystallinity of the impurity semiconductor film 108 is not particularly limited as well.

In the case of manufacturing an n-channel thin film transistor, phosphorus, arsenic, or the like may be used as the impurity element imparting one conductivity type to be added. That is, a silane gas used for formation of the impurity semiconductor film 108 may contain phosphine, arsine (chemical formula: $AsH_3$), or the like at a predetermined concentration. On the contrary, in the case of manufacturing a p-channel thin film transistor, boron or the like may be used as the impurity element imparting one conductivity type used for addition. That is, a silane gas used for formation of the impurity semiconductor film 108 may contain diborane or the like at a predetermined concentration.

In addition, the impurity semiconductor film 108 can be formed by, for example, a CVD method (including a thermal CVD method, a plasma CVD method, and the like), or the like. However, the formation method of the impurity semiconductor film 108 is not limited to a particular method.

The second conductive film 110 is formed of a material which is a conductive material (a material mentioned as the material of the first conductive film 102) but is different from the material used for the first conductive film 102. Here, the "different material" means a material having a different main component. Specifically, a material which is not easily etched by second etching which is described later is preferably selected. Further, similarly to the first conductive film 102 and the like, the material of the second conductive film 110 needs to be a material which has heat resistance and is not unintentionally etched or eroded in a later step. Accordingly, only in these conditions, the material of the second conductive film 110 is not limited to a particular material.

In addition, the second conductive film 110 can be formed by, for example, a sputtering method, a CVD method (including a thermal CVD method, a plasma CVD method, and the like), or the like. However, the formation method of the second conductive film 110 is not limited to a particular method.

Next, a first resist mask 112 is formed over the second conductive film 110 (see FIG. 1A, FIG. 4A, FIG. 7A, FIG. 10A, and FIG. 13A). The first resist mask 112 is a resist mask having a recessed portion or a projected portion. In other words, the first resist mask 112 can also be referred to as a resist mask including a plurality of regions (here, two regions) having different thicknesses. In the first resist mask 112, the thick region is called a projected portion of the first resist mask 112 and the thin region is called a recessed portion of the first resist mask 112.

In the first resist mask 112, a projected portion is formed in a region where a source and drain electrode layer 120 is formed, and a recessed portion is formed in a region where a semiconductor layer is exposed without existence of the source and drain electrode layer 120.

The first resist mask 112 can be formed using a common multi-tone mask. Here, multi-tone masks will be described with reference to FIGS. 25A-1 to 25B-2.

A multi-tone mask is a mask capable of light exposure with multi-level light intensity, and typically, light exposure is performed with three levels of light intensity to provide an exposed region, a half-exposed region, and an unexposed region. When using the multi-tone mask, one-time light exposure and development process allows a resist mask with plural thicknesses (typically, two levels of thicknesses) to be formed. Therefore, by the usage of a multi-tone mask, the number of photomasks can be reduced.

FIG. 25A-1 and FIG. 25B-1 are cross-sectional views of typical multi-tone masks. A gray-tone mask 140 is illustrated in FIG. 25A-1 and a half-tone mask 145 is illustrated in FIG. 25B-1.

The gray-tone mask 140 illustrated in FIG. 25A-1 includes a light-blocking portion 142 formed using a light-blocking film on a substrate 141 having a light-transmitting property, and a diffraction grating portion 143 provided with a pattern of the light-blocking film.

The transmittance of light is controlled at the diffraction grating portion 143 in such a manner that slits, dots, mesh, or the like are provided at an interval equal to or less than the resolution limit of light used for light exposure. Note that the slits, dots, or mesh provided at the diffraction grating portion 143 may be provided periodically or nonperiodically.

As the substrate 141 having a light-transmitting property, quartz or the like can be used. The light-blocking film for forming the light-blocking portion 142 and the diffraction grating portion 143 may be formed using a metal film and preferably provided using chromium, chromium oxide, or the like.

In the case where the gray-tone mask 140 is irradiated with light for light exposure, as illustrated in FIG. 25A-2, the transmittance in the region overlapping with the light-blocking portion 142 is 0%, and the transmittance in the region where both the light-blocking portion 142 and the diffraction grating portion 143 are not provided is 100%. Further, the transmittance at the diffraction grating portion 143 is basically in the range of 10% to 70%, which can be adjusted by the interval of slits, dots, or mesh of the diffraction grating, or the like.

The half-tone mask 145 illustrated in FIG. 25B-1 includes a semi-light-transmitting portion 147 formed using a semi-light-transmitting film on a substrate 146 having a light-transmitting property, and a light-blocking portion 148 formed using a light-blocking film.

The semi-light-transmitting portion 147 can be formed using a film of MoSiN, MoSi, MoSiO, MoSiON, CrSi, or the like. The light-blocking portion 148 may be formed using a metal film in a similar manner to the light-blocking film of the gray-tone mask and preferably provided using chromium, chromium oxide, or the like.

In the case where the half-tone mask 145 is irradiated with light for light exposure, as illustrated in FIG. 25B-2, the transmittance in the region overlapping with the light-blocking portion 148 is 0%, and the transmittance in the region where both the light-blocking portion 148 and the semi-lighttransmitting portion 147 are not provided is 100%. Further, the transmittance in the semi-light-transmitting portion 147 is basically in the range of 10% to 70%, which can be adjusted by the kind, the thickness, or the like of the material to be formed.

By light exposure using the multi-tone mask and development, a first resist mask 112 which includes regions having different thicknesses can be formed.

Next, first etching is performed using the first resist mask 112. That is, the first insulating film 104, the semiconductor film 106, the impurity semiconductor film 108, and the second conductive film 110 are etched to form a thin-film stack body 114 (see FIG. 1B, FIG. 4B, FIG. 7B, FIG. 10B, FIG. 13B, and FIG. 16). At this time, at least a surface of the first conductive film 102 is preferably exposed. In this specification, this etching step is called "first etching." As the first etching, either dry etching or wet etching may be employed. Note that the first etching can be performed by one step when dry etching is employed as the first etching, while the first etching is preferably performed by plural steps when wet etching is employed as the first etching. This is because the etching rate varies depending on the kind of etched film and it is difficult to perform the etching by one step.

Next, second etching is performed using the first resist mask 112. That is, the first conductive film 102 is etched to form a gate electrode layer 116 (see FIG. 1C, FIG. 4C, FIG. 7C, FIG. 10C, FIG. 13C, and FIG. 17). In this specification, this etching step is called "second etching."

Note that the gate electrode layer 116 forms a gate wiring, a capacitor wiring, and a supporting portion. When a gate electrode layer is referred to as a gate electrode layer 116A, the gate electrode layer forms a gate wiring; when a gate electrode layer is referred to as a gate electrode layer 116B or a gate electrode layer 116D, the gate electrode layer forms a supporting portion; and when a gate electrode layer is referred to as a gate electrode layer 116C, the gate electrode layer forms a capacitor wiring. Then, these gate electrode layers are collectively referred to as the gate electrode layer 116.

The second etching is performed under such etching conditions that a side surface of the gate electrode layer 116 formed from the first conductive film 102 is provided more on the inside than a side surface of the thin-film stack body 114. In other words, the second etching is performed so that the side surface of the gate electrode layer 116 is in contact with a bottom surface of the thin-film stack body 114 (the width of the gate electrode layer 116 is narrower than that of the thin-film stack body 114 in the line A-A'). Further, the second etching is performed under such conditions that the etching rate with respect to the second conductive film 110 is low and the etching rate with respect to the first conductive film 102 is high. In other words, the second etching is performed under the conditions that the etching selectivity of the first conductive film 102 with respect to the second conductive film 110 is high. By performing the second etching under such conditions, the gate electrode layer 116 can be formed.

Note that the shape of the side surface of the gate electrode layer 116 is not particularly limited. For example, the shape may be a tapered shape. The shape of the side surface of the gate electrode layer 116 is determined depending on the conditions such as a chemical used in the second etching.

Here, the phrase "the conditions that the etching rate with respect to the second conductive film 110 is low and the etching rate with respect to the first conductive film 102 is high" or "the conditions that the etching selectivity of the first conductive film 102 with respect to the second conductive film 110 is high" means conditions satisfying the following first requirement and second requirement.

The first requirement is that the gate electrode layer 116 is necessarily left in a place. The place necessarily provided with the gate electrode layer 116 is regions indicated by dotted lines in FIG. 17 to FIG. 20. That is, it is necessary that the gate electrode layer 116 is left so as to form a gate wiring, a capacitor wiring, and a supporting portion after the second etching. In order that the gate electrode layer forms the gate wiring and the capacitor wiring, the second etching needs to be performed so as not to disconnect these wirings. As illustrated in FIGS. 1A to 1C and FIG. 20, the side surface of the gate electrode layer 116 is preferably more on the inside than the side surface of the thin-film stack body 114 by a distance $d_1$, and the distance $d_1$ may be set as appropriate by a practitioner according to the layout.

The second requirement is that a width $d_3$ of the gate wiring or the capacitor wiring formed by the gate electrode layer 116 and a minimum width $d_2$ of a source wiring formed by a source and drain electrode layer 120A have appropriate values (see FIG. 20). This is because as the source and drain electrode layer 120A is etched more by the second etching, the minimum width $d_2$ of the source wiring is reduced; accordingly, the current density of the source wiring becomes excessive and electric characteristics are degraded. Therefore, the second etching is performed under the conditions that the etching rate of the first conductive film 102 is not too high and the etching rate of the second conductive film 110 is as low as possible. In addition, the second etching is performed under the conditions that the etching rate of the first conductive film 102 in third etching that is described later is as low as possible.

It is difficult to make the minimum width $d_2$ of the source wiring large. This is because since the minimum width $d_2$ of the source wiring is determined by a minimum width $d_4$ of the semiconductor layer overlapping with the source wiring, the minimum width $d_4$ of the semiconductor layer has to be increased in order to make the minimum width $d_2$ of the source wiring larger; accordingly, it becomes difficult that the gate wiring and the capacitor wiring, which are adjacent to each other, are insulated from each other. In the present invention, the minimum width $d_4$ of the semiconductor layer is set smaller than about twice the distance $d_1$. In other words, the distance $d_1$ is set larger than about half the minimum width $d_4$ of the semiconductor layer.

It is acceptable as long as there is at least one portion where the width of the semiconductor layer overlapping with the source wiring is the minimum width $d_4$ between the gate wiring and the capacitor wiring which is adjacent to the gate wiring. It is preferable that the width of the semiconductor layer in a region adjacent to the gate wiring and a region adjacent to the capacitor wiring be the minimum width $d_4$ as illustrated in FIG. 20.

In addition, the width of the electrode in a portion connected to a pixel electrode layer, which is formed of the source and drain electrode layer, be equal to the minimum width $d_2$ of the source wiring.

As described above, the second etching under the condition in which side-etching can be performed is very important in the present invention. This is because by the second etching in which the first conductive film 102 is side-etched, the gate wiring and capacitor wiring, which are adjacent to each other and are formed of the gate electrode layer 116, can be formed to be insulated from each other (see FIG. 17).

Here, "side-etching" means etching in which a film is etched in not only a thickness direction of the film (a direction perpendicular to the substrate surface or a direction perpendicular to the surface of a base film of the film) but also in a direction perpendicular to the thickness direction (a direction parallel to the substrate surface or a direction parallel to the surface of the base film of the film). An end portion of the film subjected to side-etching can have various shapes depending on the etching rate of an etching gas or a chemical used for the etching with respect to the film. The end portion of the film is, in many cases, formed with a curved surface.

Figure 17:
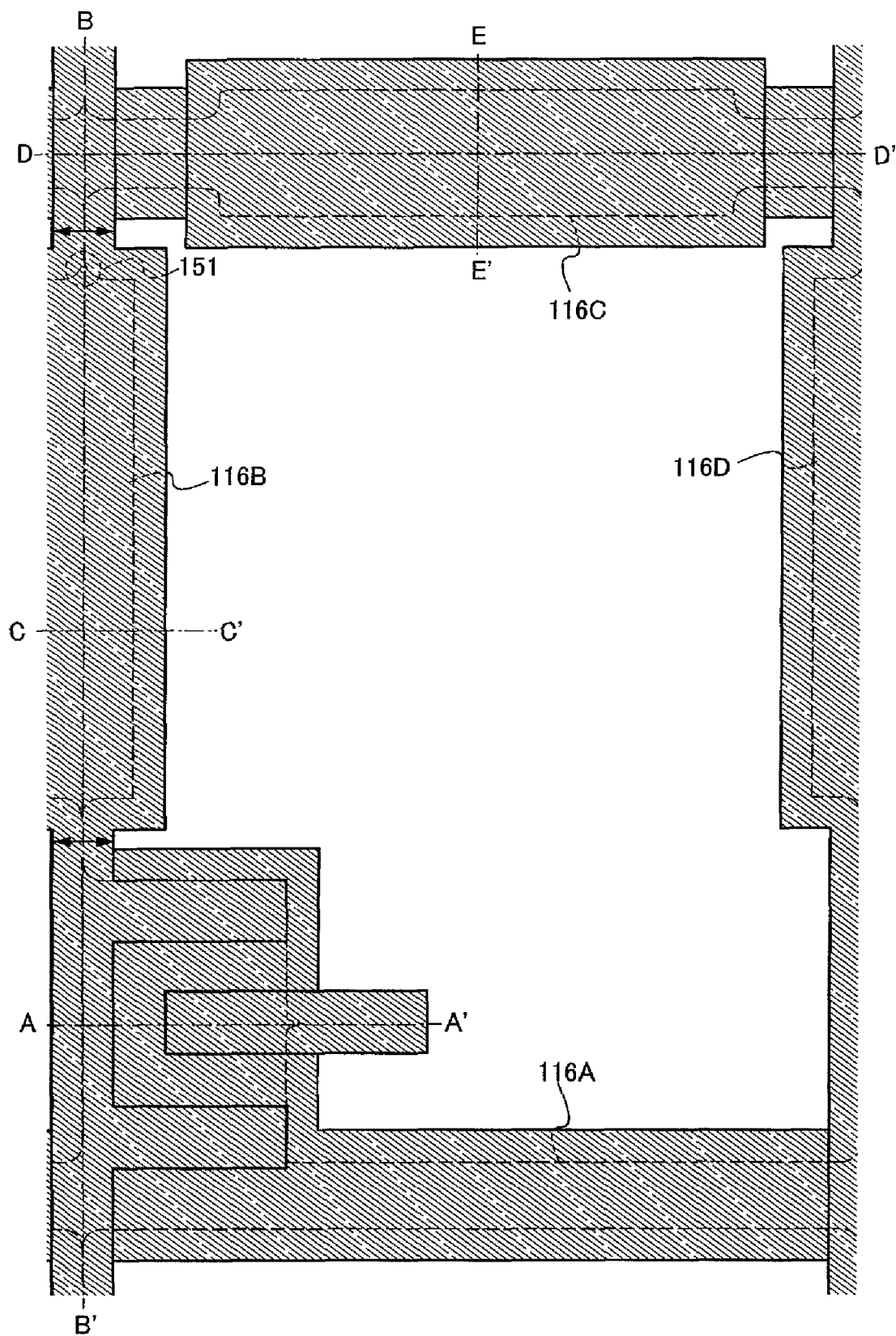
FIG. 17 illustrates an example of a manufacturing method of a thin film transistor and a display device according to the present invention.
Figure 18:
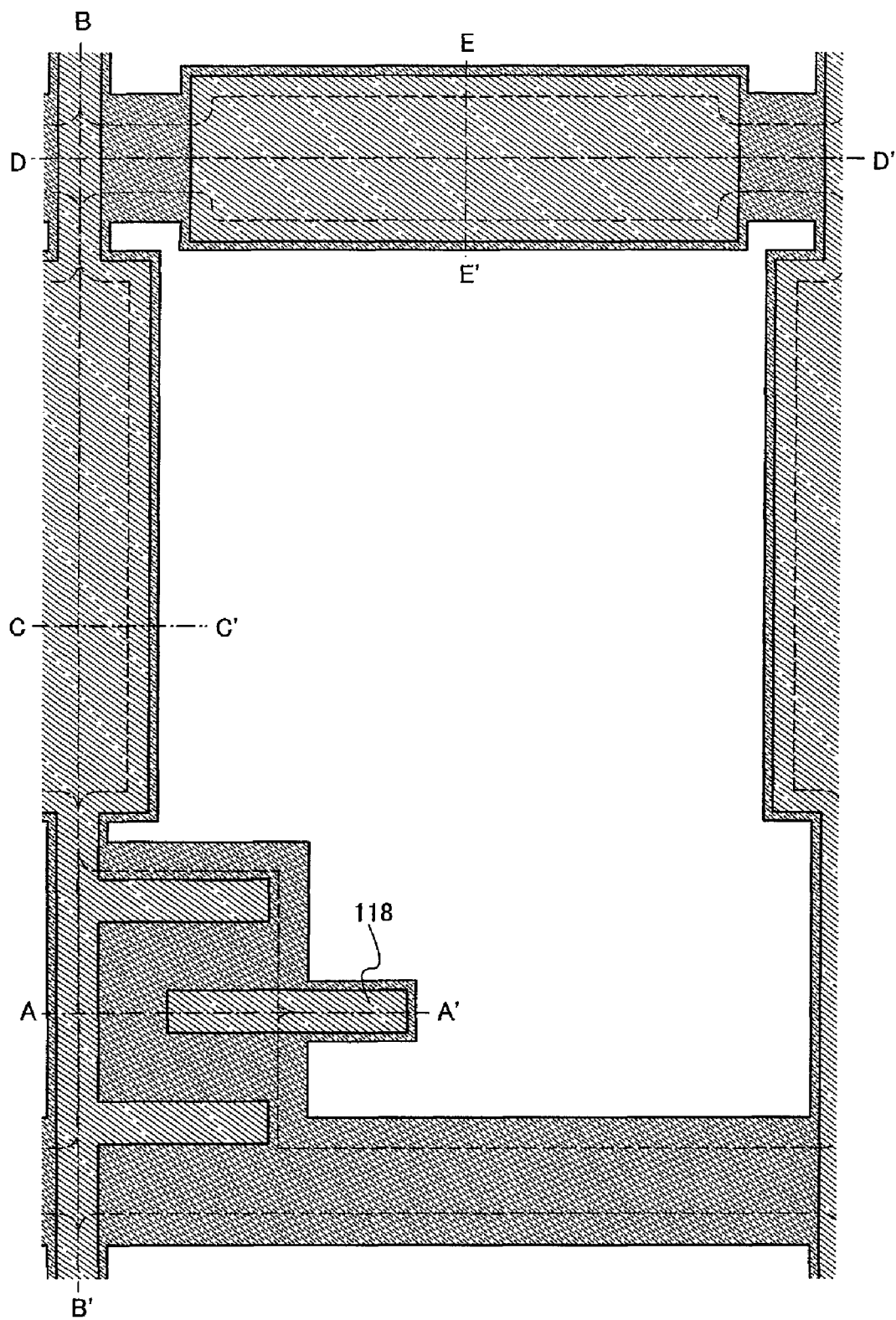
FIG. 18 illustrates an example of a manufacturing method of a thin film transistor and a display device according to the present invention.
Figure 19:
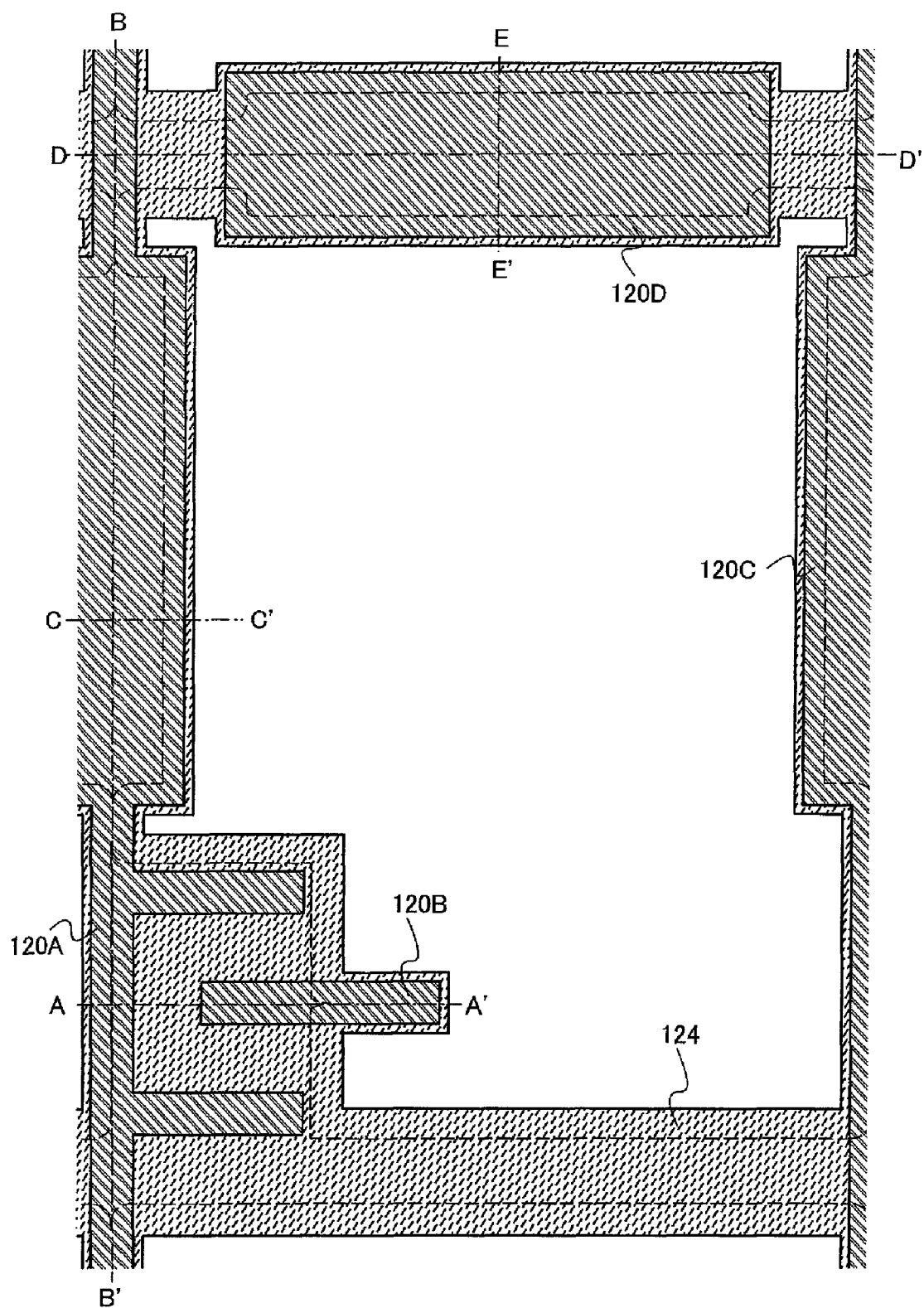
FIG. 19 illustrates an example of a manufacturing method of a thin film transistor and a display device according to the present invention.

As illustrated in FIG. 17, the thin-film stack body 114 formed by the first etching is designed to be thin in a portion adjacent to a supporting portion which is formed by the gate electrode layer 116B or the gate electrode layer 116D (see the portions indicated by the arrows in FIG. 17). With this structure, the gate electrode layer 116A and the gate electrode layer 116B or the gate electrode layer 116D can be disconnected to be insulated from each other by the second etching.

Figure 21:
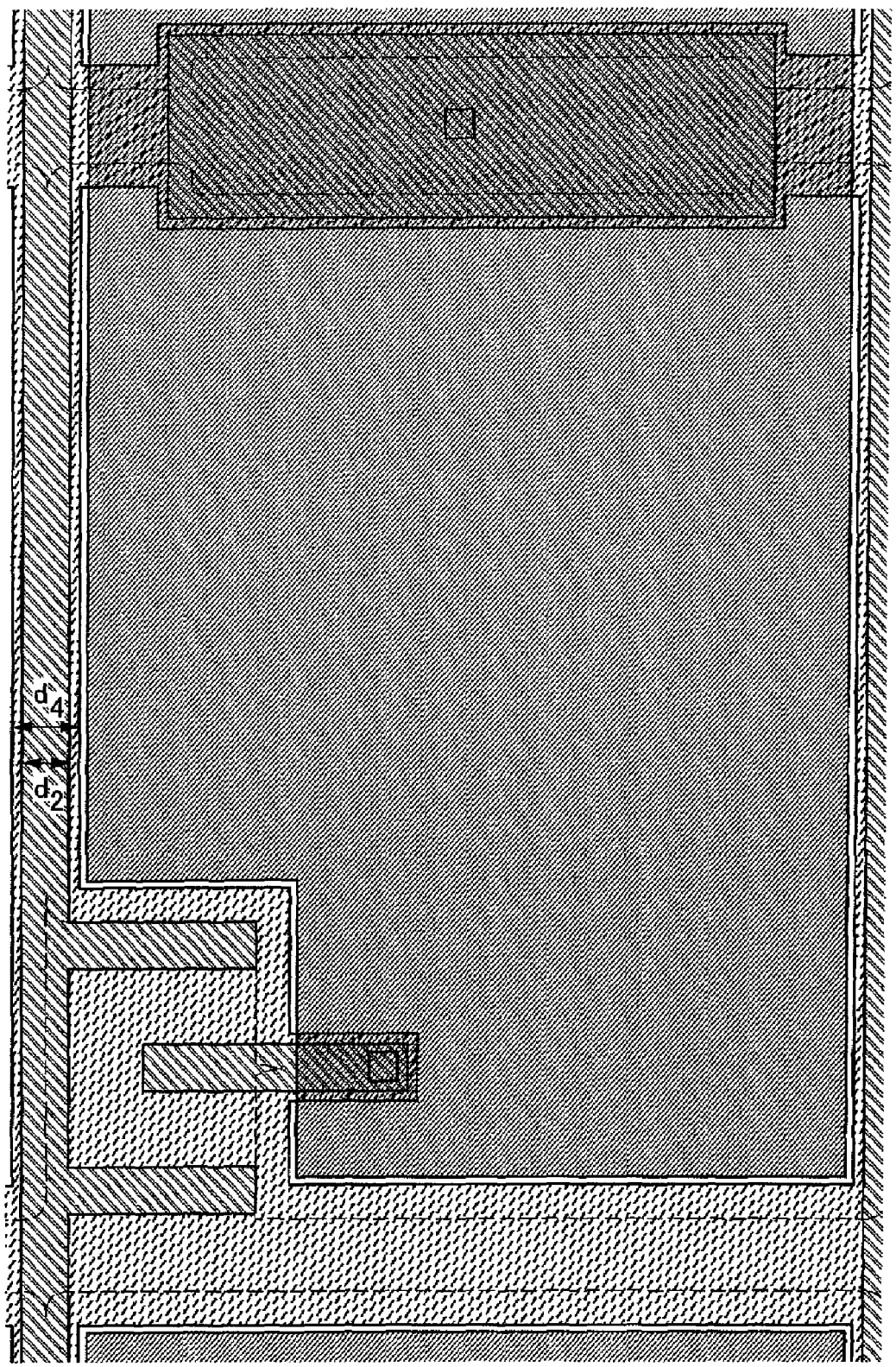
FIG. 21 illustrates an example of a manufacturing method of a thin film transistor and a display device according to the present invention.

The gate electrode layer 116B and the gate electrode layer 116D illustrated in FIG. 17 each serve as a supporting portion which supports the thin-film stack body 114. By the existence of the supporting portion, peeling of a film such as a gate insulating film formed over the gate electrode layer can be prevented. Further, by the existence of the supporting portion, a cavity region formed adjacent to the gate electrode layer 116 by the second etching can be prevented form being larger than necessary. Furthermore, it is preferable to provide the supporting portion because the thin-film stack body 114 can be prevented from being broken or damaged due to its own weight and, accordingly, yield is increased. However, the present invention is not limited to the mode with the supporting portion, and the supporting portion is not necessarily provided. An example of a top view of the mode without the supporting portion (corresponding to FIG. 20) is illustrated in FIG. 21.

As described above, the second etching is preferably performed by wet etching.

In the case where the second etching is performed by wet etching, aluminum or molybdenum may be deposited as the first conductive film 102, titanium or tungsten may be deposited as the second conductive film 110, and a chemical containing nitric acid, acetic acid, and phosphoric acid may be used for etching. Alternatively, molybdenum may be deposited as the first conductive film 102, titanium, aluminum, or tungsten may be deposited as the second conductive film 110, and a chemical containing hydrogen peroxide water may be used for etching.

In the case where the second etching is performed by wet etching, it is most preferable that a stacked film in which molybdenum is deposited over aluminum to which neodymium is added be formed as the first conductive film 102, tungsten be deposited as the second conductive film 110, and a chemical containing nitric acid at 2%, acetic acid at 10%, and phosphoric acid at 72% be used for etching. By usage of a chemical having such a composition ratio, the first conductive film 102 can be etched without the second conductive film 110 being etched. Note that neodymium is added to the first conductive film 102 for the purpose of reducing resistance of aluminum and preventing hillocks.

As illustrated in FIG. 17, the gate electrode layer 116 has a horn (e.g. a horn 151) when seen from the above. This is because since the second etching for forming the gate electrode layer 116 is almost isotropic, etching is performed so that the distance $d_1$ between the side surface of the gate electrode layer 116 and the side surface of the thin-film stack body 114 is almost uniform.

Next, the first resist mask 112 is made to recede; accordingly, the second conductive film 110 is exposed and a second resist mask 118 is formed. As means for forming the second resist mask 118 by recession of the first resist mask 112, for example, ashing using oxygen plasma can be given. However, the means for forming the second resist mask 118 by recession of the first resist mask 112 is not limited to this. Note that the case where the second resist mask 118 is formed after the second etching has been described here; however, the present invention is not limited to this and the second etching may be performed after formation of the second resist mask 118.

Next, the second conductive film 110 in the thin-film stack body 114 is etched using the second resist mask 118, so that the source and drain electrode layer 120 is formed (see FIG. 2A, FIG. 5A, FIG. 8A, FIG. 11A, FIG. 14A, and FIG. 18). Here, as the etching conditions, the conditions by which films other than the second conductive film 110 are not unintentionally etched or eroded or are not easily unintentionally etched or eroded are selected. In particular, it is important that etching is performed under the conditions that the gate electrode layer 116 is not unintentionally etched or eroded or is not easily unintentionally etched or eroded.

Note that the source and drain electrode layer 120 forms the source wiring, the electrode which connects the thin film transistor and the pixel electrode to each other, and one electrode of a capacitor functioning as a storage capacitor. When a source and drain electrode layer is referred to as the source and drain electrode layer 120A or a source and drain electrode layer 120C, the source and drain electrode layer forms an electrode layer forming a source wiring; when a source and drain electrode layer is referred to as a source and drain electrode layer 120B, the source and drain electrode layer forms an electrode layer which connects a drain electrode of the thin film transistor and the pixel electrode to each other; and when a source and drain electrode layer is referred to as a source and drain electrode layer 120D, the source and drain electrode layer forms one electrode layer which forms the capacitor with the capacitor wiring. Then, these source and drain electrode layers are collectively referred to as the source and drain electrode layer 120.

Note that for etching the second conductive film 110 in the thin-film stack body 114, either wet etching or dry etching may be performed.

Then, the impurity semiconductor film 108 and an upper portion of the semiconductor film 106 (back channel portion) in the thin-film stack body 114 are etched to form a source and drain region 122 (see FIG. 2B, FIG. 5B, FIG. 8B, FIG. 11B, FIG. 14B, and FIG. 19). Here, as the etching conditions, the conditions by which films other than the impurity semiconductor film 108 and the semiconductor film 106 are not unintentionally etched or eroded or are not easily unintentionally etched or eroded are selected. In particular, it is important that etching is performed under the conditions that the gate electrode layer 116 is not unintentionally etched or eroded or is not easily unintentionally etched or eroded.

Note that the etching of the impurity semiconductor film 108 and the upper portion of the semiconductor film 106 (back channel portion) in the thin-film stack body 114 can be performed by dry etching or wet etching.

Figure 2A:
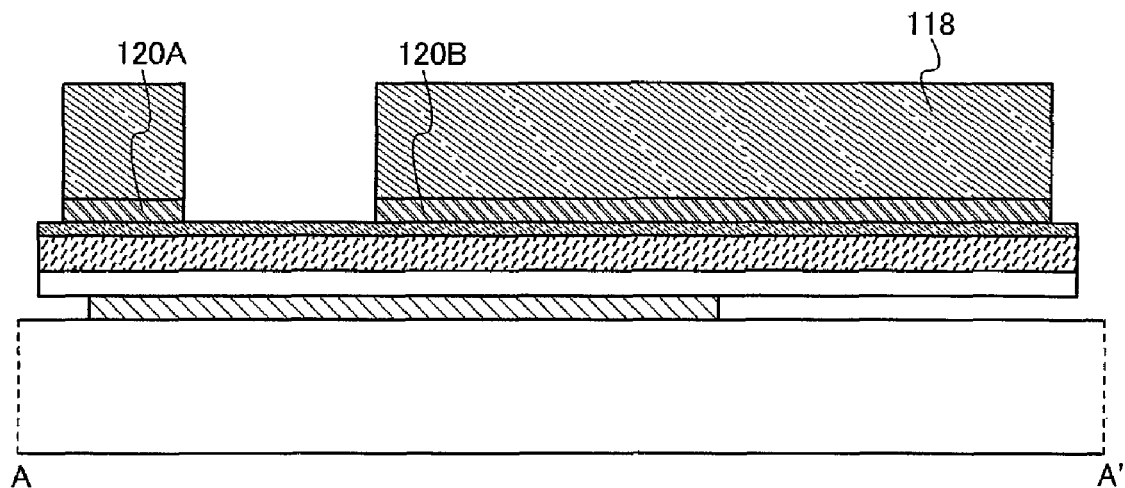
FIGS. 2A to 2C illustrate an example of a manufacturing method of a thin film transistor and a display device according to the present invention.
Figure 2B:
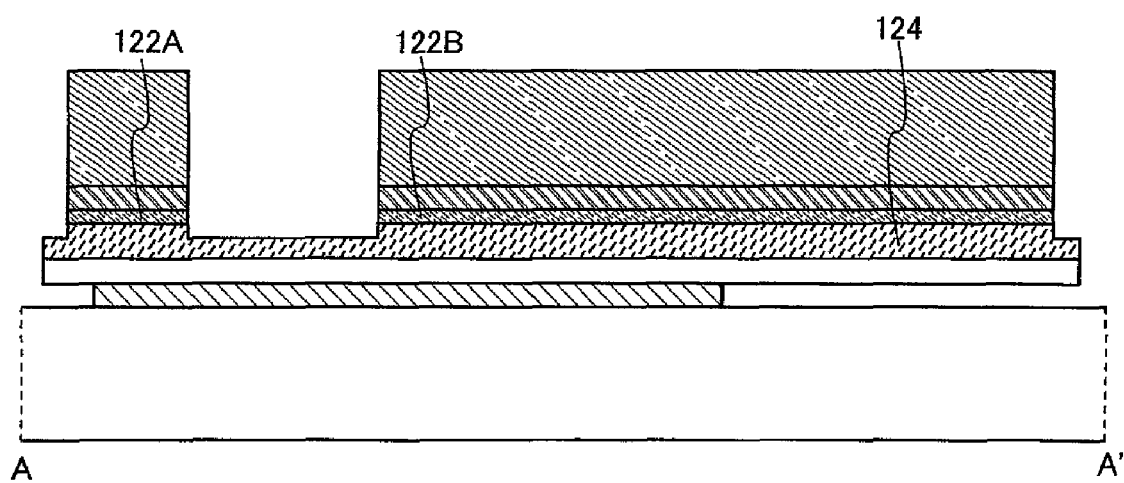
Figure 2C:
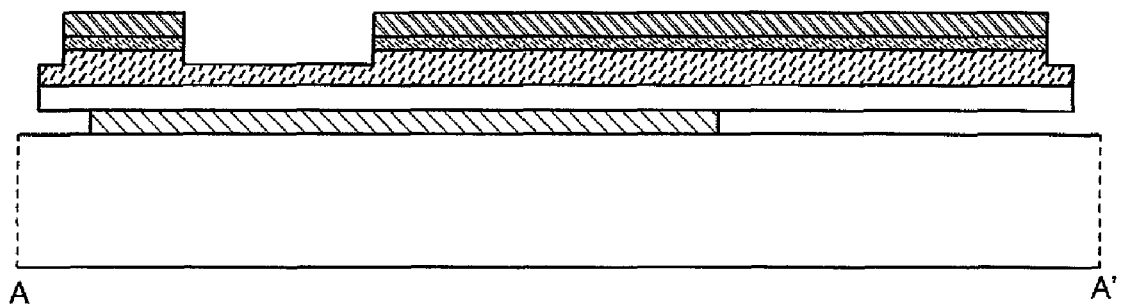

Then, the second resist mask 118 is removed (see FIG. 2C, FIG. 5C, FIG. 8C, FIG. 11C, and FIG. 14C); accordingly, a thin film transistor is completed (see FIG. 2C). As described above, the thin film transistor can be manufactured using one photomask (multi-tone mask).

In this specification, the steps described with reference to FIG. 2A and FIG. 2B are collectively referred to as "third etching." The third etching may be performed in separate steps as described above or may be performed in a single step.

A second insulating film is formed to cover the thin film transistor which is formed in the above-described manner. Although the second insulating film may be formed of only the first protective film 126, the second insulating film is formed of the first protective film 126 and a second protective film 128 here (see FIG. 3A, FIG. 6A, FIG. 9A, FIG. 12A, and FIG. 15A). The first protective film 126 may be formed in a similar manner to the first insulating film 104.

The second protective film 128 is formed by a method by which the surface thereof becomes almost planar. This is because when the surface of the second protective film 128 is almost planar, disconnection or the like of a pixel electrode layer 132 formed over the second protective film 128 can be prevented. Accordingly, the phrase "almost planar" means planar in such an extent that the aforementioned aim can be achieved, and does not mean that high planarity is required.

The second protective film 128 can be formed, for example, by a spin coating method or the like using photosensitive polyimide, acrylic, epoxy resin, or the like. Note that the present invention is not limited to these materials and the formation method.

Next, a first opening portion 130 and a second opening portion 131 are formed in the second insulating film (see FIG. 3B, FIG. 6B, FIG. 9B, FIG. 12B, and FIG. 15B). The first opening portion 130 and the second opening portion 131 are formed so as to reach at least the surface of the source and drain electrode layer. The formation method of the first opening portion 130 and the second opening portion 131 is not limited to a particular method and may be determined as appropriate by a practitioner in accordance with the diameter of the first opening portion 130 or the like. For example, the first opening portion 130 and the second opening portion 131 can be formed by dry etching using photolithography.

Note that in the case of forming the opening portions by photolithography, one photomask is used.

Next, the pixel electrode layer 132 is formed over the second insulating film (see FIG. 3C, FIG. 6C, FIG. 9C, FIG. 12C, FIG. 15C, and FIG. 20). The pixel electrode layer 132 is formed so as to be connected to the source and drain electrode layer 120 through the opening portions. Specifically, the pixel electrode layer 132 is formed so as to be connected to the source and drain electrode layer 120B through the first opening portion 130 and connected to the source and drain electrode layer 120D through the second opening portion 131. The pixel electrode layer 132 is preferably formed of a conductive material having a light-transmitting property. Here, as the conductive material having a light-transmitting property, indium tin oxide (hereinafter referred to as ITO), indium oxide containing tungsten oxide, indium zinc oxide containing tungsten oxide, indium oxide containing titanium oxide, indium tin oxide containing titanium oxide, indium zinc oxide, indium tin oxide to which silicon oxide is added, and the like may be given. The film of the conductive material having a light-transmitting property may be formed by a sputtering method, a CVD method, or the like; however, the present invention is not limited to a particular method. In addition, the pixel electrode layer 132 may have a single layer or stacked layers including a plurality of films.

In this embodiment mode, only the pixel electrode layer 132 is formed using the conductive material having a light-transmitting property; however, the present invention is not limited to this. As materials of the first conductive film 102 and the second conductive film 110, conductive materials having a light-transmitting property can also be used.

Note that in the case of forming the pixel electrode layer 132 by photolithography, one photomask is used.

In the above-described manner, manufacture of an active matrix substrate according to the present invention (so-called array process) is completed. As described in this embodiment mode, the thin film transistor can be manufactured using one photomask in such a manner that the gate electrode layer is formed utilizing side-etching and, further, the source and drain electrode layer is formed using a multi-tone mask.

Figure 3A:
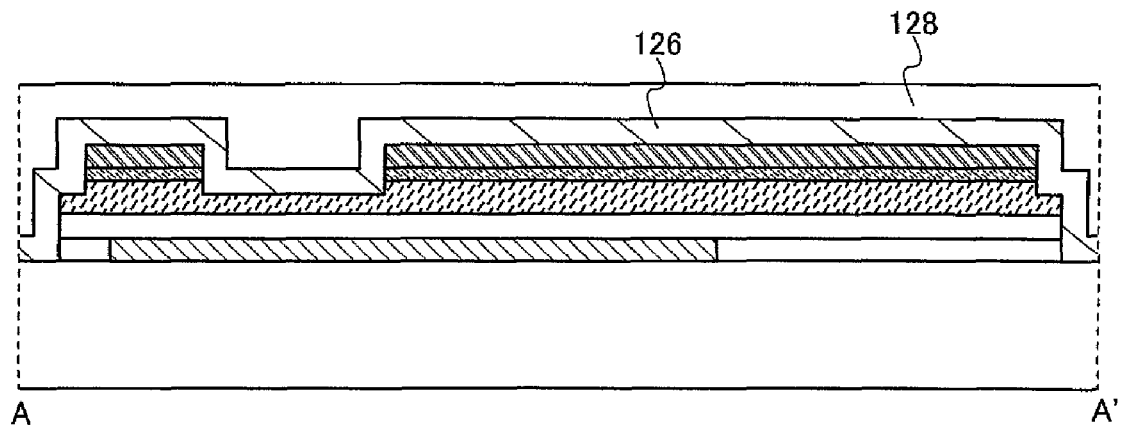
FIGS. 3A to 3C illustrate an example of a manufacturing method of a thin film transistor and a display device according to the present invention.
Figure 3B:
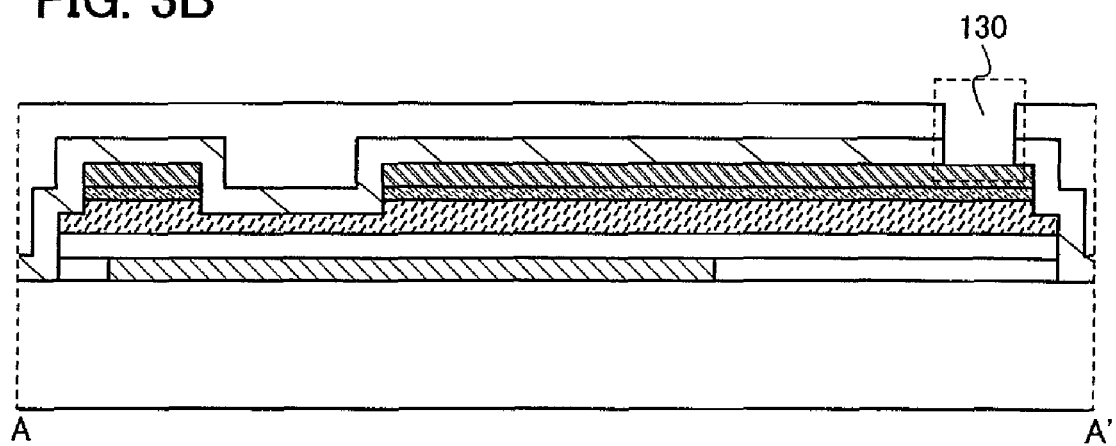
Figure 3C:
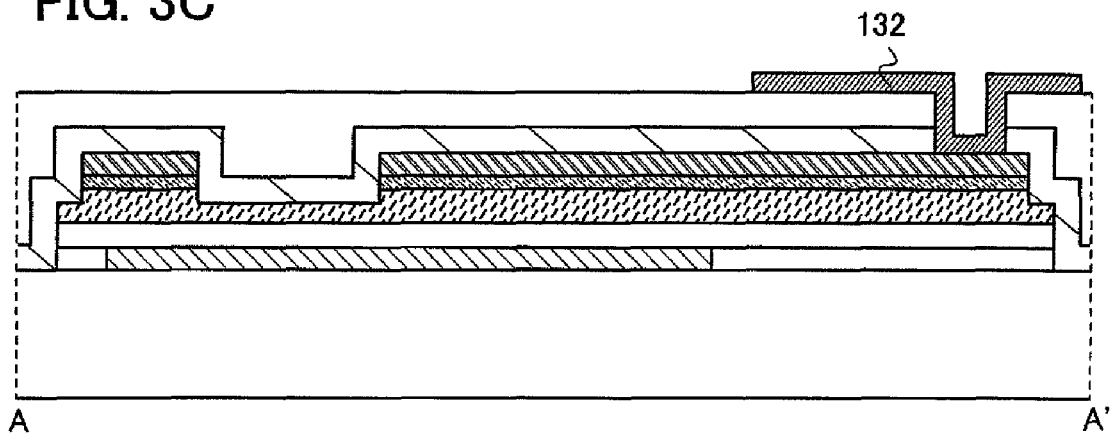
Figure 4A:
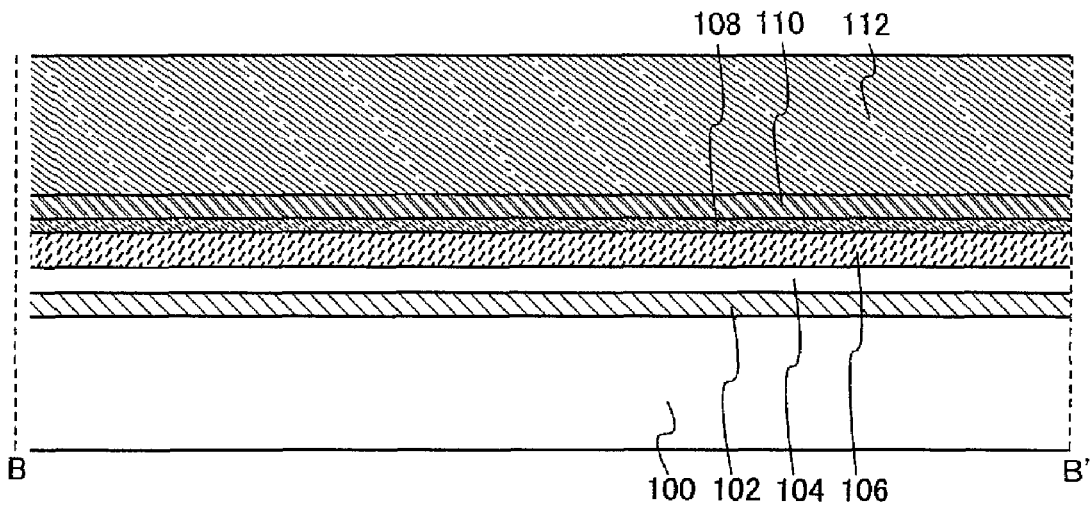
FIGS. 4A to 4C illustrate an example of a manufacturing method of a thin film transistor and a display device according to the present invention.
Figure 4B:
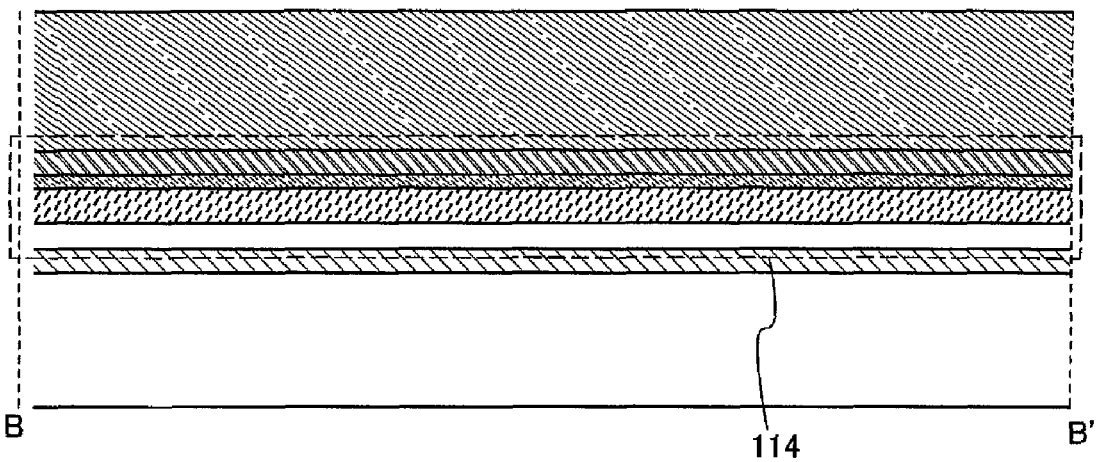
Figure 4C:
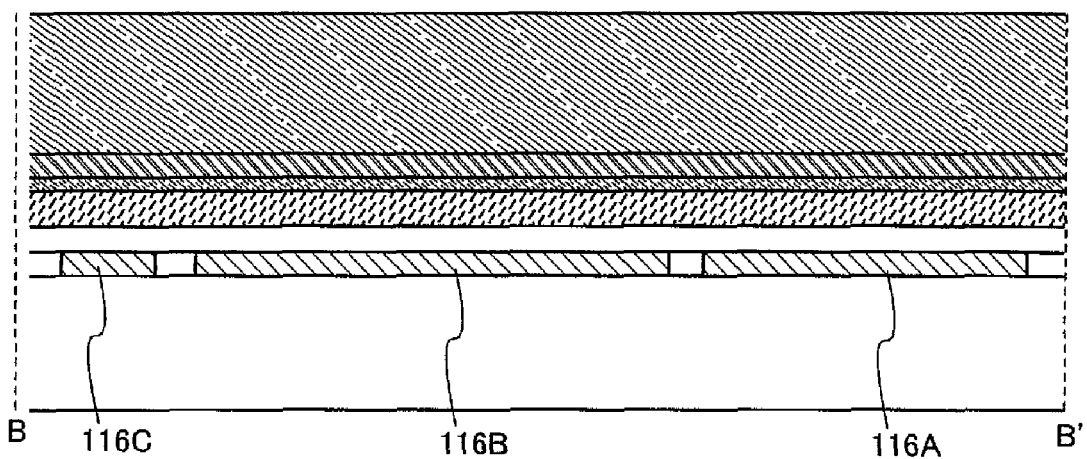
Figure 5A:
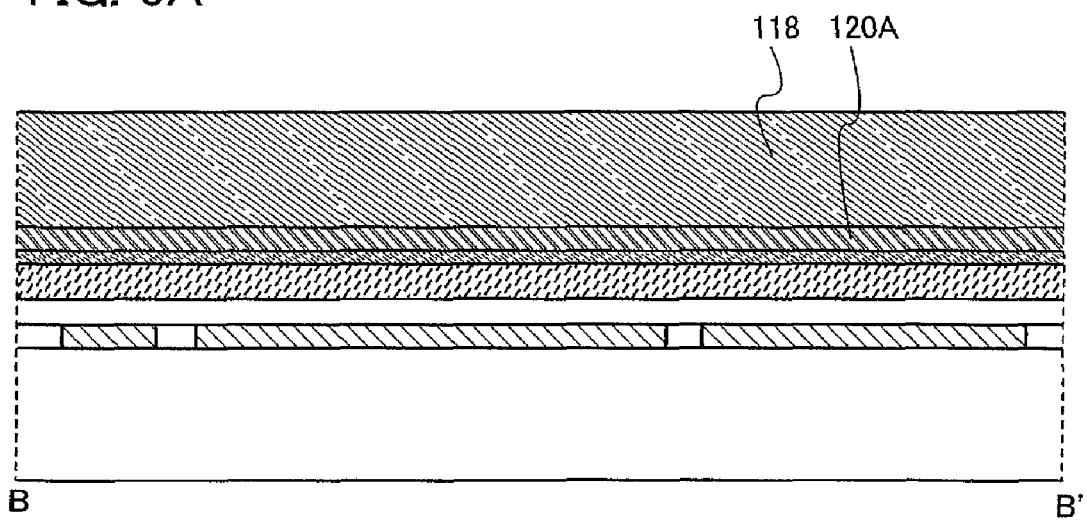
FIGS. 5A to 5C illustrate an example of a manufacturing method of a thin film transistor and a display device according to the present invention.
Figure 5B:
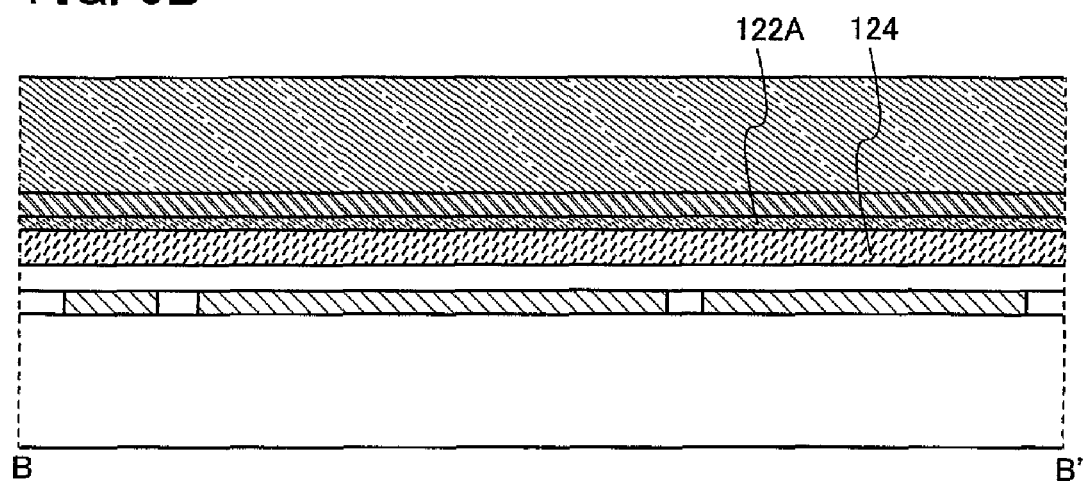
Figure 5C:
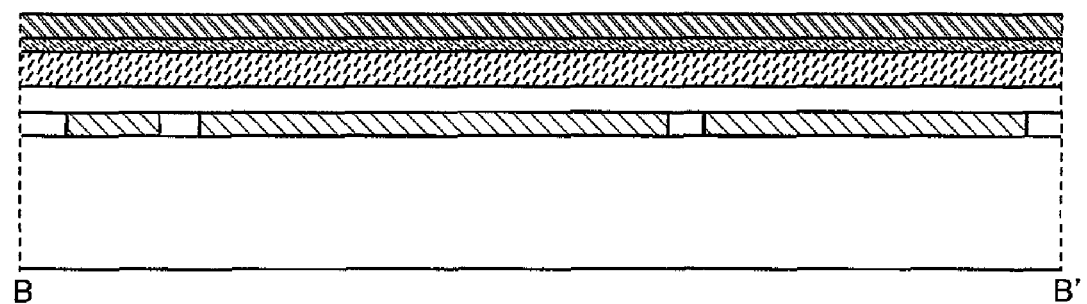
Figure 6A:
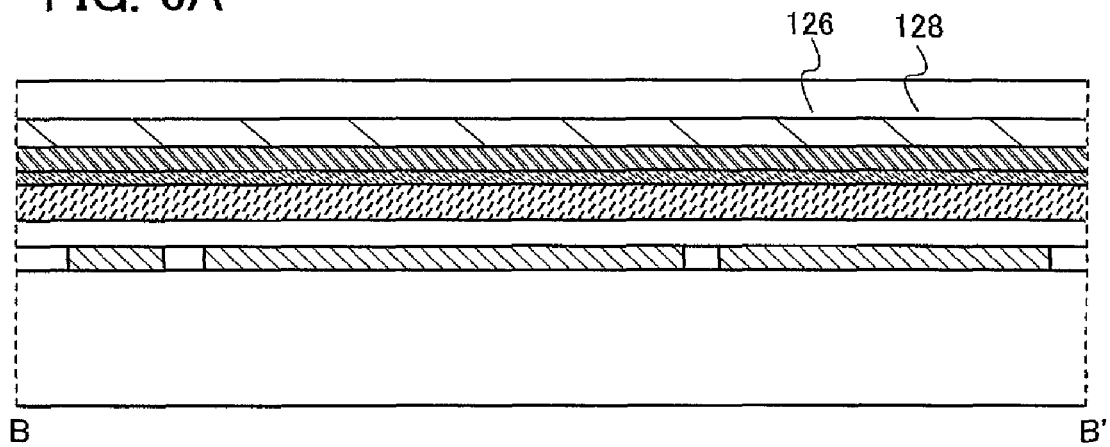
FIGS. 6A to 6C illustrate an example of a manufacturing method of a thin film transistor and a display device according to the present invention.
Figure 6B:
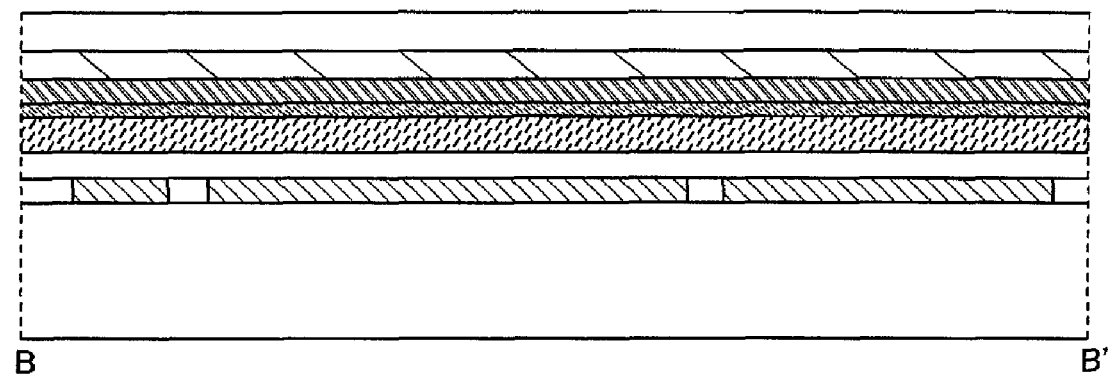
Figure 6C:
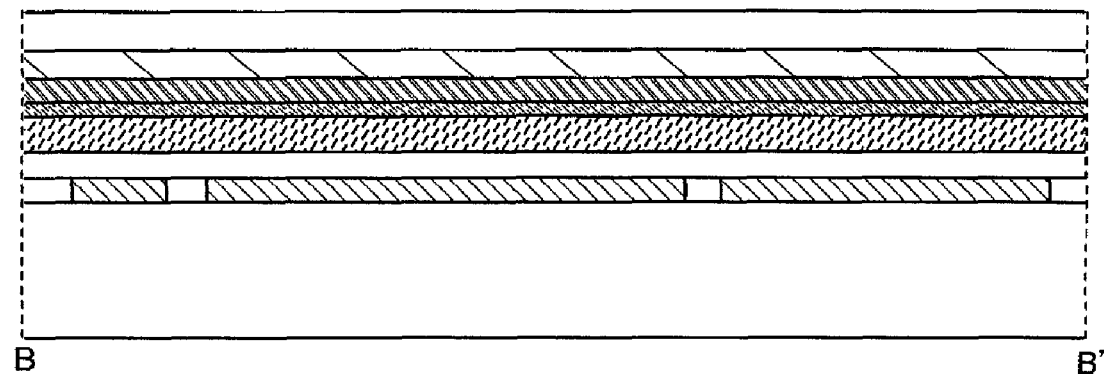
Figure 7A:
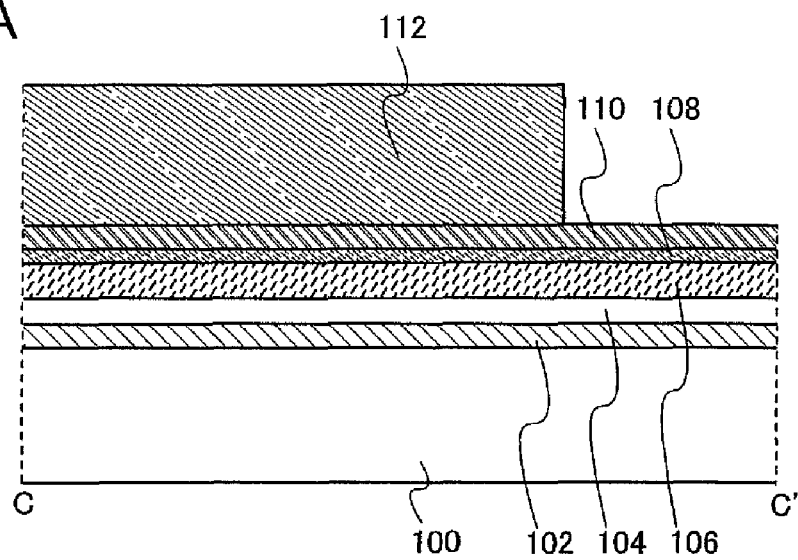
FIGS. 7A to 7C illustrate an example of a manufacturing method of a thin film transistor and a display device according to the present invention.
Figure 7B:
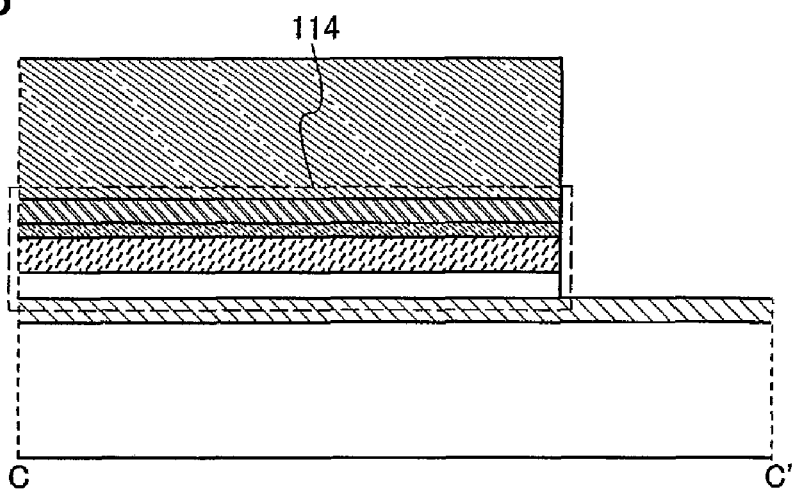
Figure 7C:
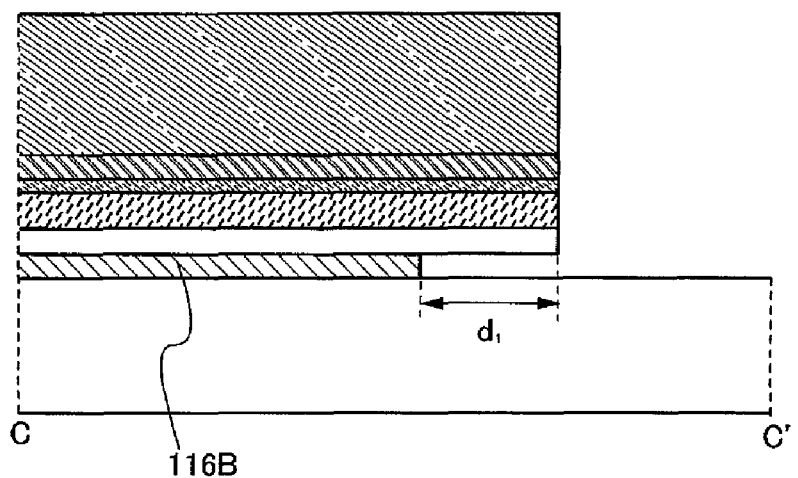
Figure 8A:
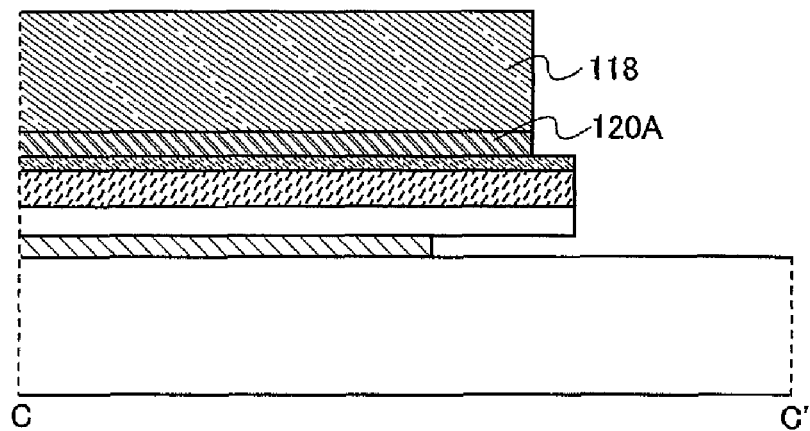
FIGS. 8A to 8C illustrate an example of a manufacturing method of a thin film transistor and a display device according to the present invention.
Figure 8B:
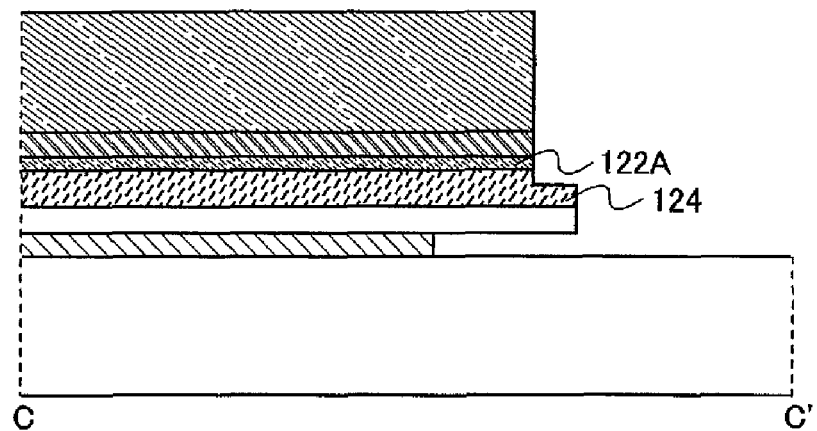
Figure 8C:
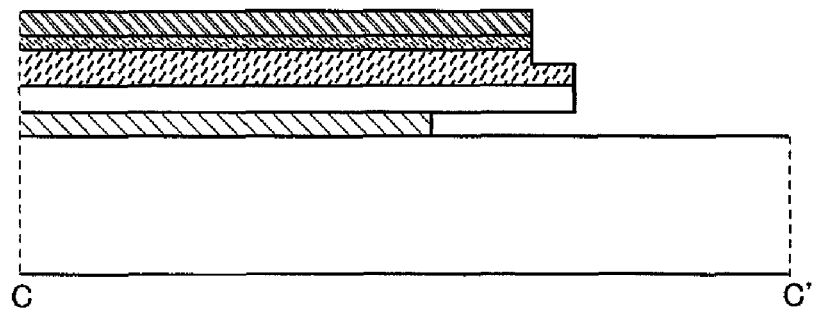
Figure 9A:
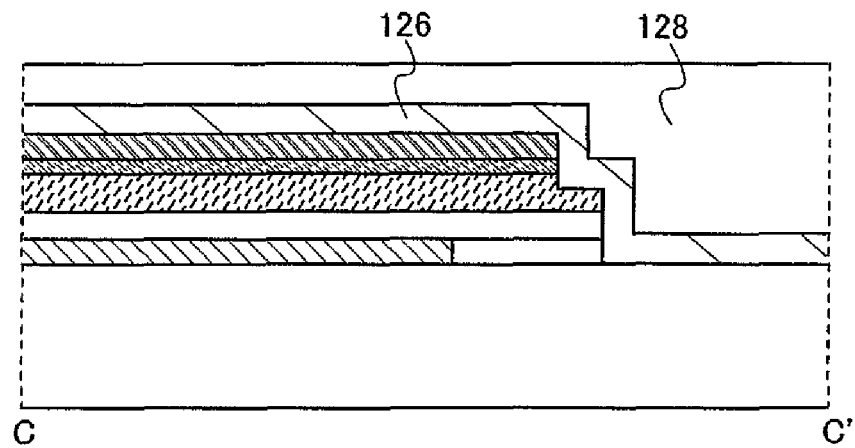
FIGS. 9A to 9C illustrate an example of a manufacturing method of a thin film transistor and a display device according to the present invention.
Figure 9B:
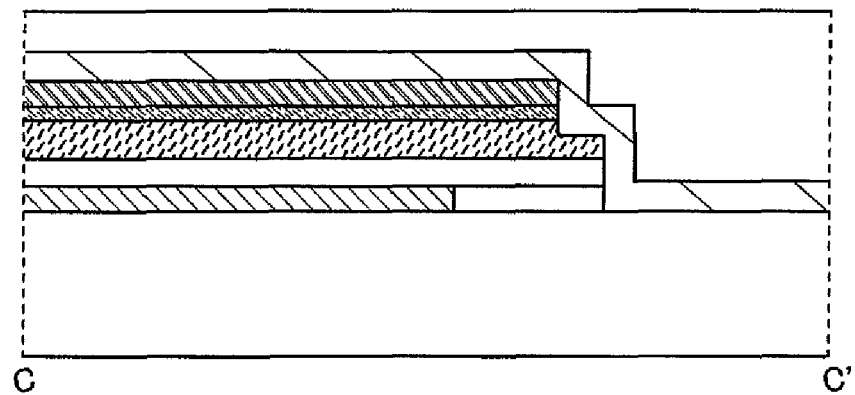
Figure 9C:
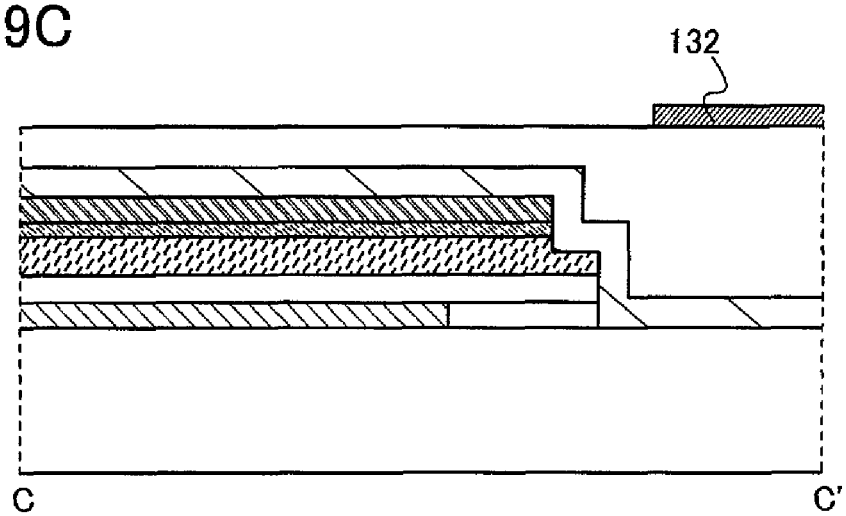
Figure 10A:
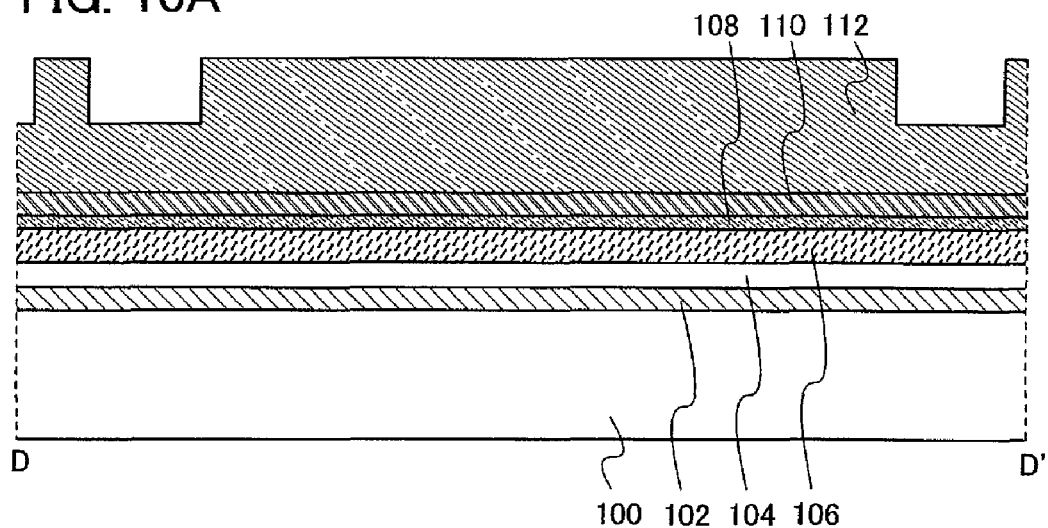
FIGS. 10A to 10C illustrate an example of a manufacturing method of a thin film transistor and a display device according to the present invention.
Figure 10B:
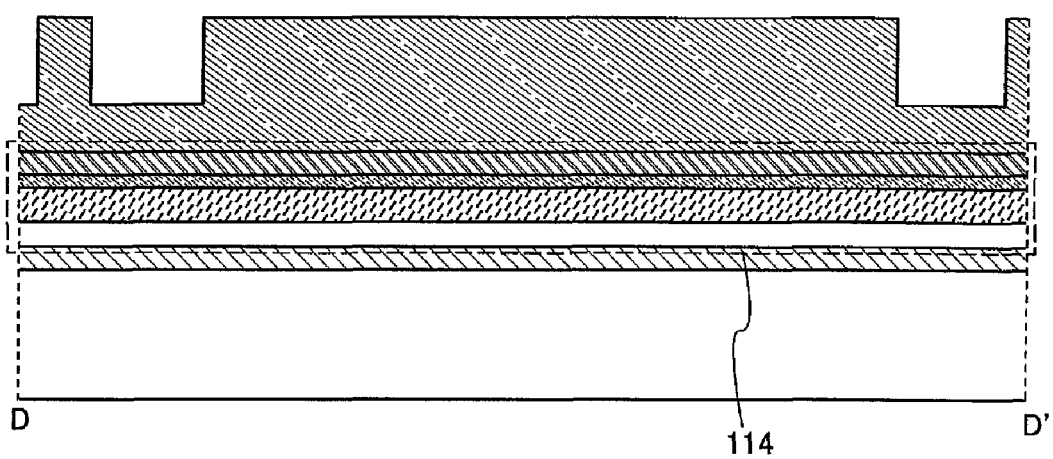
Figure 10C:
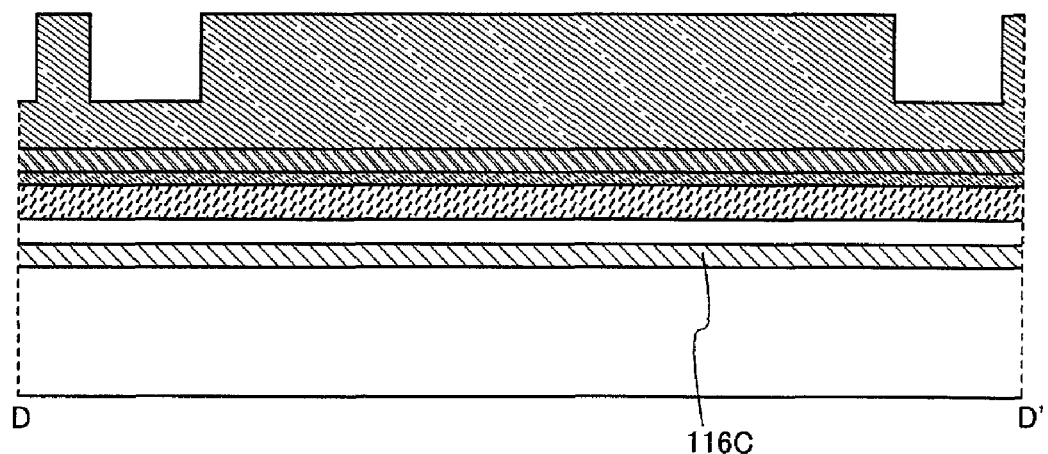
Figure 11A:
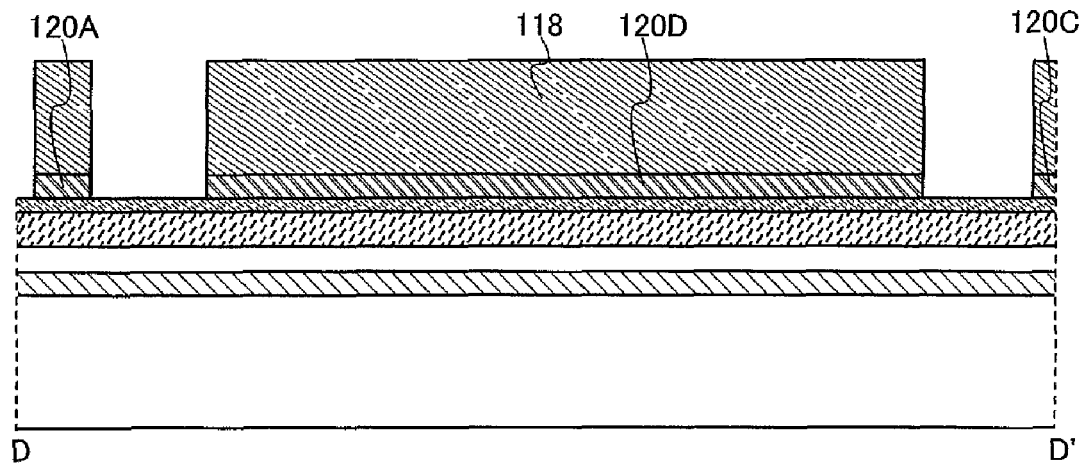
FIGS. 11A to 11C illustrate an example of a manufacturing method of a thin film transistor and a display device according to the present invention.
Figure 11B:
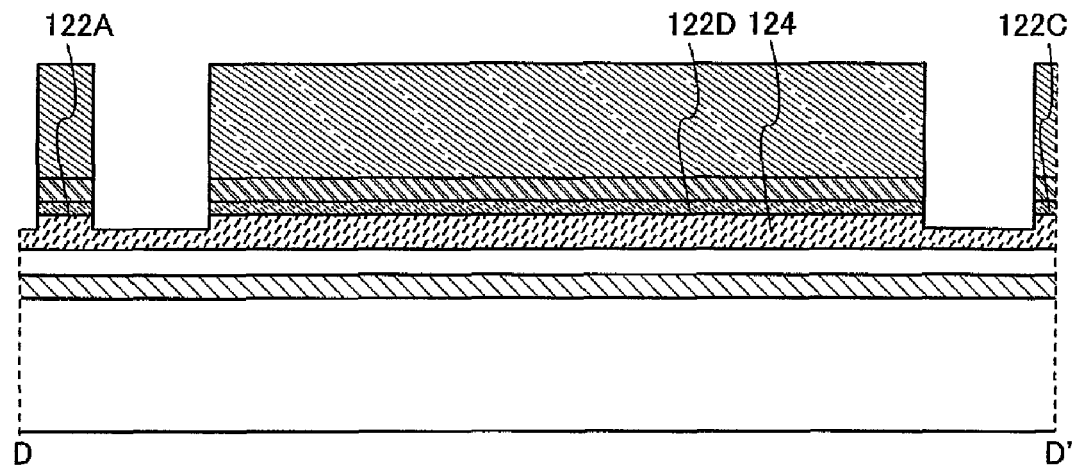
Figure 11C:
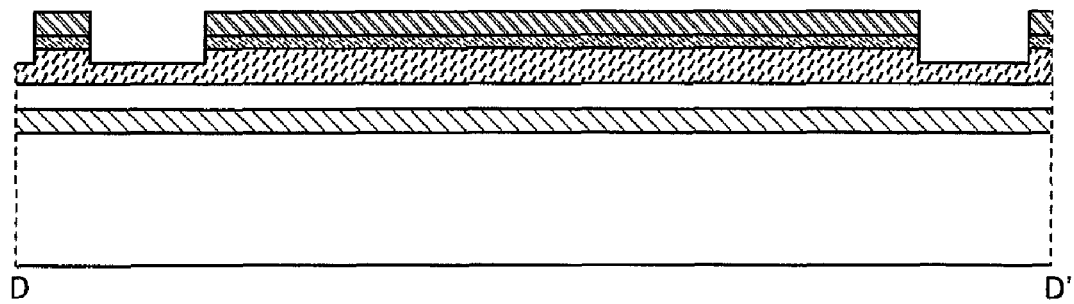
Figure 12A:
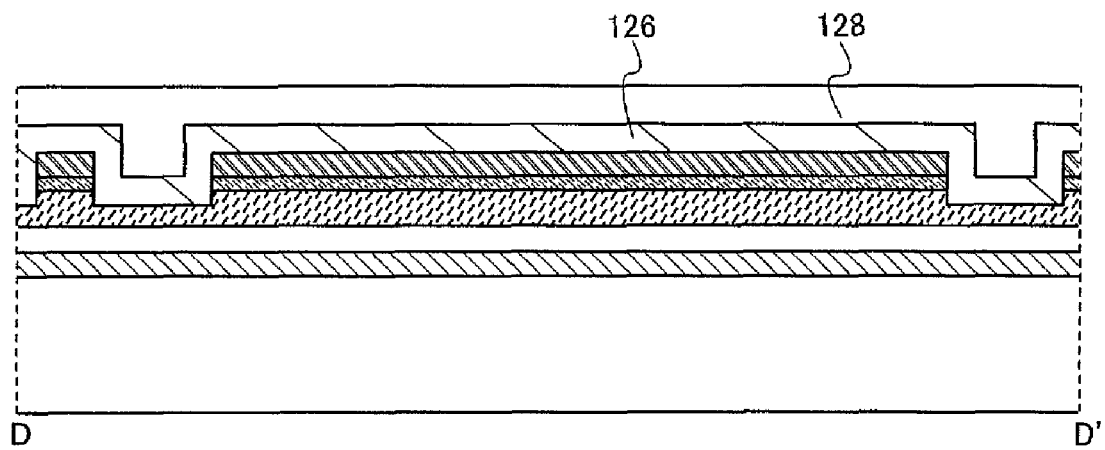
FIGS. 12A to 12C illustrate an example of a manufacturing method of a thin film transistor and a display device according to the present invention.
Figure 12B:
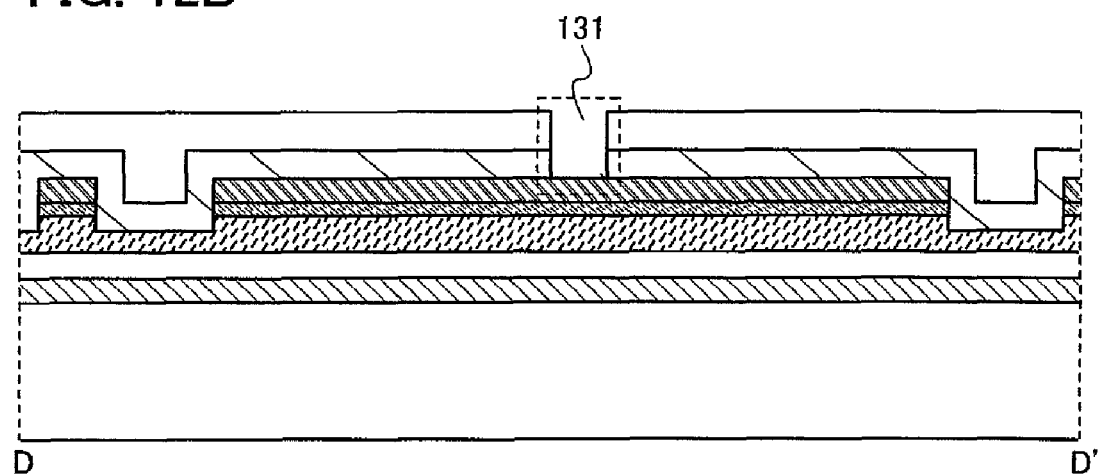
Figure 12C:
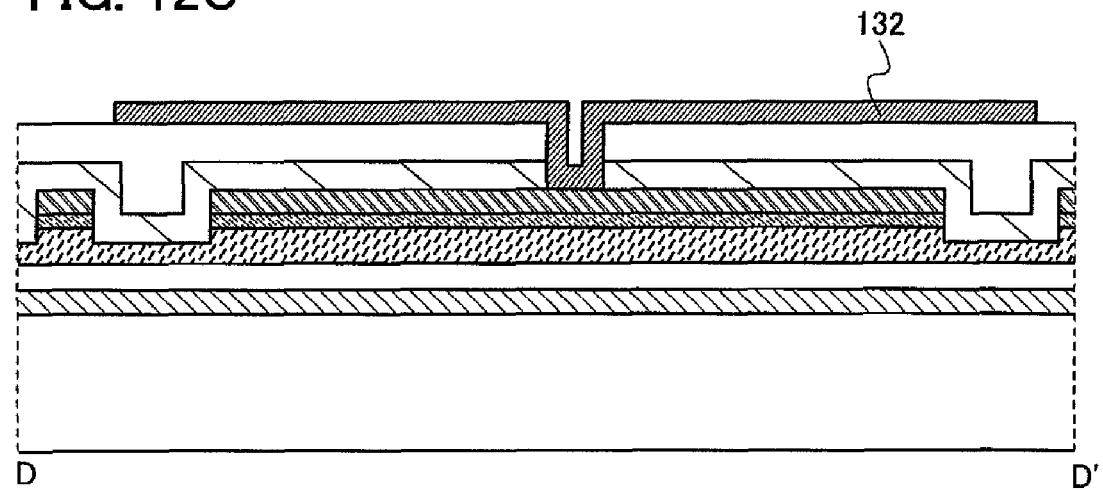
Figure 13A:
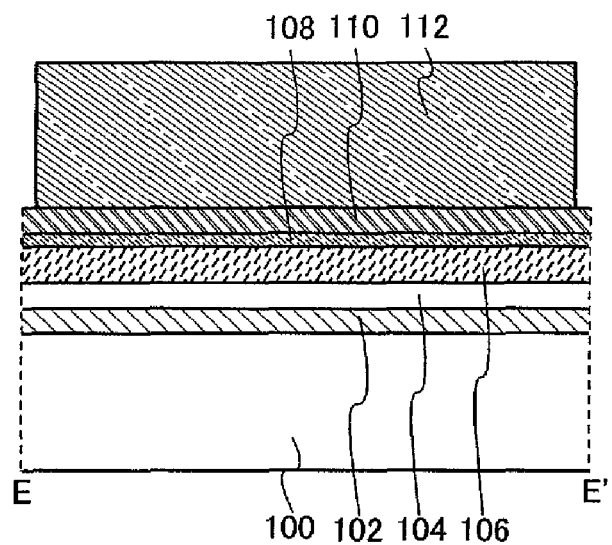
FIGS. 13A to 13C illustrate an example of a manufacturing method of a thin film transistor and a display device according to the present invention.
Figure 13B:
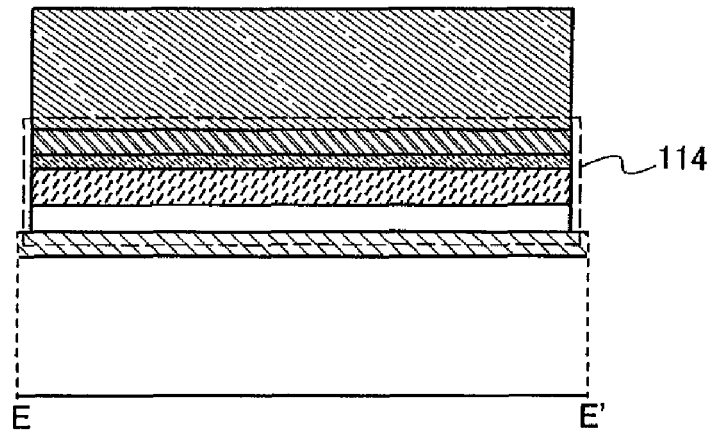
Figure 13C:
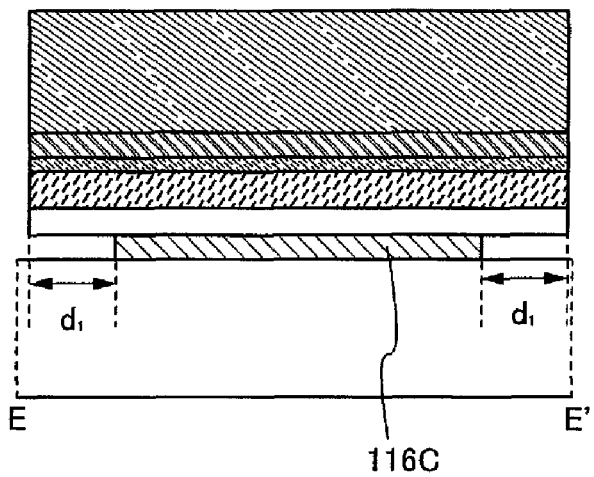
Figure 14A:
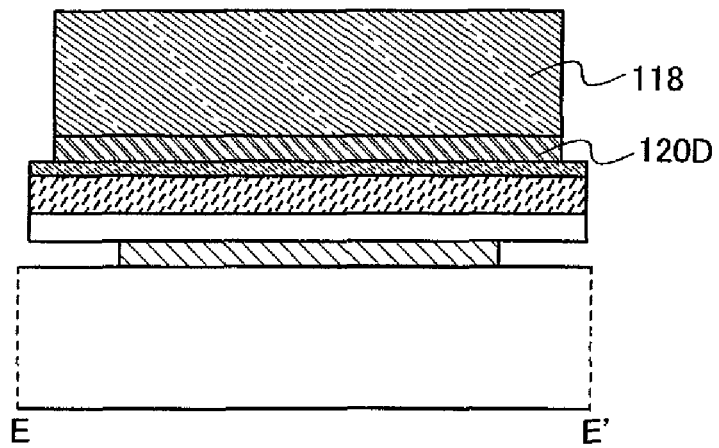
FIGS. 14A to 14C illustrate an example of a manufacturing method of a thin film transistor and a display device according to the present invention.
Figure 14B:
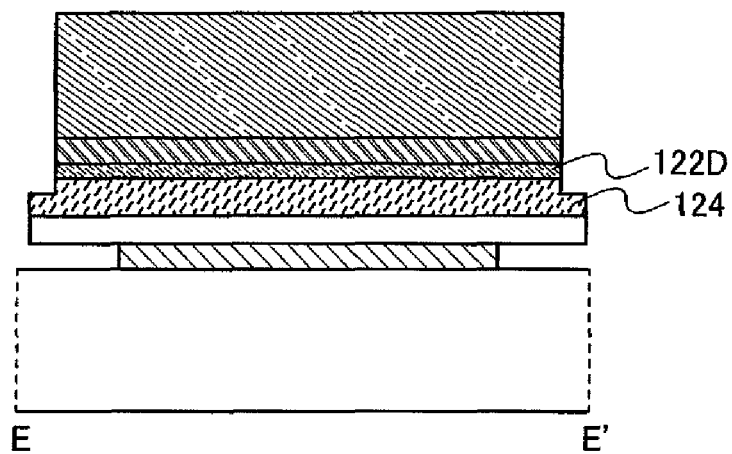
Figure 14C:
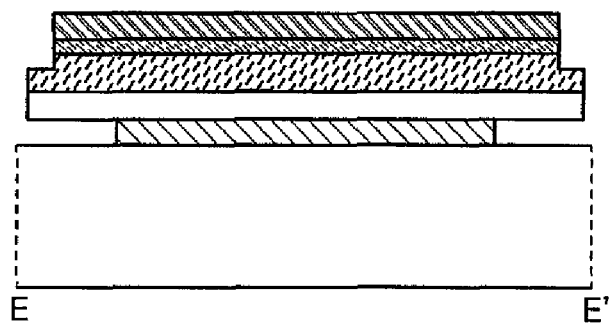
Figure 15A:
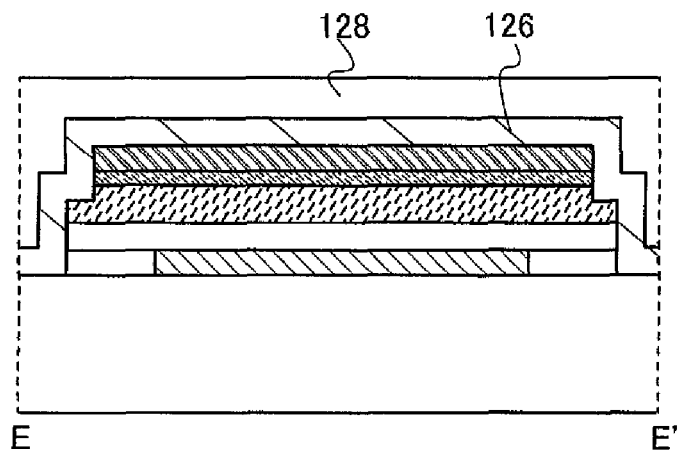
FIGS. 15A to 15C illustrate an example of a manufacturing method of a thin film transistor and a display device according to the present invention.
Figure 15B:
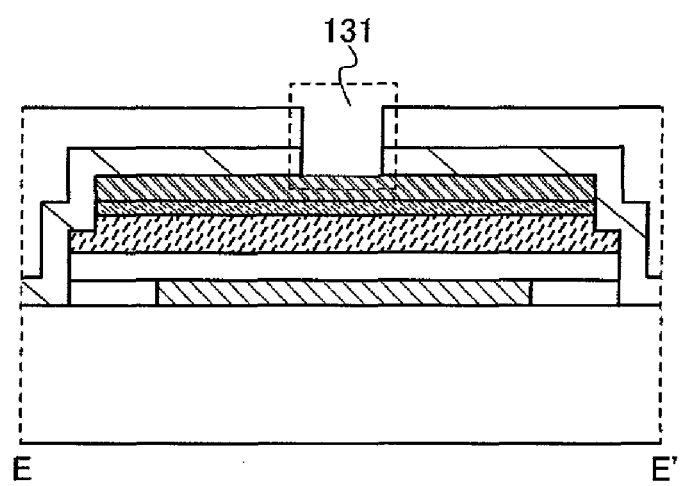
Figure 15C:
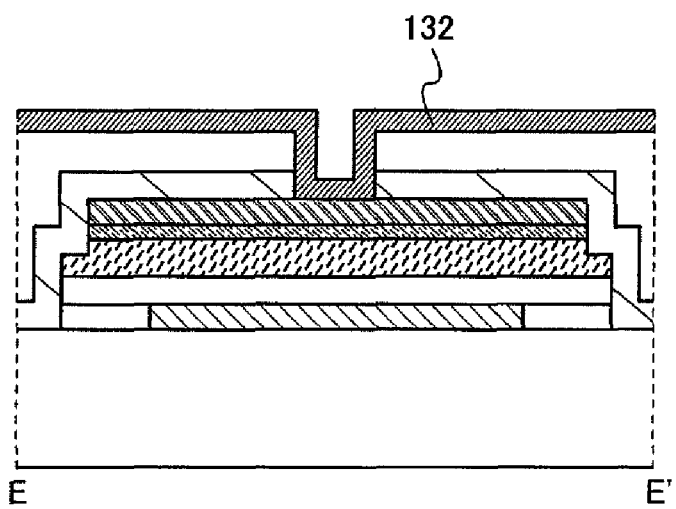
Figure 16:
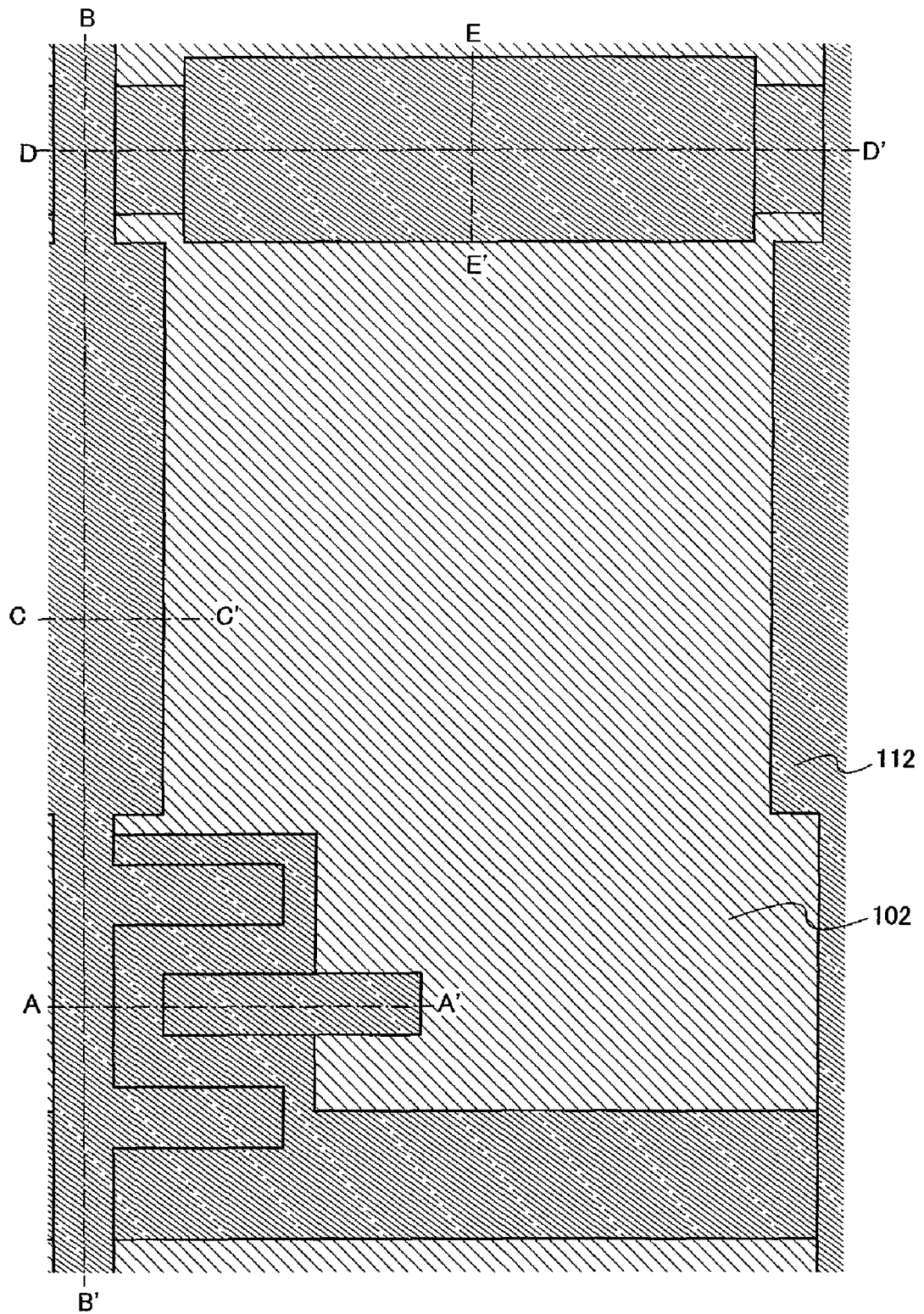
FIG. 16 illustrates an example of a manufacturing method of a thin film transistor and a display device according to the present invention.

The thin film transistor manufactured using the manufacturing method of the present invention has a structure including a gate insulating film over a gate electrode layer, a semiconductor layer over the gate insulating film, a source region and a drain region over the semiconductor layer, a source electrode and a drain electrode over the source region and the drain region, and a cavity adjacent to a side surface of the gate electrode layer (see FIG. 3C). By the cavity formed adjacent to the side surface of the gate electrode layer, a thin film transistor with low leakage current at an end portion of the gate electrode layer can be manufactured.

Here, a terminal connection portion of the active matrix substrate manufactured in the above-described steps will be described with reference to FIG. 22, FIG. 23, and FIGS. 24A to 24C.

Figure 22:
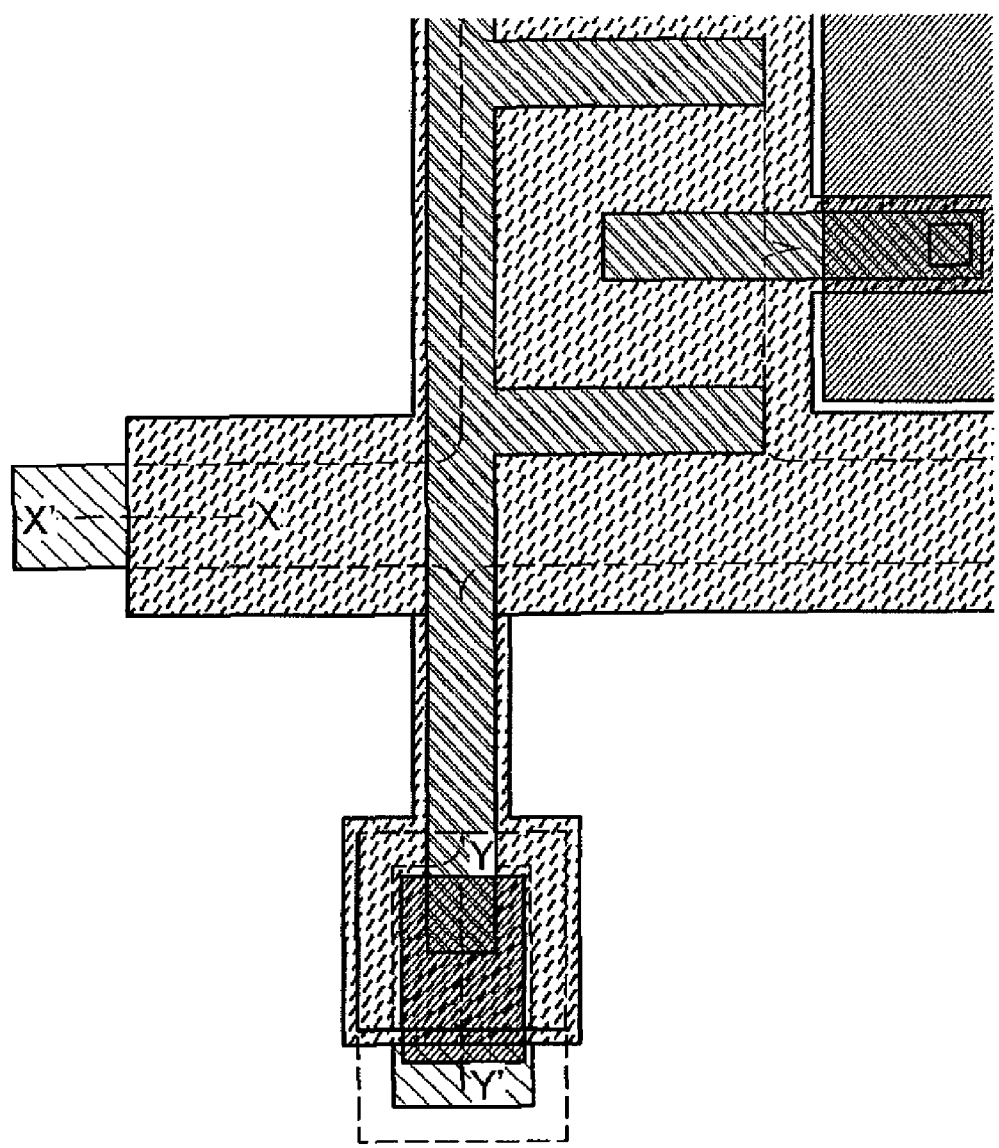
FIG. 22 illustrates a connection portion of an active matrix substrate to which a manufacturing method of the present invention is applied.

FIG. 22 is a top view and FIG. 23 and FIGS. 24A to 24C are cross-sectional views of a terminal connection portion on the gate wiring side and a terminal connection portion on the source wiring side of the active matrix substrate manufactured in the above-described steps.

FIG. 22 is a top view of the gate wiring and the source wiring extended from the pixel portion, in the terminal connection portion on the gate wiring side and the terminal connection portion on the source wiring side.

Figure 23:
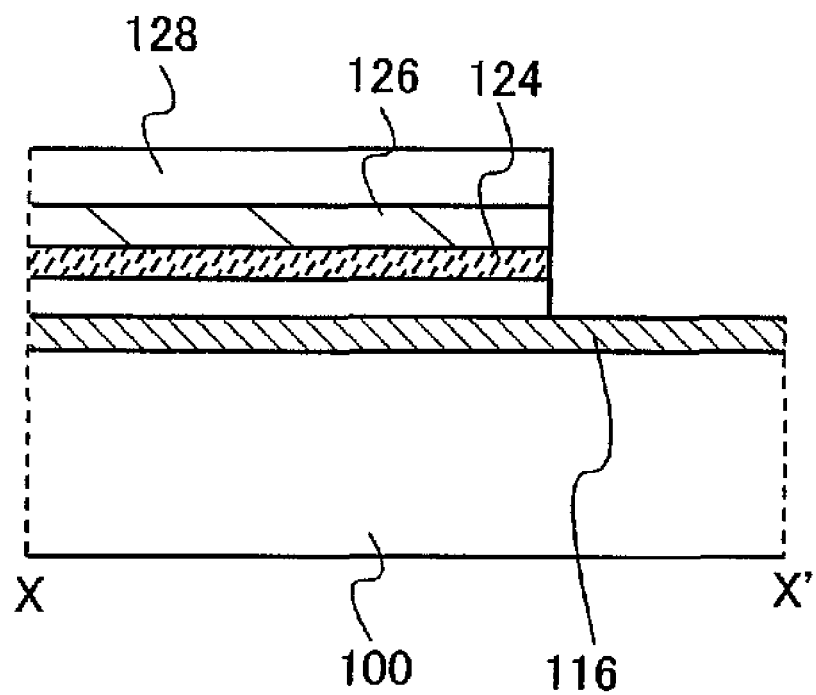
FIG. 23 illustrates a connection portion of an active matrix substrate to which a manufacturing method of the present invention is applied.

FIG. 23 is a cross-sectional view taken along the line X-X' in FIG. 22. That is, FIG. 23 is a cross-sectional view of the terminal connection portion on the gate wiring side. In FIG. 23, only the gate electrode layer 116 is exposed. A terminal portion is connected to the region in which the gate electrode layer 116 is exposed.

Figure 24A:
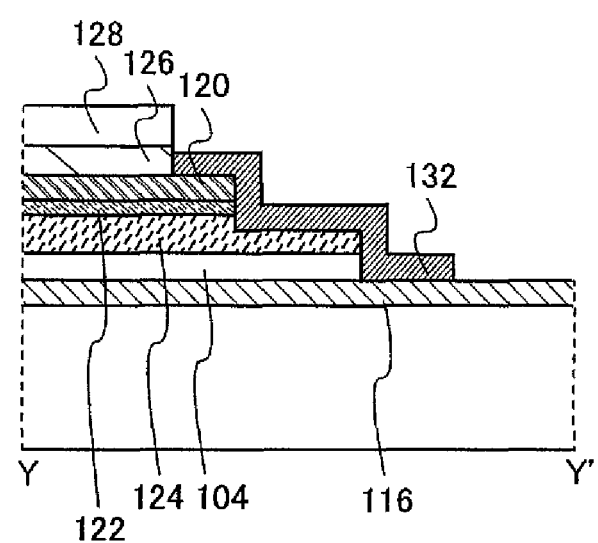
FIGS. 24A to 24C illustrate connection portions of active matrix substrates to each of which a manufacturing method of the present invention is applied.
Figure 24B:
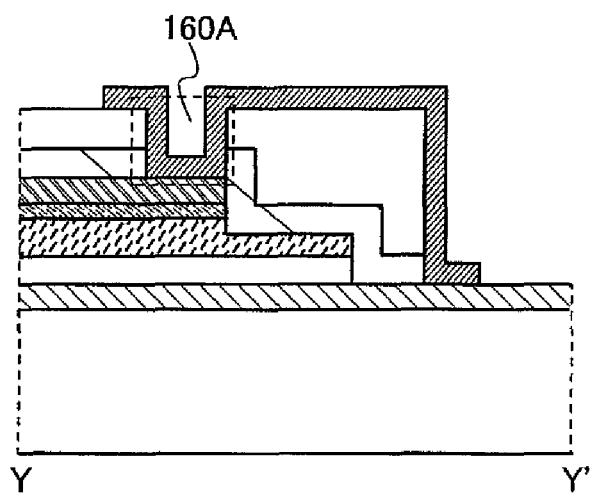
Figure 24C:
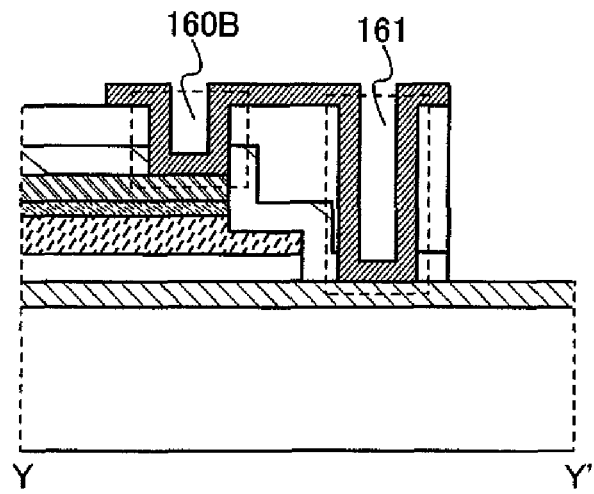

FIGS. 24A to 24C are cross-sectional views taken along the line Y-Y' in FIG. 22. That is, FIGS. 24A to 24C are cross-sectional views of the terminal connection portion on the source wiring side. In the cross section along the line Y-Y' illustrated in FIGS. 24A to 24C, the gate electrode layer 116 and the source and drain electrode layer 120 are connected to each other through the pixel electrode layer 132. FIGS. 24A to 24C illustrate various connection modes between the gate electrode layer 116 and the source and drain electrode layer 120. Any of these modes or modes other than those illustrated in FIGS. 24A to 24C may be used for the terminal connection portion in a display device according to the present invention. By the structure in which the source and drain electrode layer 120 is connected to the gate electrode layer 116, the height of the terminal connection portion can be made almost uniform.

Note that the number of opening portions is not limited to those in FIGS. 24A to 24C. Not only one opening portion but also a plurality of opening portions may be provided for one terminal. In the case where a plurality of opening portions are provided for one terminal, even when any of the opening portions is not formed favorably due to insufficient etching for forming the opening portion, electric connection can be realized at the other opening portion. Further, even in the case where all the opening portions are formed without any problems, the contact area can be made larger and contact resistance can be reduced, which is preferable.

In FIG. 24A, electric connection is realized in such a manner that end portions of the first protective film 126 and the second protective film 128 are removed by etching or the like to expose the gate electrode layer 116 and the source and drain electrode layer 120, and the pixel electrode layer 132 is formed over the exposed region. The top view illustrated in FIG. 22 corresponds to the top view of FIG. 24A.

Note that the formation of the region in which the gate electrode layer 116 and the source and drain electrode layer 120 are exposed can be performed at the same time as the formation of the first opening portion 130 and the second opening portion 131.

In FIG. 24B, electric connection is realized in such a manner that a third opening portion 160A is provided in the first protective film 126 and the second protective film 128, end portions of the first protective film 126 and the second protective film 128 are removed by etching or the like to expose the gate electrode layer 116 and the source and drain electrode layer 120, and the pixel electrode layer 132 is formed over the exposed region.

Note that the formation of the third opening portion 160A and the formation of the region in which the gate electrode layer 116 is exposed can be performed at the same time as the formation of the first opening portion 130 and the second opening portion 131.

In FIG. 24C, electric connection is realized in such a manner that a third opening portion 160B and a fourth opening portion 161 are provided in the first protective film 126 and the second protective film 128 to expose the gate electrode layer 116 and the source and drain electrode layer 120, and the pixel electrode layer 132 is formed over the exposed region. Here, end portions of the first protective film 126 and the second protective film 128 are removed by etching or the like similarly to FIGS. 24A and 24B, and this etched region is used as a terminal connection portion.

Note that the formation of the third opening portion 160B and the fourth opening portion 161 and the formation of the region in which the gate electrode layer 116 is exposed can be performed at the same time as the formation of the first opening portion 130 and the second opening portion 131.

Next, a manufacturing method of a liquid crystal display device using the active matrix substrate for a display device, which is manufactured in the above-described steps, will be described. That is, a cell process and a module process will be described. Note that the cell process and the module process are not particularly limited in the manufacturing method of a display device in this embodiment mode.

In the cell process, the active matrix substrate manufactured in the above-described steps and a substrate opposite to the active matrix substrate (hereinafter referred to as an opposite substrate) are attached to each other and liquid crystal is injected. First, a manufacturing method of the opposite substrate will be briefly described below. Note that a film formed on the opposite substrate may have a single layer or stacked layers even if not mentioned.

First, a light-blocking layer is formed over a substrate; a color filter layer of any of red, green, and blue is formed over the light-blocking layer; a pixel electrode layer is selectively formed over the color filter; and then, a rib is formed over the pixel electrode layer.

As the light-blocking layer, a film of a material having a light-blocking property is selectively formed. As the material having a light-blocking property, for example, an organic resin containing a black resin (carbon black) can be used. Alternatively, a stacked film which includes a film of a material containing chromium as its main component may be used. The film of a material containing chromium as its main component means a film containing chromium, chromium oxide, or chromium nitride. The material used for the light-blocking layer is not particularly limited as long as it has a light-blocking property. In order to selectively form the film of a material having a light-blocking property, photolithography or the like is employed.

The color filter layer may be selectively formed using an organic resin film which transmits only light with any of red, green, and blue when irradiated with white light from a backlight. The color filter layer can be selectively formed by selective formation of color materials. The arrangement of the color filter may be a stripe arrangement, a delta arrangement, or a square arrangement.

The pixel electrode layer can be formed in a similar manner to the pixel electrode layer 132 included in the active matrix substrate. Note that since selective formation is not necessary, the pixel electrode layer may be formed over the entire surface.

The rib formed over the pixel electrode is an organic resin film formed with a pattern for the purpose of widening the viewing angle. Note that the rib does not need to be formed if not particularly necessary.

As the manufacturing method of the opposite substrate, there are other various modes. For example, after formation of the color filter layer and before formation of the pixel electrode layer, an overcoat layer may be formed. By formation of the overcoat layer, planarity of a surface on which the pixel electrode is formed can be improved, thereby increasing yield. In addition, part of a material included in the color filter layer can be prevented from entering a liquid crystal material. For the overcoat layer, a thermosetting material containing acrylic resin or epoxy resin as a base is used.

Further, before or after formation of the rib, a post spacer (columnar spacer) may be formed as a spacer. The post spacer means a structural object formed at a constant interval on the opposite substrate in order to keep the gap between the active matrix substrate and the opposite substrate constant. In the case of using a bead spacer (spherical spacer), the post spacer need not be formed.

Next, an alignment film is formed on the active matrix substrate and the opposite substrate. Formation of the alignment film is performed, for example, in such a manner that polyimide resin or the like is melted in an organic solvent; this solution is applied by a coating method, a spin coating method, or the like; and then the solution is dried and baked. The thickness of the formed alignment film is generally approximately equal to or greater than about 50 nm and equal to or less than about 100 nm. Rubbing treatment is performed on the alignment film to align liquid crystal molecules with a certain pretilt angle. The rubbing treatment is performed, for example, by rubbing an alignment film with a shaggy cloth such as a velvet.

Then, the active matrix substrate and the opposite substrate are attached with a sealant. In the case where a post spacer is not provided on the opposite substrate, a bead spacer may be dispersed in a desired region and attachment may be performed.

Next, a liquid crystal material is injected in a space between the active matrix substrate and the opposite substrate, which are attached to each other. After injection of the liquid crystal material, an inlet for injection is sealed with an ultraviolet curing resin or the like. Alternatively, after dropping a liquid crystal material, the active matrix substrate and the opposite substrate may be attached to each other.

Next, a polarizing plate is attached to both surfaces of a liquid crystal cell, which is formed by attachment of the active matrix substrate and the opposite substrate. Then, the cell process is finished.

Next, as the module process, a flexible printed circuit (FPC) is connected to an input terminal (in FIGS. 24A to 24C, the exposed region of the gate electrode layer 116) of the terminal portion. The FPC has a wiring formed of a conductive film over an organic resin film of polyimide or the like, and is connected to the input terminal through an anisotropic conductive paste (hereinafter referred to as an ACP). The ACP includes a paste functioning as an adhesive and particles plated with gold or the like to have a conductive surface, which have a diameter of several tens of micrometers to several hundreds of micrometers. When the particles mixed in the paste are in contact with the conductive layer over the input terminal and the conductive layer over the terminal connected to the wiring formed in the FPC, electric connection therebetween is achieved. Alternatively, after connection of the FPC, a polarizing plate may be attached to the active matrix substrate and the opposite substrate. In the above-described manner, a liquid crystal panel used for a display device can be manufactured.

As described above, the active matrix substrate including a pixel transistor, which is used for a display device, can be manufactured using three photomasks.

Accordingly, the number of steps for manufacturing a thin film transistor and a display device can be significantly reduced. Specifically, as described above, a thin film transistor can be manufactured using one photomask (multi-tone mask). Further, an active matrix substrate including a pixel transistor can be manufactured using three photomasks. In this manner, since the number of photomasks to be used is reduced, the number of steps for manufacturing a thin film transistor and a display device can be significantly reduced.

In addition, the number of steps for manufacturing a thin film transistor can be significantly reduced without a complicated step using backside light exposure, resist reflow, a lift-off method, or the like. Therefore, the number of steps for manufacturing a display device can be significantly reduced without a complicated step.

Moreover, the number of steps for manufacturing a thin film transistor can be significantly reduced while electric characteristics of the thin film transistor are maintained.

Furthermore, by the aforementioned effects of the present invention, manufacturing cost can be significantly reduced.

Embodiment Mode 2

In Embodiment Mode 2, a manufacturing method of a thin film transistor and a manufacturing method of a display device according to the present invention, which are different from those of Embodiment Mode 1, will be described. Specifically, a manufacturing method of a thin film transistor which is similar to that of Embodiment Mode 1, without using a multi-tone mask will be described with reference to FIGS. 26A, 26B, and 26C, FIGS. 27A, 27B, and 27C, FIG. 28, FIG. 29, and FIG. 30.

Figure 1B:
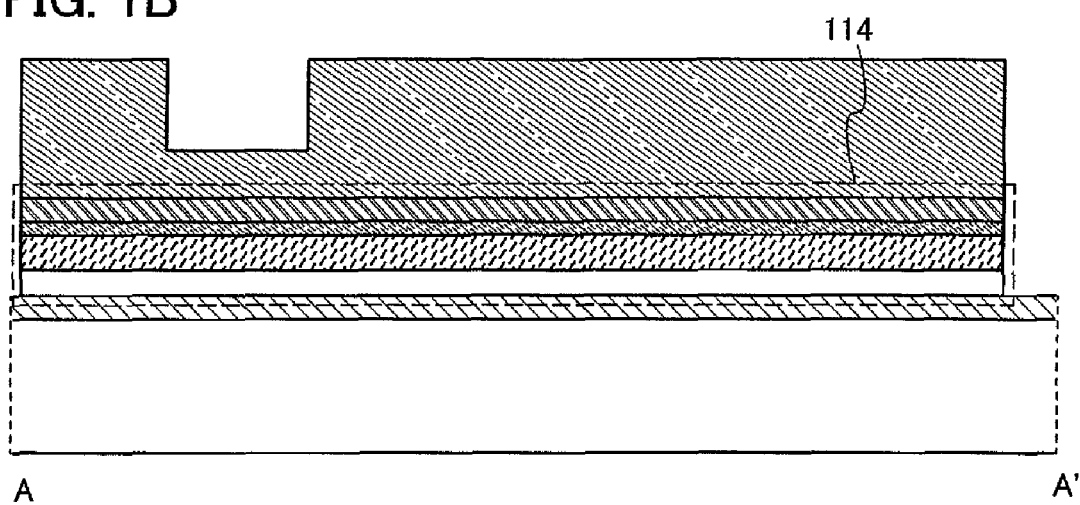
Figure 1C:
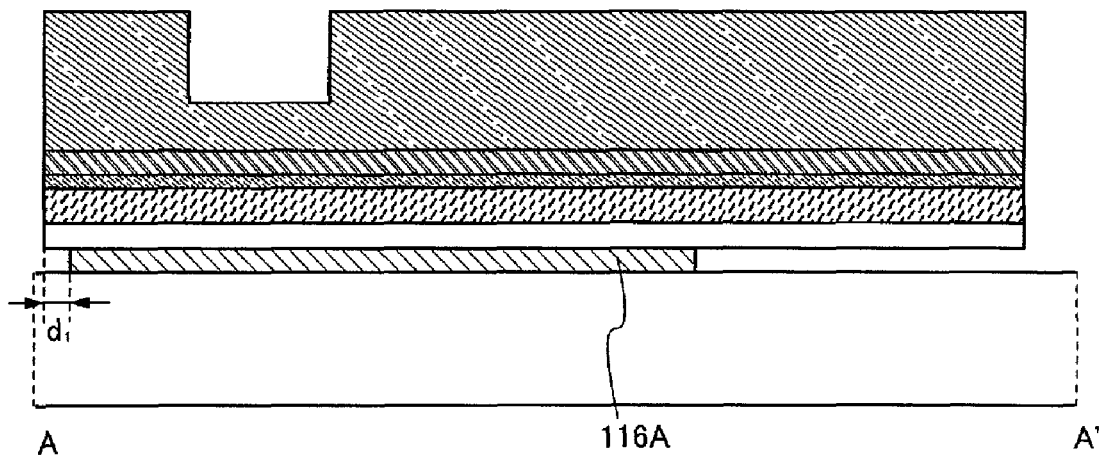
Figure 26A:
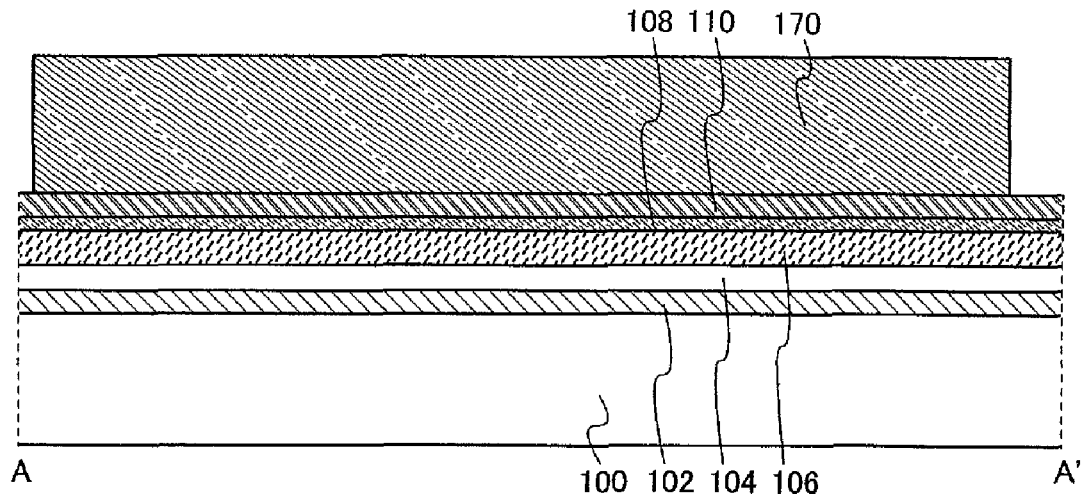
FIGS. 26A to 26C illustrate an example of a manufacturing method of a thin film transistor and a display device according to the present invention.
Figure 26B:
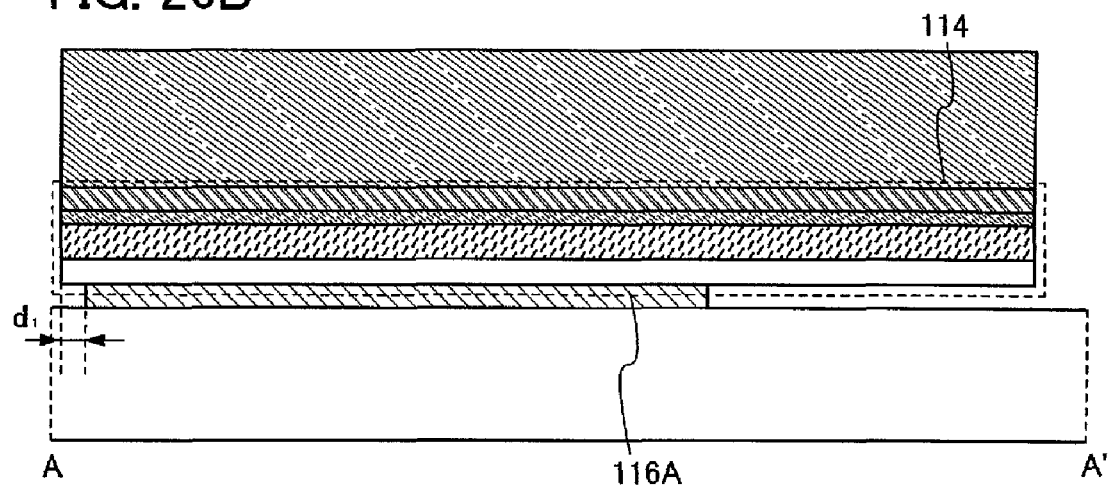
Figure 26C:
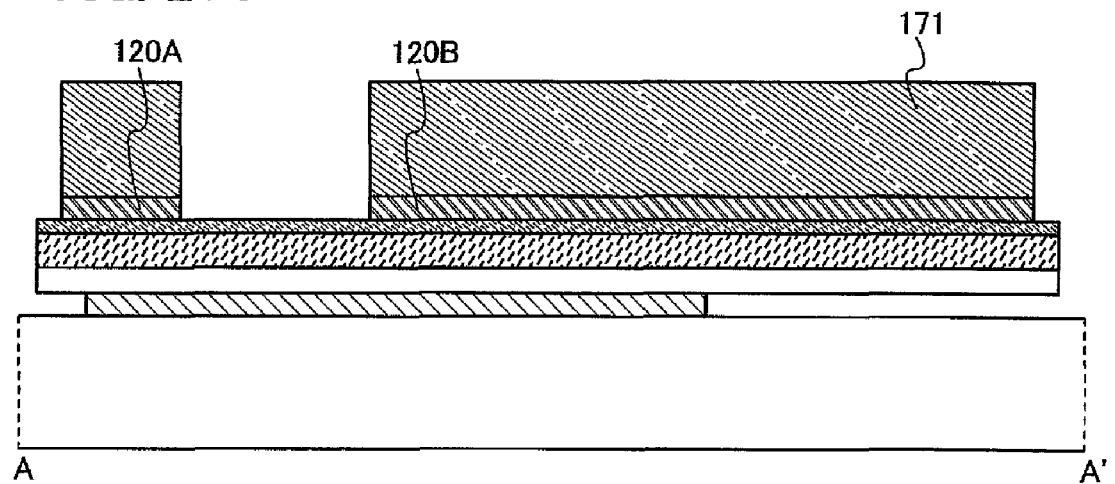
Figure 27A:
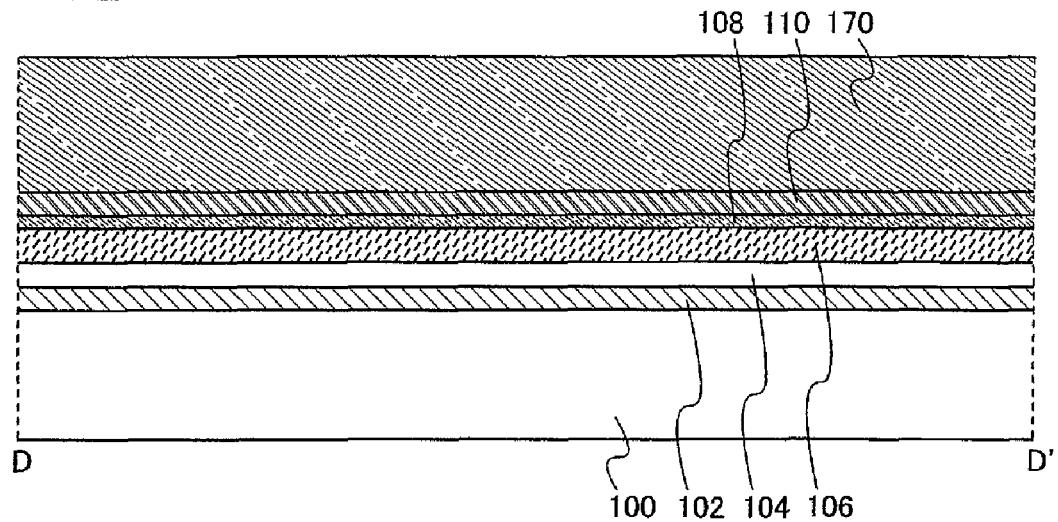
FIGS. 27A to 27C illustrate an example of a manufacturing method of a thin film transistor and a display device according to the present invention.
Figure 27B:
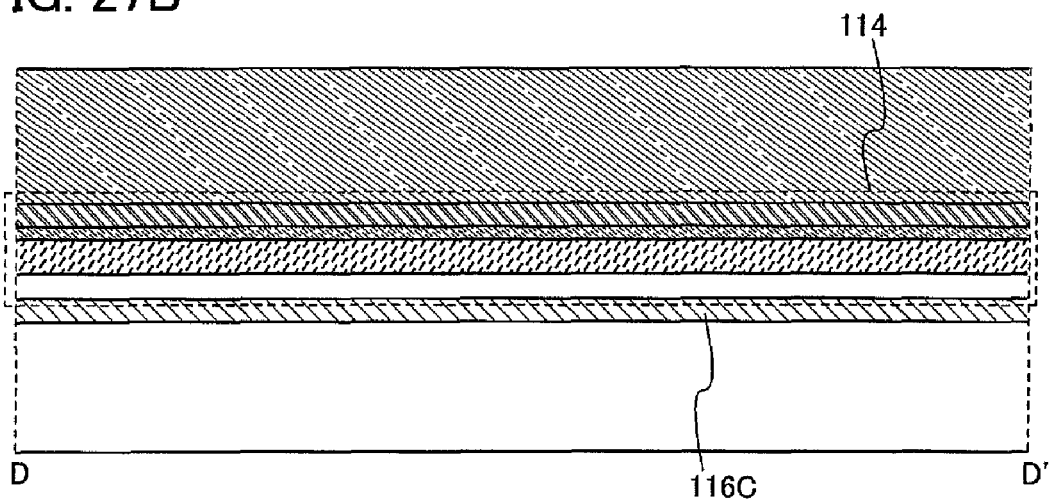
Figure 27C:
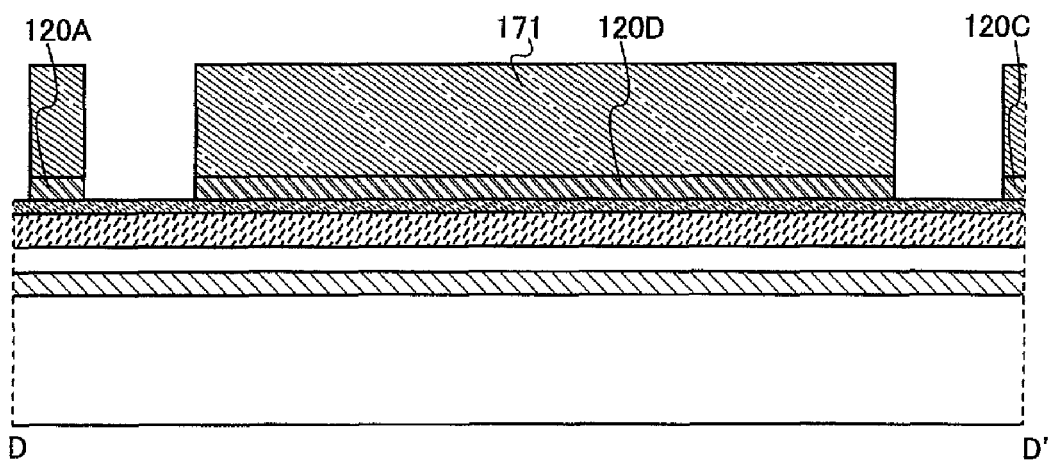
Figure 28:
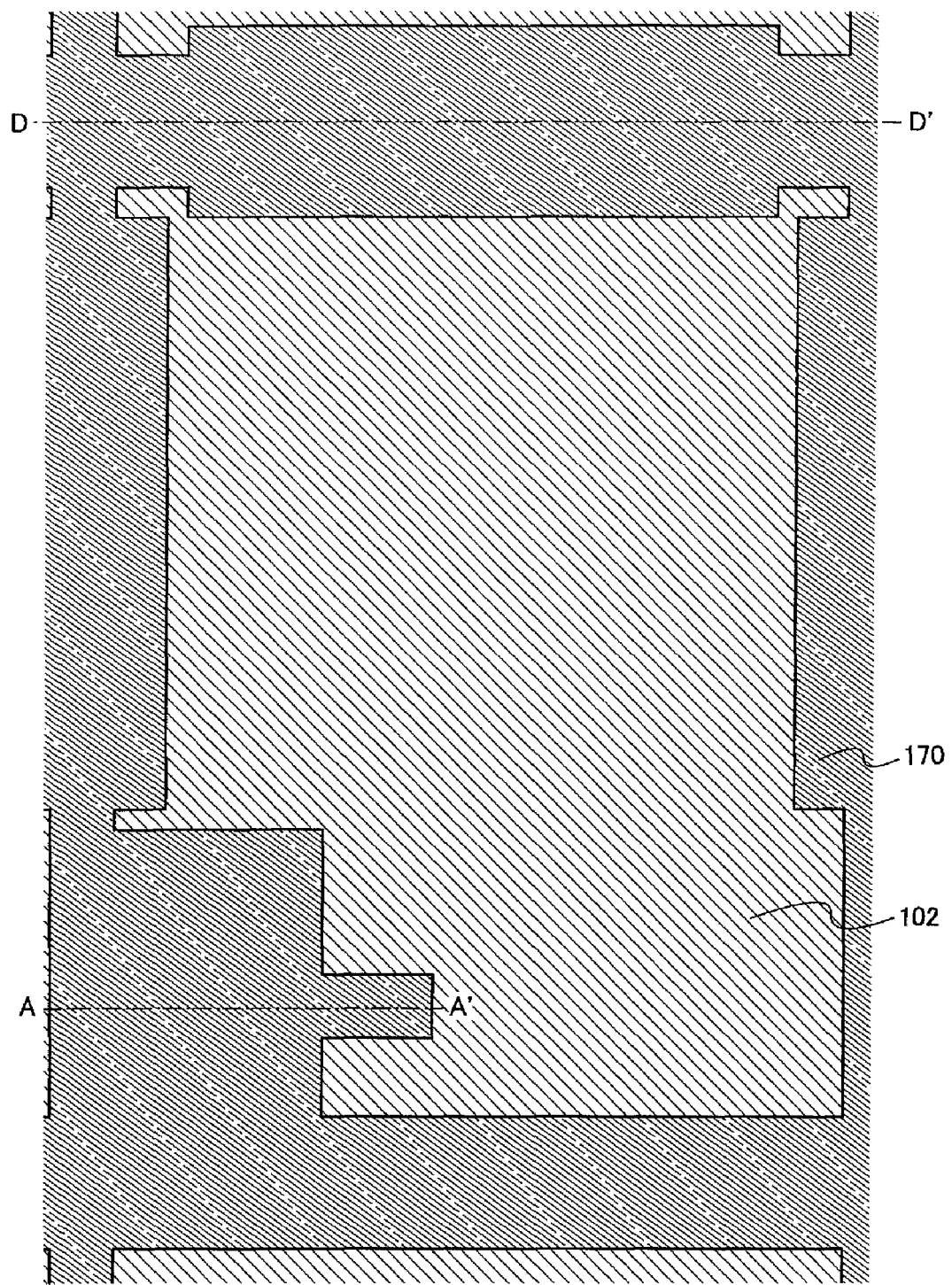
FIG. 28 illustrates an example of a manufacturing method of a thin film transistor and a display device according to the present invention.
Figure 29:
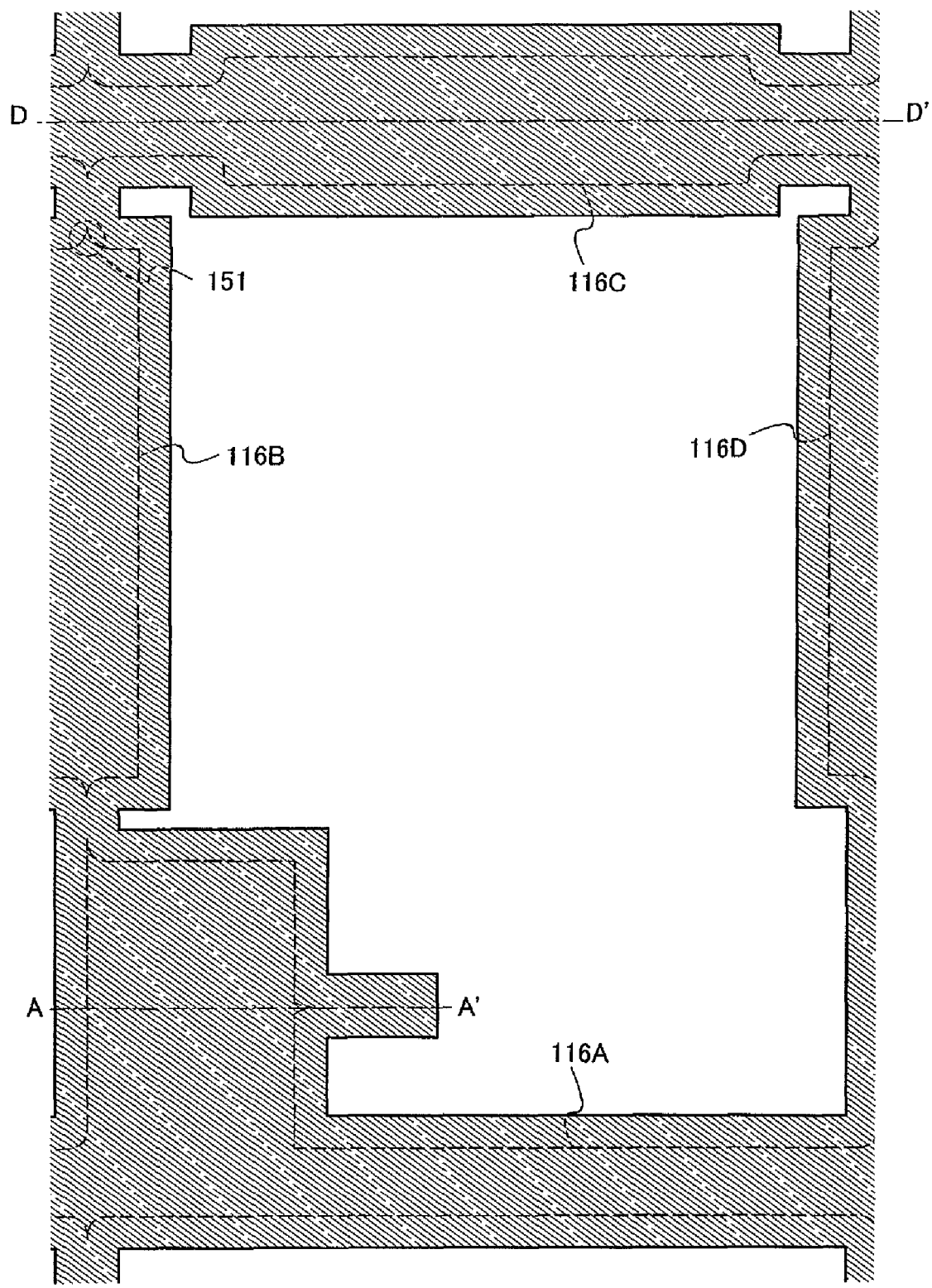
FIG. 29 illustrates an example of a manufacturing method of a thin film transistor and a display device according to the present invention.
Figure 30:
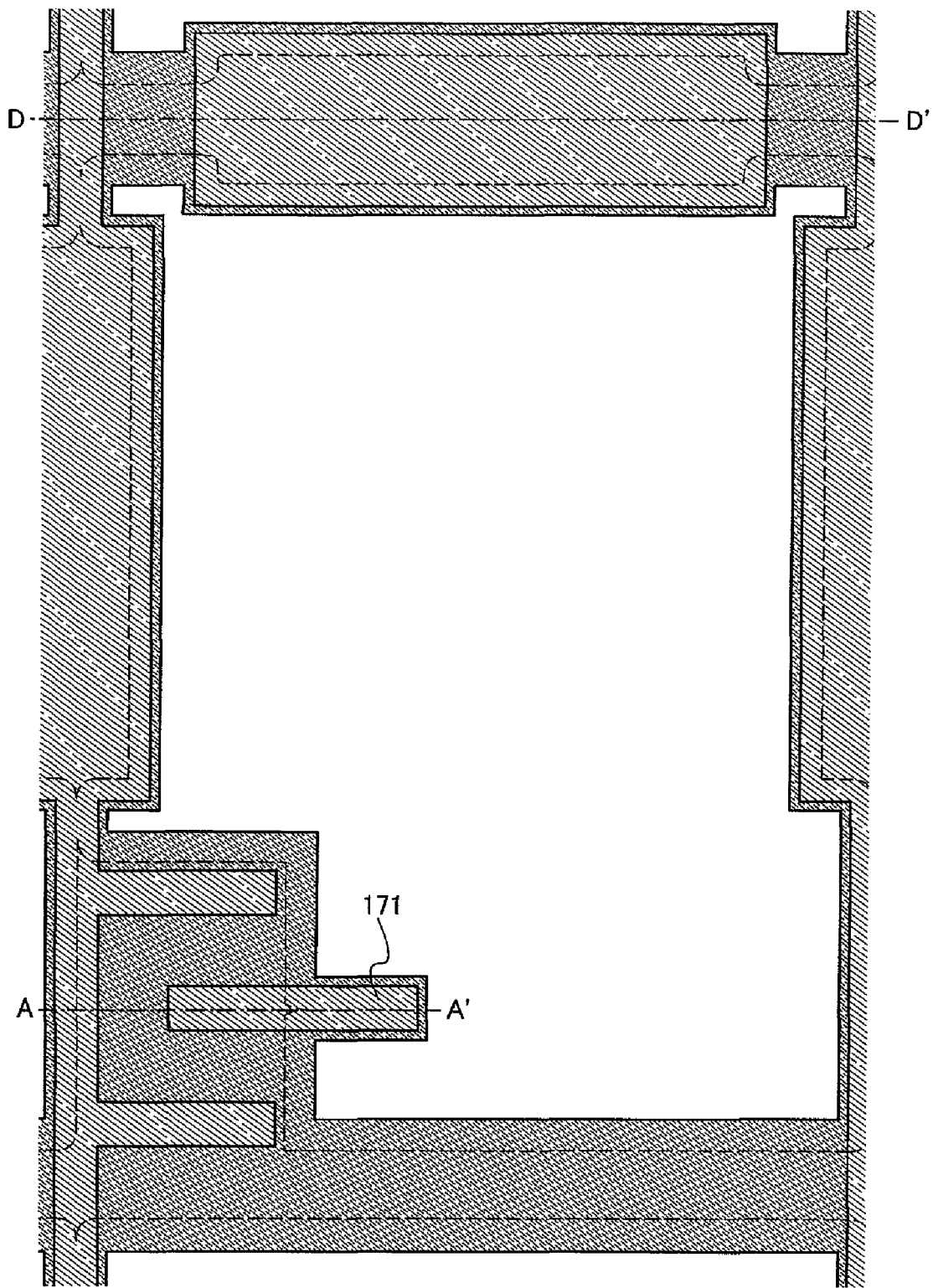
FIG. 30 illustrates an example of a manufacturing method of a thin film transistor and a display device according to the present invention.

FIGS. 26A, 26B, and 26C correspond to FIG. 1A, FIG. 1C, and FIG. 2A of Embodiment Mode 1. FIGS. 27A, 27B, and 27C correspond to FIG. 10A, FIG. 10C, and FIG. 11A of Embodiment Mode 1. FIG. 28, FIG. 29, and FIG. 30 correspond to FIG. 16, FIG. 17, and FIG. 18 of Embodiment Mode 1. The cross-sectional views taken along the line A-A' illustrated in FIG. 28, FIG. 29, and FIG. 30 correspond to FIGS. 26A, 26B, and 26C, and the cross-sectional views taken along the line D-D' illustrated in FIG. 28, FIG. 29, and FIG. 30 correspond to FIGS. 27A, 27B, and 27C.

First, similar to Embodiment Mode 1, a first conductive film 102, a first insulating film 104, a semiconductor film 106, an impurity semiconductor film 108, and a second conductive film 110 are formed over a substrate 100. Materials thereof and formation methods thereof are similar to those in Embodiment Mode 1.

Then, a first resist mask 170 is formed over the second conductive film 110 (see FIG. 26A and FIG. 27A). The first resist mask 170 is different from the first resist mask 112 of Embodiment Mode 1 and is formed so as to have an almost uniform thickness without a recessed portion being provided. That is, the first resist mask 170 can be formed without a multi-tone mask.

Next, first etching is performed using the first resist mask 170. That is, the first conductive film 102, the first insulating film 104, the semiconductor film 106, the impurity semiconductor film 108, and the second conductive film 110 are etched to form a thin-film stack body 114 over the first conductive film 102 (see FIG. 28).

Then, second etching is performed in a similar manner to Embodiment Mode 1; accordingly, a gate electrode layer 116 is formed (see FIG. 26B, FIG. 27B, and FIG. 29).

Here, the conditions of the second etching are similar to those of Embodiment Mode 1.

Next, a second resist mask 171 is formed over the thin-film stack body 114, and a source and drain electrode layer 120 is formed using the second resist mask 171. The etching conditions or the like are similar to those of Embodiment Mode 1. The steps following this are similar to those of Embodiment Mode 1.

As described in this embodiment mode above, a thin film transistor can be manufactured without using a multi-tone mask. Note that the number of masks to be used is increased by one, as compared to that of Embodiment Mode 1.

Note that the manufacturing method of a thin film transistor and a display device according to this embodiment mode is similar to that of Embodiment Mode 1 except for the point described above. Therefore, effects similar to the manufacturing method of a thin film transistor and a display device of Embodiment Mode 1 can be naturally obtained, but the number of used masks is increased by one. In other words, according to this embodiment mode, a thin film transistor can be manufactured using two photomasks. In addition, an active matrix substrate including a pixel transistor can be manufactured using four photomasks. In this manner, since the number of photomasks to be used is reduced, the number of steps for manufacturing a thin film transistor and a display device can be significantly reduced. Furthermore, a thin film transistor and a display device can be manufactured with high yield and low cost.

Note that the thin film transistor manufactured using the manufacturing method of this embodiment mode has a structure including a gate insulating film over a gate electrode layer, a semiconductor layer over the gate insulating film, a source region and a drain region over the semiconductor layer, a source electrode and a drain electrode over the source region and the drain region, and a cavity adjacent to a side surface of the gate electrode layer. By the cavity formed adjacent to the side surface of the gate electrode layer, a thin film transistor with low leakage current at an end portion of the gate electrode layer can be manufactured.

Embodiment Mode 3

In Embodiment Mode 3, a manufacturing method of a thin film transistor and a manufacturing method of a display device according to the present invention, which are different from those of Embodiment Modes 1 and 2, will be described. Specifically, a mode in which a first conductive film 102 is etched by the first etching which is described in Embodiment Modes 1 and 2 will be described with reference to FIGS. 31A to 31C, FIGS. 32A to 32C, FIGS. 33A to 33C, FIGS. 34A to 34C, FIGS. 35A to 35C, and FIG. 36.

Figure 31A:
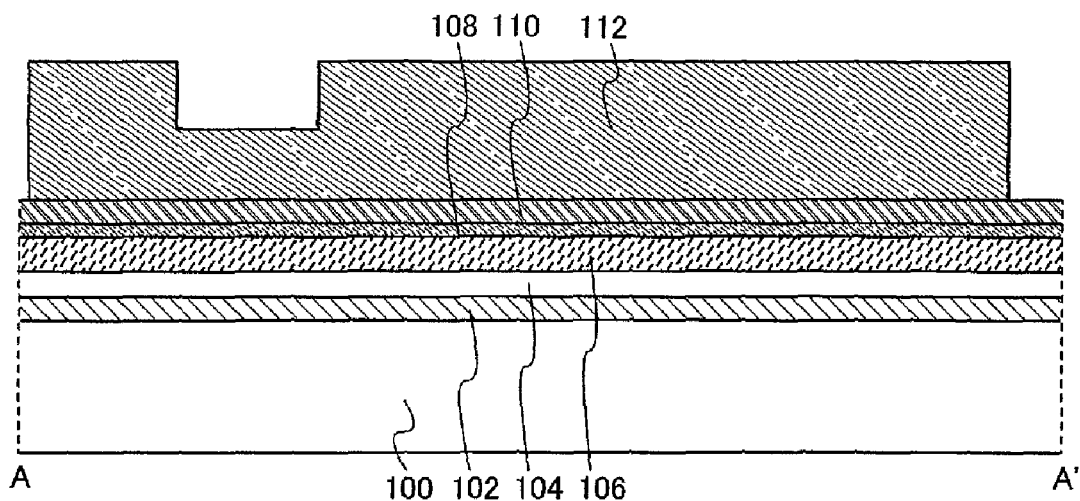
FIGS. 31A to 31C illustrate an example of a manufacturing method of a thin film transistor and a display device according to the present invention.
Figure 31B:
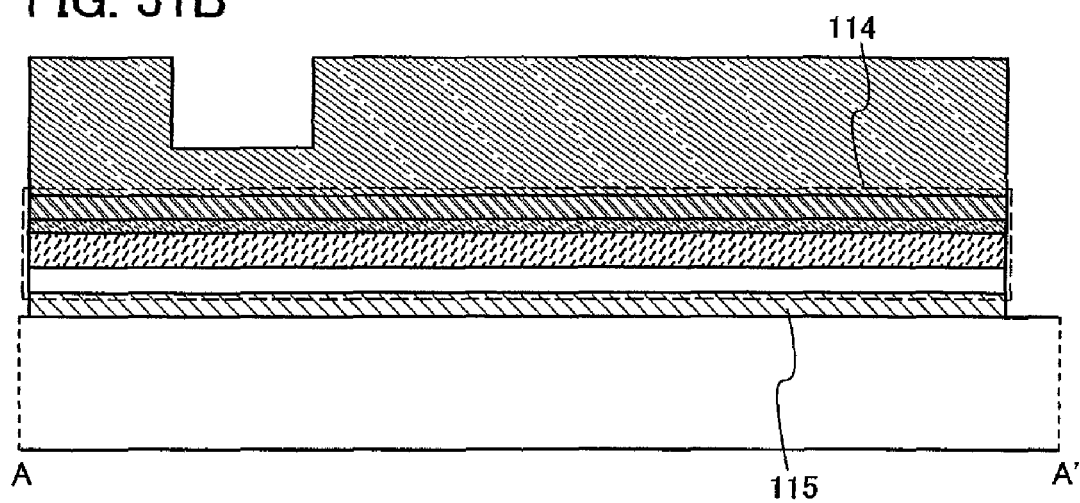
Figure 31C:
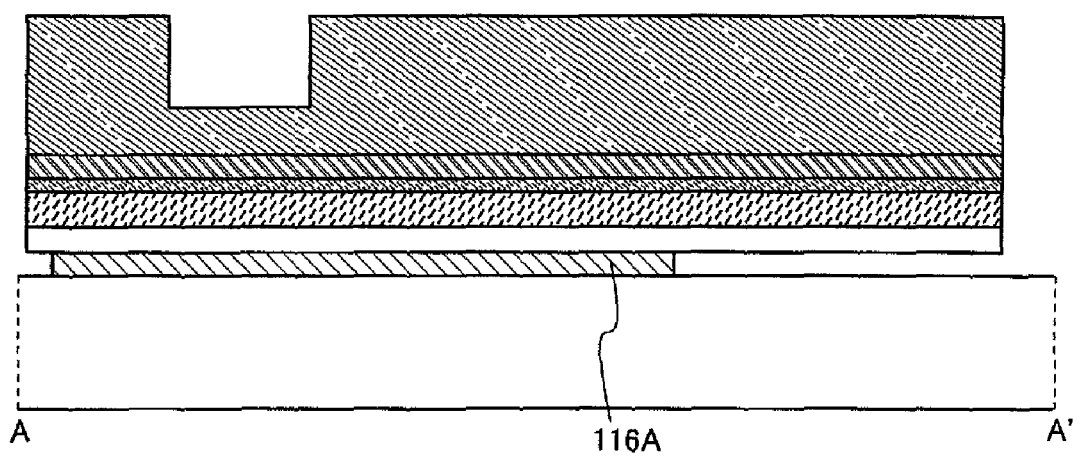
Figure 32A:
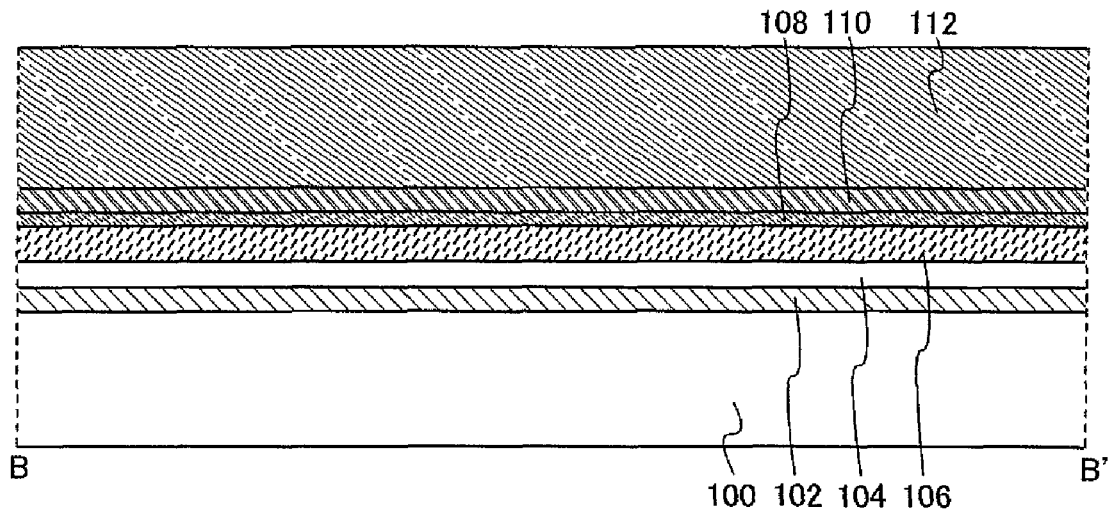
FIGS. 32A to 32C illustrate an example of a manufacturing method of a thin film transistor and a display device according to the present invention.
Figure 32B:
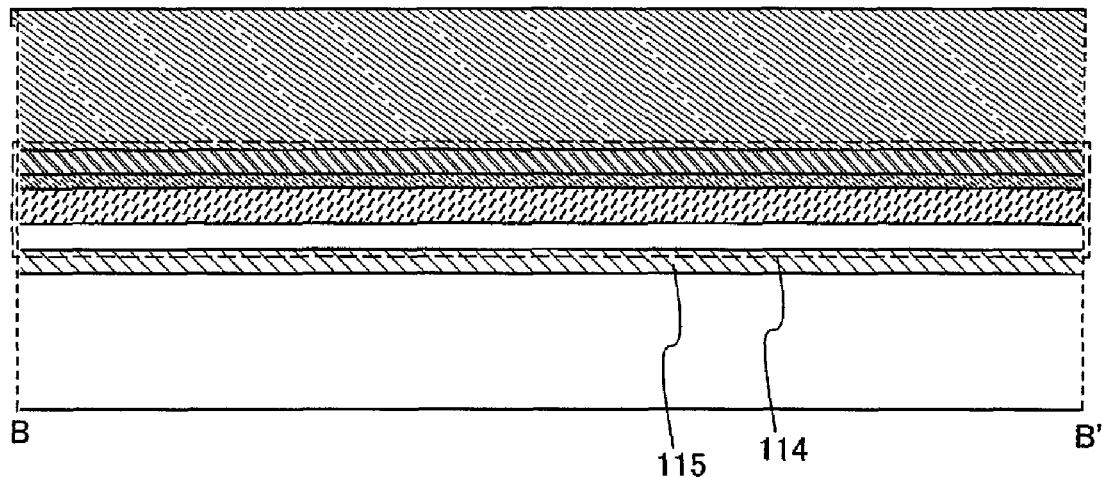
Figure 32C:
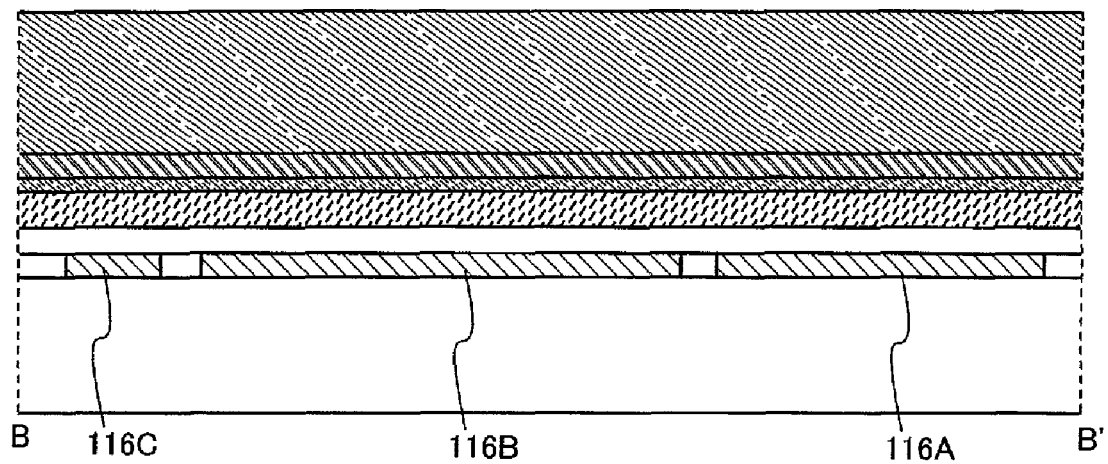
Figure 33A:
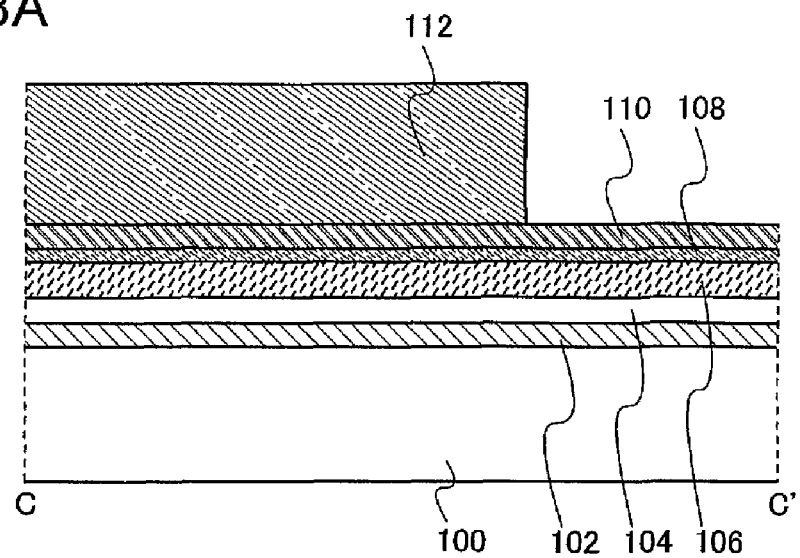
FIGS. 33A to 33C illustrate an example of a manufacturing method of a thin film transistor and a display device according to the present invention.
Figure 33B:
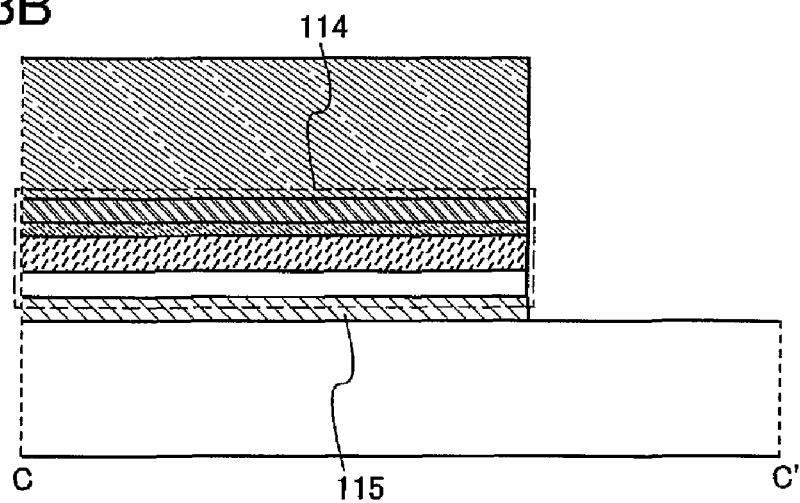
Figure 33C:
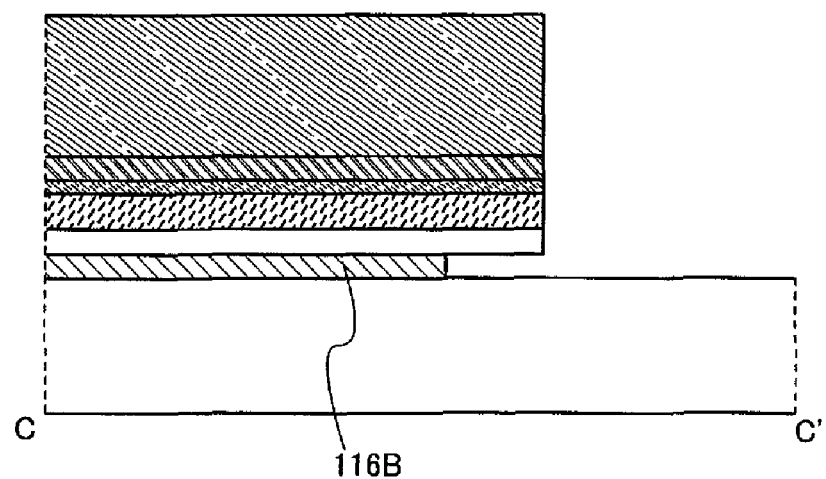
Figure 34A:
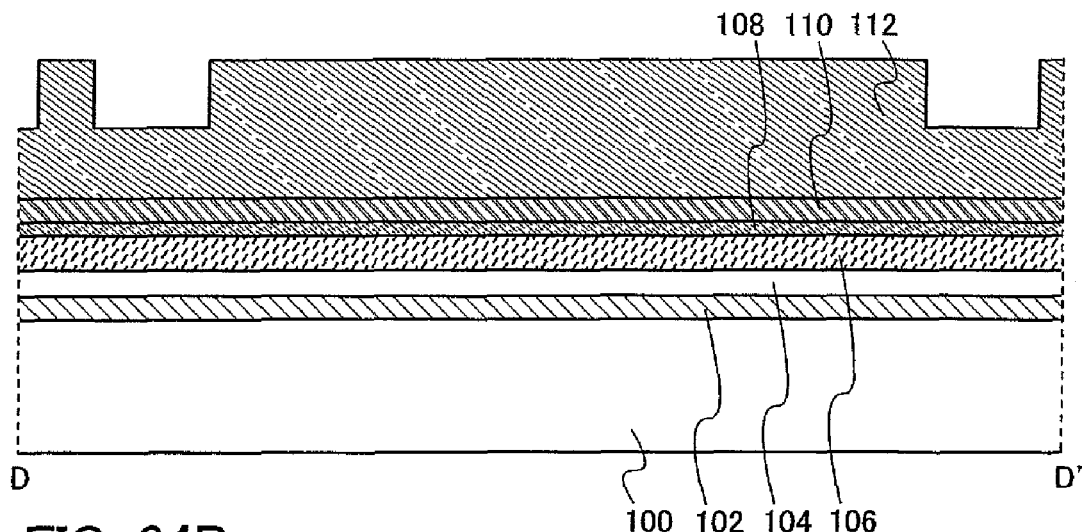
FIGS. 34A to 34C illustrate an example of a manufacturing method of a thin film transistor and a display device according to the present invention.
Figure 34B:
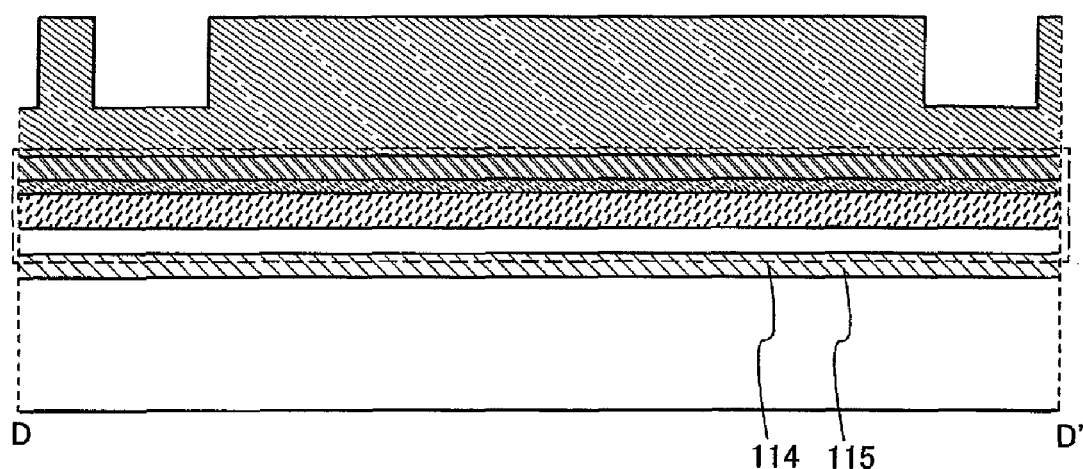
Figure 34C:
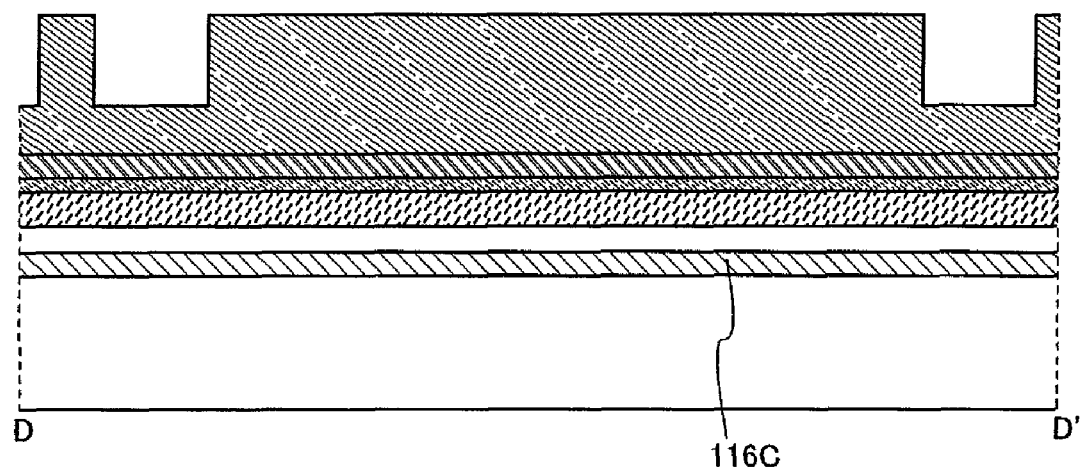
Figure 35A:
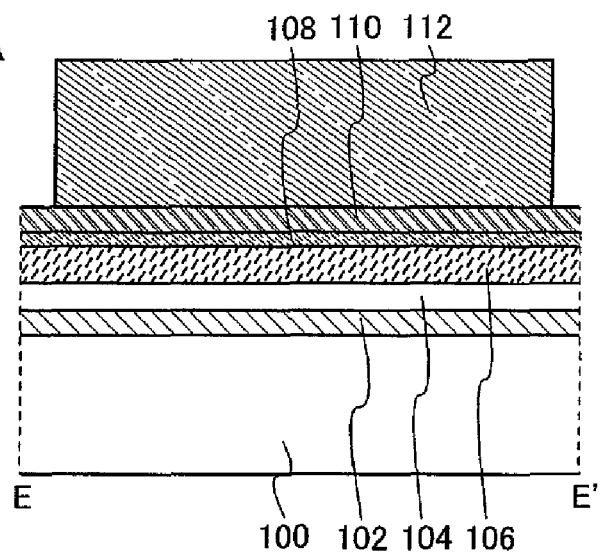
FIGS. 35A to 35C illustrate an example of a manufacturing method of a thin film transistor and a display device according to the present invention.
Figure 35B:
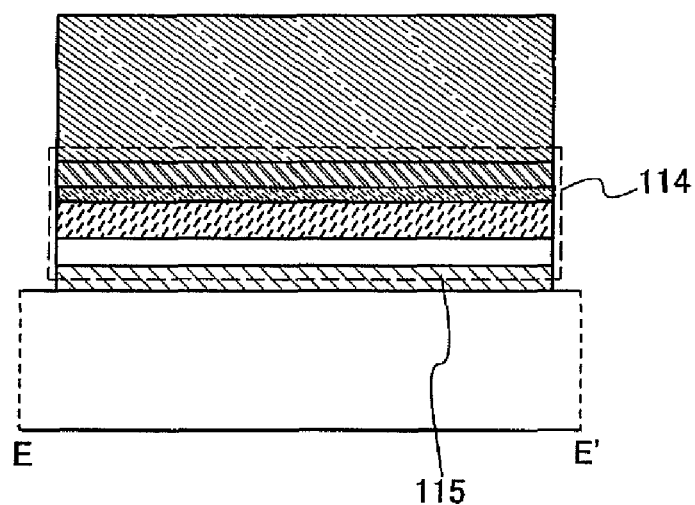
Figure 35C:
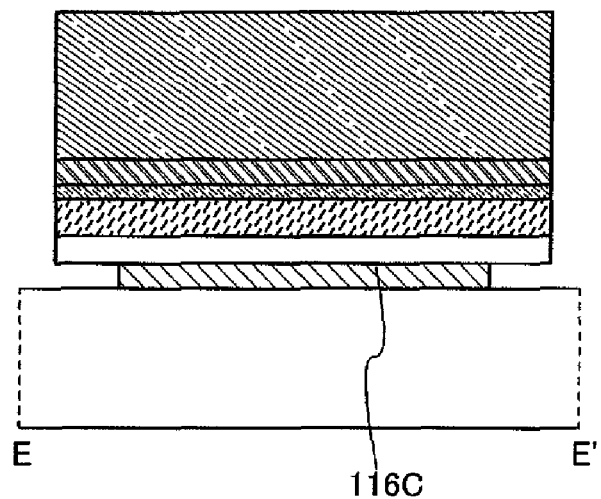
Figure 36:
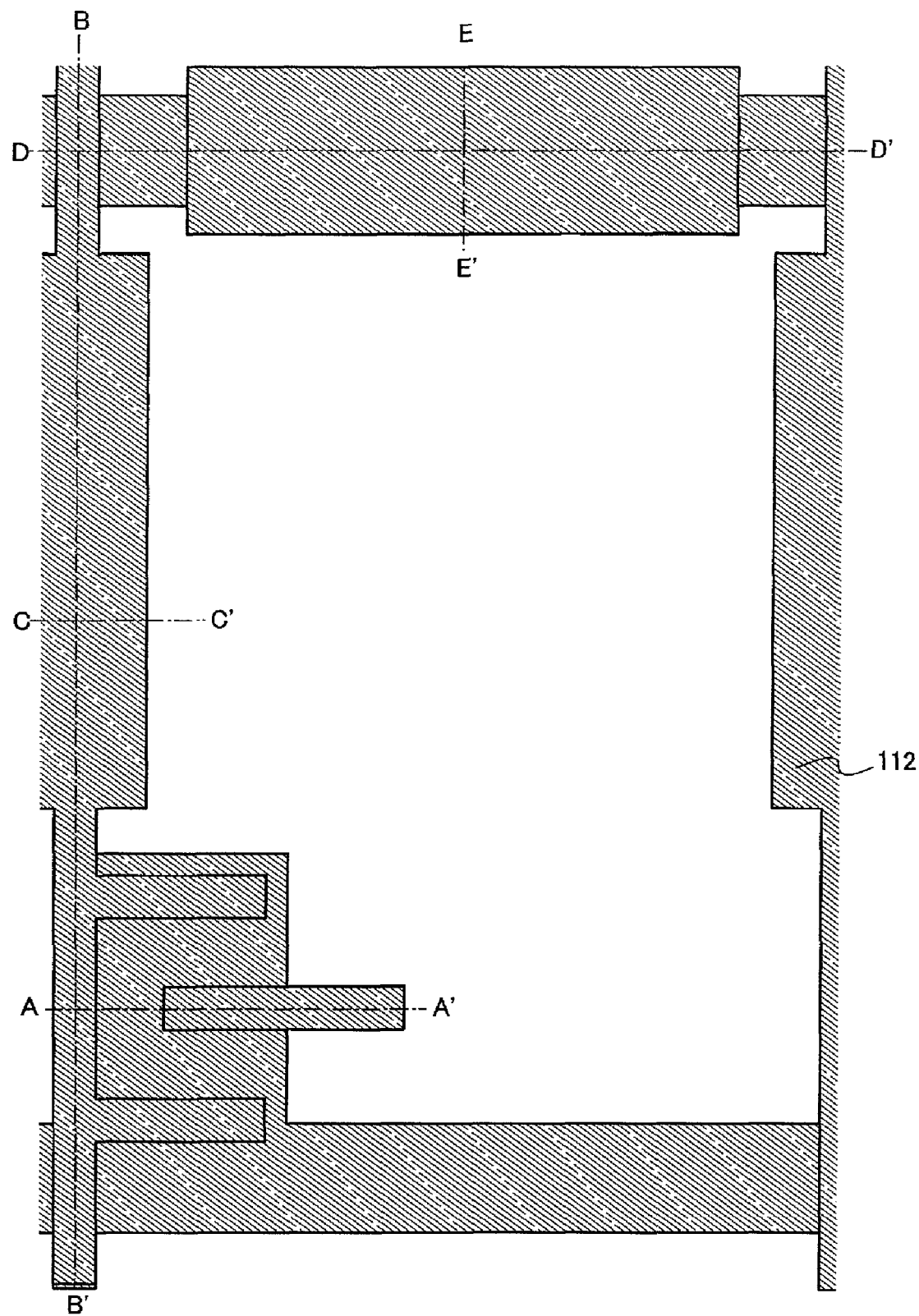
FIG. 36 illustrates an example of a manufacturing method of a thin film transistor and a display device according to the present invention.

FIGS. 31A to 31C correspond to FIGS. 1A to 1C of Embodiment Mode 1. FIGS. 32A to 32C correspond to FIGS. 4A to 4C of Embodiment Mode 1. FIGS. 33A to 33C correspond to FIGS. 7A to 7C of Embodiment Mode 1. FIGS. 34A to 34C correspond to FIGS. 10A to 10C of Embodiment Mode 1. FIGS. 35A to 35C correspond to FIGS. 13A to 13C of Embodiment Mode 1. FIG. 36 corresponds to FIG. 16 of Embodiment Mode 1.

First, similar to Embodiment Mode 1, a first conductive film 102, a first insulating film 104, a semiconductor film 106, an impurity semiconductor film 108, and a second conductive film 110 are formed over a substrate 100. Materials thereof and formation methods thereof are similar to those in Embodiment Mode 1.

Then, a first resist mask 112 is formed over the second conductive film 110 (see FIG. 31A, FIG. 32A, FIG. 33A, FIG. 34A, and FIG. 35A). The features of the first resist mask 112 are similar to those of Embodiment Mode 1.

Next, first etching is performed using the first resist mask 112. That is, the first conductive film 102, the first insulating film 104, the semiconductor film 106, the impurity semiconductor film 108, and the second conductive film 110 are etched to form a thin-film stack body 114 and an etched first conductive film 115 (see FIG. 31B, FIG. 32B, FIG. 33B, FIG. 34B, FIG. 35B, and FIG. 36).

As described above, this embodiment mode is different from Embodiment Mode 1 in that the first conductive film 102 is processed by the first etching so that the etched first conductive film 115 is formed.

Next, by second etching, the etched first conductive film 115 is processed into a gate electrode layer 116 (see FIG. 31C, FIG. 32C, FIG. 33C, FIG. 34C, and FIG. 35C).

Here, the conditions and the like of the second etching are similar to those of the second etching of Embodiment Mode 1, except for the following point.

In Embodiment Mode 1, the region that should be removed of the first conductive film 102 needs to be completely removed only by the second etching. Note that the region that should be removed of the first conductive film 102 means a region other than the region where the gate electrode layer 116 is formed.

Here, the distance $d_1$ between the side surface of the thin-film stack body 114 and the side surface of the gate electrode layer 116 depends on the thickness of the first conductive film 102. The second etching is etching in which side-etching is performed and is almost isotropic etching (so-called chemical etching). Therefore, in case where the distance $d_1$ is made smaller than the thickness of the first conductive film 102, it is difficult to completely remove the region that should be removed of the first conductive film 102 by the method described in Embodiment Mode 1.

As described above, the etched first conductive film 115 is formed by processing the first conductive film 102 by the first etching and the gate electrode layer 116 is formed by the second etching, whereby the distance $d_1$ can be made smaller than the thickness of the first conductive film 102. That is, the distance $d_1$ can be controlled independently of the thickness of the first conductive film 102, thereby increasing the freedom of layout design.

Note that the steps after the second etching are similar to those of Embodiment Mode 1. That is, by combining the method described in Embodiment Mode 1 with the method described in this embodiment mode, a thin film transistor can be manufactured using one photomask in such a manner that a gate electrode layer is formed utilizing side-etching, and further, a source and drain electrode layer is formed by using a multi-tone mask.

As described above in this embodiment mode, the first conductive film 102 is processed by the first etching, whereby the distance $d_1$ between the side surface of the thin-film stack body 114 and the side surface of the gate electrode layer 116 can be designed independently of the thickness of the first conductive film 102, thereby increasing the freedom of layout design.

Note that the manufacturing method of a thin film transistor and a display device according to this embodiment mode is similar to that of Embodiment Mode 1 except for the point described above. Therefore, effects similar to the manufacturing method of a thin film transistor and a display device of Embodiment Mode 1 can be naturally obtained.

This embodiment mode may be implemented in combination with Embodiment Mode 2.

Embodiment Mode 4

In Embodiment Mode 4, electronic devices in which a display panel or a display device manufactured by any of the methods described in Embodiment Modes 1 to 3 is incorporated as a display portion will be described with reference to FIGS. 37A and 37B, FIG. 38, and FIGS. 39A to 39C. As such electronic devices, for example, cameras such as video cameras or digital cameras; head mounted displays (goggle type displays); car navigation systems; projectors; car stereos; personal computers; and portable information terminals (such as mobile computers, mobile phones, and e-book readers) can be given. Examples of the electronic device are illustrated in FIGS. 37A and 37B.

Figure 37A:
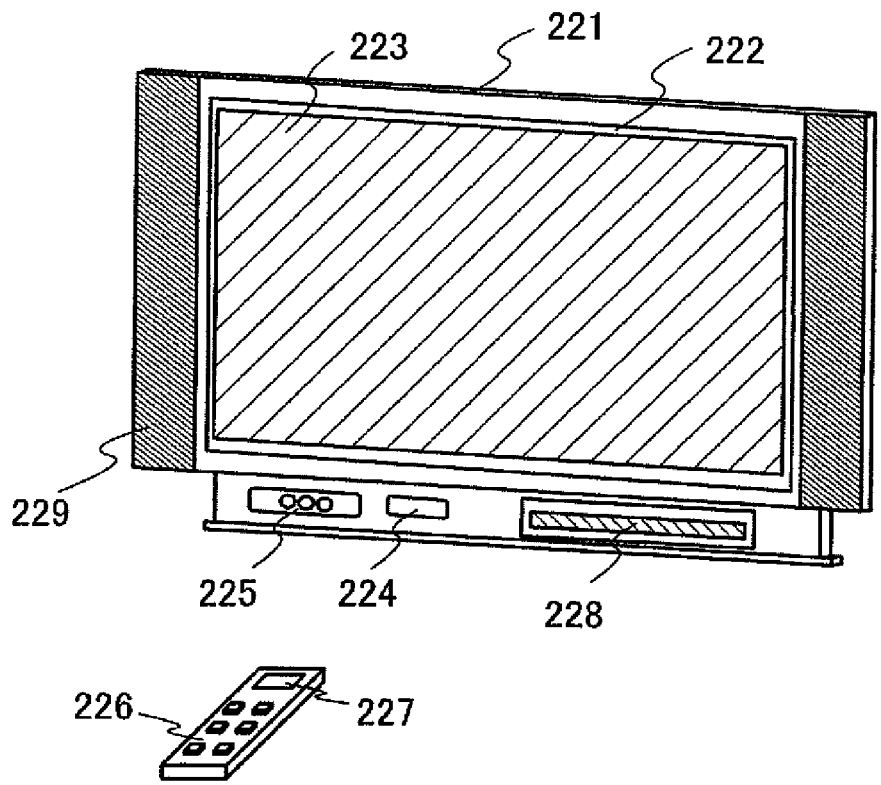
FIGS. 37A and 37B are perspective views of electronic devices each using a display device according to the present invention.
Figure 37B:
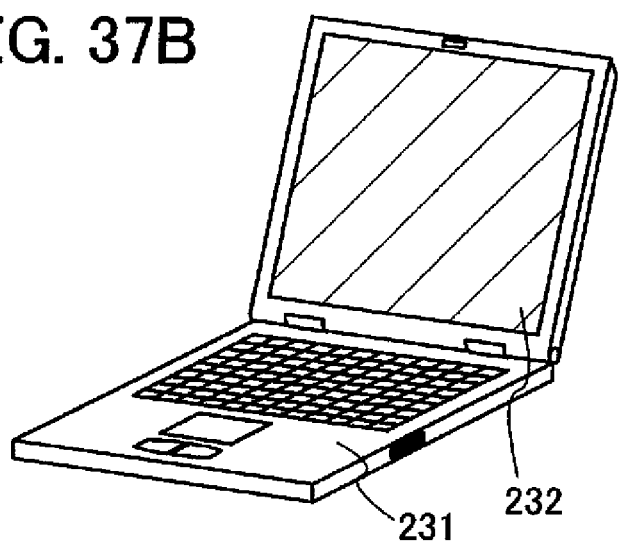

FIG. 37A illustrates a television device. A television device illustrated in FIG. 37A can be completed by incorporating a display panel manufactured using the present invention into a housing. A main screen 223 is formed using the display panel manufactured by any of the manufacturing methods described in Embodiment Modes 1 to 3, and a speaker portion 229, operation switches, and the like are provided as its accessory equipment.

As illustrated in FIG. 37A, a display panel 222 manufactured by any of the manufacturing methods described in Embodiment Modes 1 to 3 is incorporated into a housing 221, and general TV broadcast can be received by a receiver 225. When the television device is connected to a communication network by wired or wireless connections via a modem 224, one-way (from a sender to a receiver) or two-way (between a sender and a receiver or between receivers) information communication can be performed. The television device can be operated using switches incorporated into the housing or by a remote control device 226 provided separately. A display portion 227 which displays output information may be provided for the remote control device 226.

Further, the television device may include a sub-screen 228 formed using a second display panel for displaying channels, volume, and the like, in addition to the main screen 223.

Figure 38:
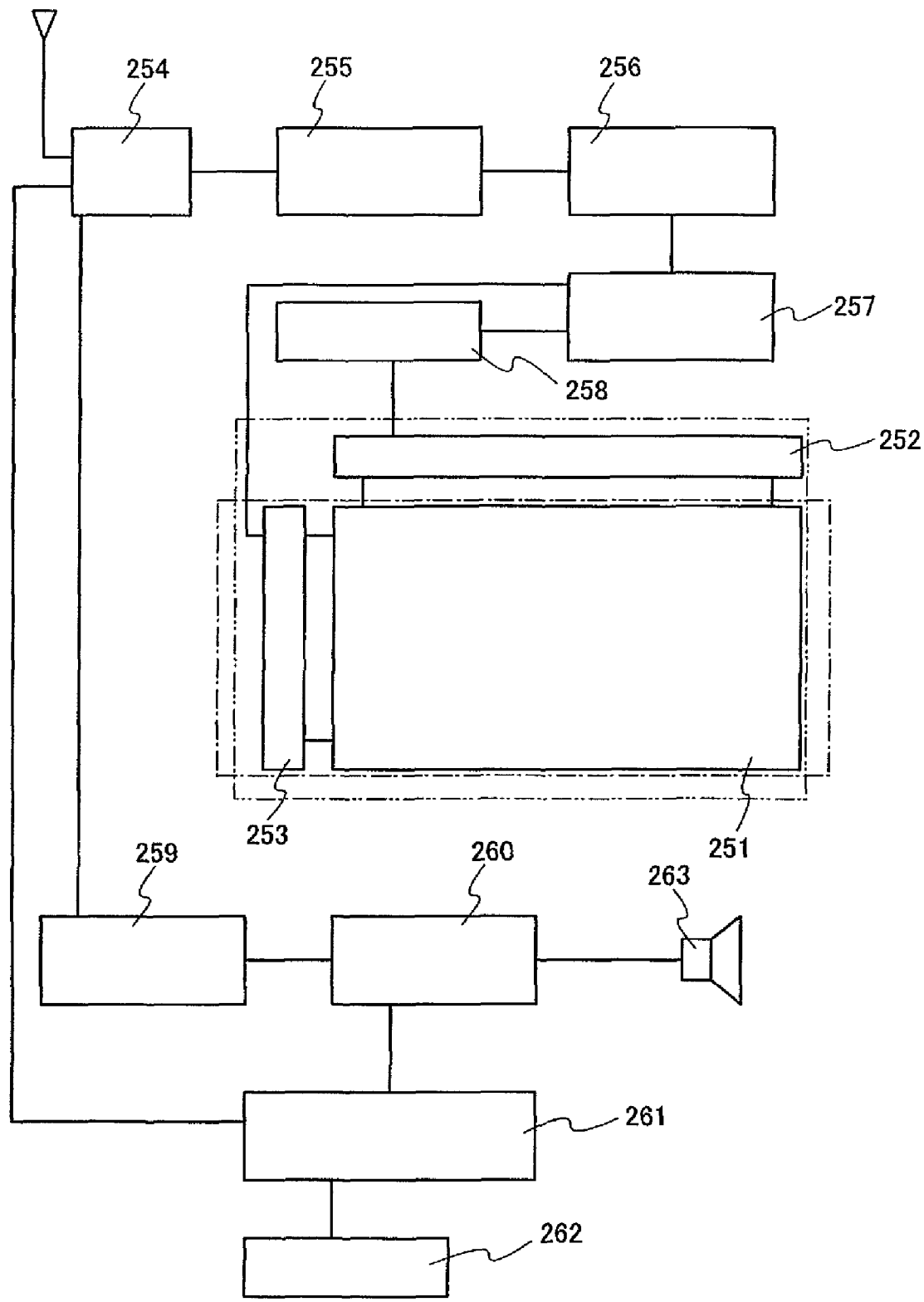
FIG. 38 illustrates an electronic device using a display device according to the present invention.

FIG. 38 is a block diagram of a main structure of a television device. A pixel portion 251 is formed in a display region. A signal line driver circuit 252 and a scanning line driver circuit 253 may be mounted on the display panel by a COG method.

As structures of other external circuits, a video signal amplifier circuit 255 amplifying a video signal among signals received by a tuner 254, a video signal processing circuit 256 converting signals output from the video signal amplifier circuit 255 into chrominance signals corresponding to respective colors of red, green, and blue, a control circuit 257 for converting the video signal into a signal which meets input specifications of a driver IC, and the like are provided on the input side of the video signal. The control circuit 257 outputs signals to each of the scanning line side and the signal line side. In the case of digital drive, a signal dividing circuit 258 may be provided on the signal line side and an input digital signal may be divided into m (m is an integer) pieces and supplied.

Among the signals received by the tuner 254, audio signals are transmitted to an audio signal amplifier circuit 259, and an output thereof is supplied to a speaker 263 through an audio signal processing circuit 260. A control circuit 261 receives control information on receiving station (receiving frequency) and volume from an input portion 262 and transmits signals to the tuner 254 and the audio signal processing circuit 260.

Naturally, the present invention is not limited to the television device and can also be applied to a large-size display medium such as an information display board at a train station, an airport, and the like, or an advertisement display board on the street, as well as a monitor of a personal computer. By using the present invention, productivity of these display mediums can be improved.

When the display panel or display device manufactured by any of the manufacturing methods of a display device described in Embodiment Modes 1 to 3 is applied to the main screen 223 and the sub screen 228, productivity of television devices can be increased.

A mobile computer illustrated in FIG. 37B includes a main body 231, a display portion 232, and the like. When the display panel or display device manufactured by any of the manufacturing methods of a display device described in Embodiment Modes 1 to 3 is applied to the display portion 232, productivity of computers can be increased.

Figure 39A:
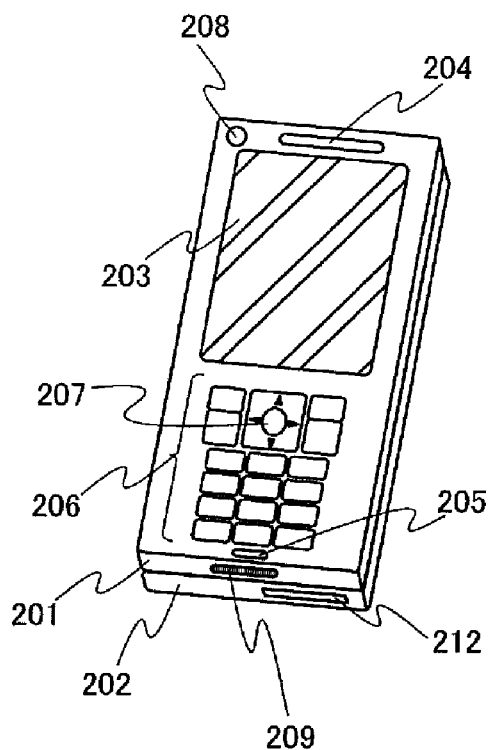
FIGS. 39A to 39C illustrate an electronic device using a display device according to the present invention.
Figure 39B:
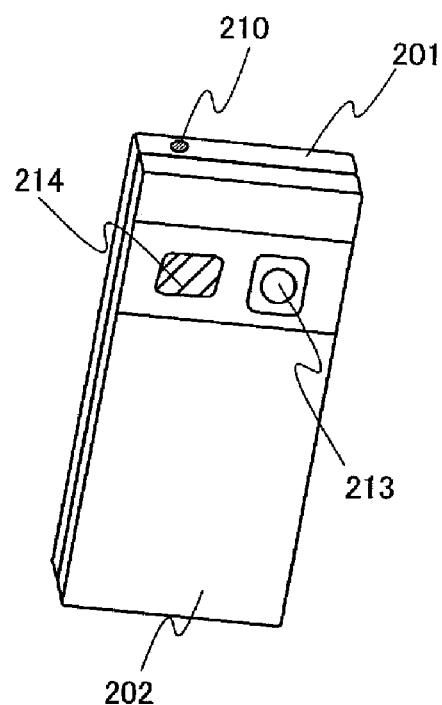
Figure 39C:
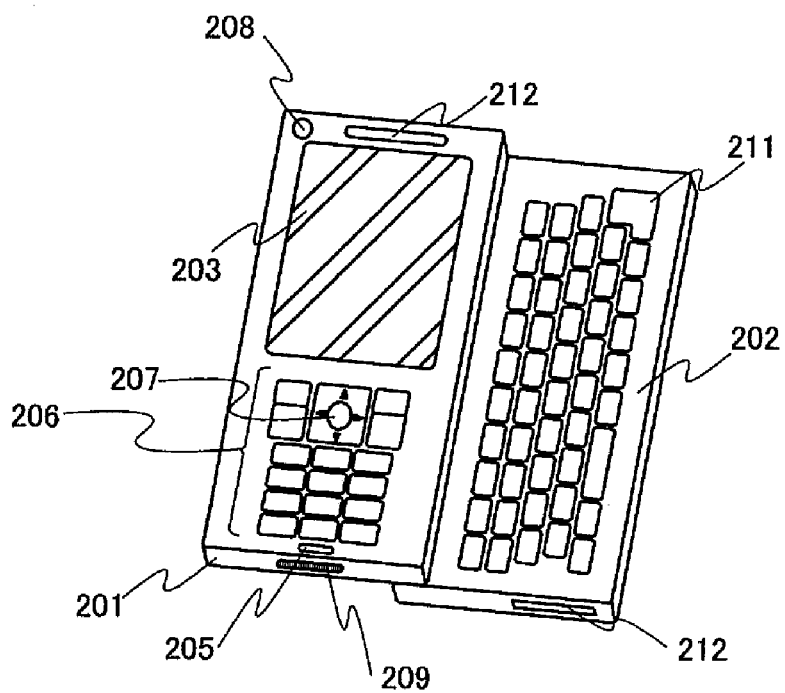

FIGS. 39A to 39C illustrate an example of a mobile phone to which the present invention is applied. FIG. 39A is a front view, FIG. 39B is a rear view, and FIG. 39C is a development view when two housings slide. A mobile phone 200 includes two housings 201 and 202. The mobile phone 200 is a so-called smartphone which has both functions of a mobile phone and a portable information terminal, and incorporates a computer and can process a variety of data processing in addition to voice calls.

The mobile phone 200 includes the housing 201 and the housing 202. The housing 201 includes a display portion 203, a speaker 204, a microphone 205, operation keys 206, a pointing device 207, a front camera lens 208, a jack 209 for an external connection terminal, an earphone terminal 210, and the like, while the housing 202 includes a keyboard 211, an external memory slot 212, a rear camera 213, a light 214, and the like. In addition, an antenna is incorporated in the housing 201.

In addition to the above-described structure, a wireless IC chip, a small size memory device, or the like may be incorporated in the mobile phone 200.

The housings 201 and 202 overlapped with each other (illustrated in FIG. 39A) slide and can be developed as illustrated in FIG. 39C. The display panel or display device manufactured by any of the manufacturing methods of a display device described in Embodiment Modes 1 to 3 can be incorporated in the display portion 203. Since the display portion 203 and the front camera lens 208 are provided in the same plane, the mobile phone 200 can be used as a videophone. A still image and a moving image can be taken by the rear camera 213 and the light 214 by using the display portion 203 as a viewfinder.

By using the speaker 204 and the microphone 205, the mobile phone 200 can be used as an audio recording device (sound recorder) or an audio reproducing device. With use of the operation keys 206, operation of incoming and outgoing calls, simple information input for electronic mail or the like, scrolling of a screen displayed on the display portion, cursor motion for selecting information to be displayed on the display portion, and the like are possible.

If much information needs to be handled, such as the case of creating documents and using the mobile phone 200 as a portable information terminal, the use of the keyboard 211 is convenient. The housings 201 and 202 overlapped with each other (FIG. 39A) slide and can be developed as illustrated in FIG. 39C. In the case where the mobile phone 200 is used as a portable information terminal, smooth operation with the keyboard 211 and the pointing device 207 can be performed. The jack 209 for an external connection terminal can be connected to various cables such as an AC adopter or a USB cable, whereby the mobile phone 200 can be charged or can perform data communication with a personal computer or the like. Moreover, by inserting a recording medium into the external memory slot 212, the mobile phone 200 can deal with storing and moving a large capacity of data.

In the rear surface of the housing 202 (FIG. 39B), the rear camera 213 and the light 214 are provided, and a still image and a moving image can be taken by using the display portion 203 as a viewfinder.

Further, the mobile phone 200 may have an infrared communication function, a USB port, a function of receiving one segment television broadcast, a non-contact IC chip, an earphone jack, or the like, in addition to the above-described functions and structures.

Since various electronic devices described in this embodiment mode can be manufactured by any of the manufacturing methods of a thin film transistor and a display device described in Embodiment Modes 1 to 3, productivity of these electronic devices can be increased by using the present invention.

Accordingly, by using the present invention, manufacturing cost of these electronic devices can be significantly reduced.

Embodiment 1

In Embodiment 1, a gate electrode is formed using the second etching described in Embodiment Mode 1, and this pattern was observed. The observation results will be described below.

First, a first conductive film 102 was formed using molybdenum with a thickness of 150 nm over a glass substrate, a first insulating film 104 was formed using silicon nitride with a thickness of 300 nm, a semiconductor film 106 was formed using amorphous silicon with a thickness of 150 nm, an impurity semiconductor film 108 was formed using amorphous silicon containing phosphorus with a thickness of 50 nm, and a second conductive film 110 was formed using tungsten with a thickness of 300 nm.

Then, a resist mask was formed over the second conductive film 110, and first etching was performed. The first etching was performed by three stages of dry etching. First, etching was performed at flow rates of a $Cl_2$ gas, a $CF_4$ gas, and an $O_2$ gas in a mixed gas of 40 sccm, 40 sccm, and 20 sccm respectively, at a pressure of 100 mT and an RF power of 500 W for 260 seconds. Then, etching was performed at a flow rate of only a $Cl_2$ gas of 100 sccm at a pressure of 100 mT and an RF power of 500 W for 240 seconds. Lastly, etching was performed at a flow rate of only a $CHF_3$ gas of 100 sccm at a pressure of 100 mT and an RF power of 1000 W for 400 seconds, then 200 seconds, and further 400 seconds.

Next, second etching was performed on the samples which had been subjected to the first etching. The second etching was performed by wet etching. In the wet etching, a chemical solution at 40° C. containing nitric acid, acetic acid, and phosphoric acid was used and the samples were soaked in the chemical solution for 240 seconds or 300 seconds. Note that the chemical solution containing nitric acid, acetic acid, and phosphoric acid is a mixture including phosphoric acid at about 70%, nitric acid at about 10%, acetic acid at about 20%, and water.

Figure 40A:
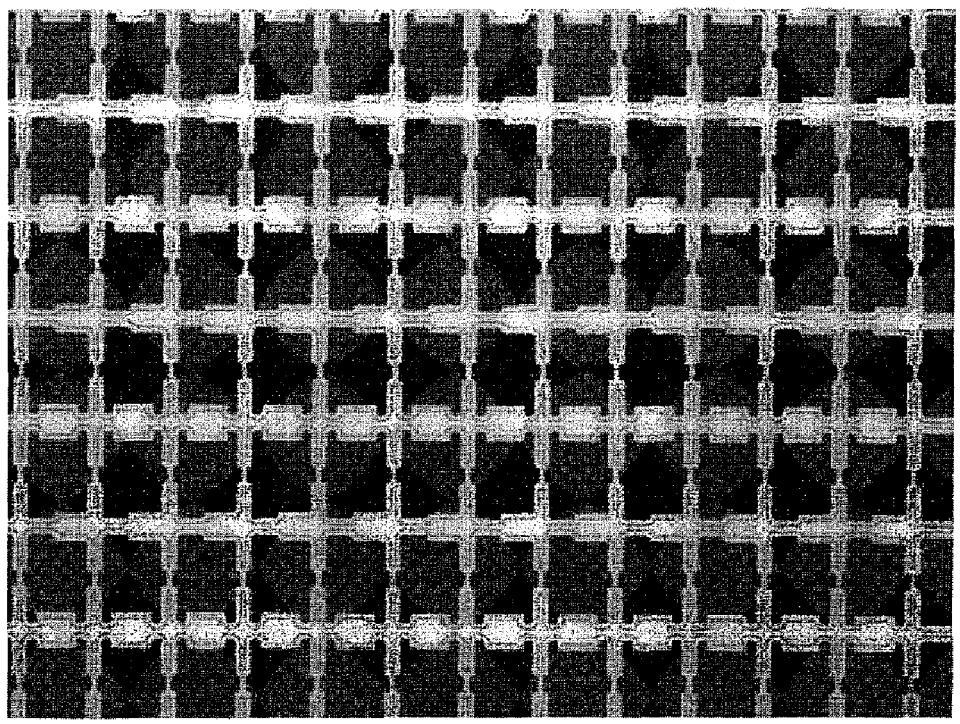
FIGS. 40A and 40B are optical microphotographs which are explained in Embodiment 1 of the present invention.
Figure 40B:
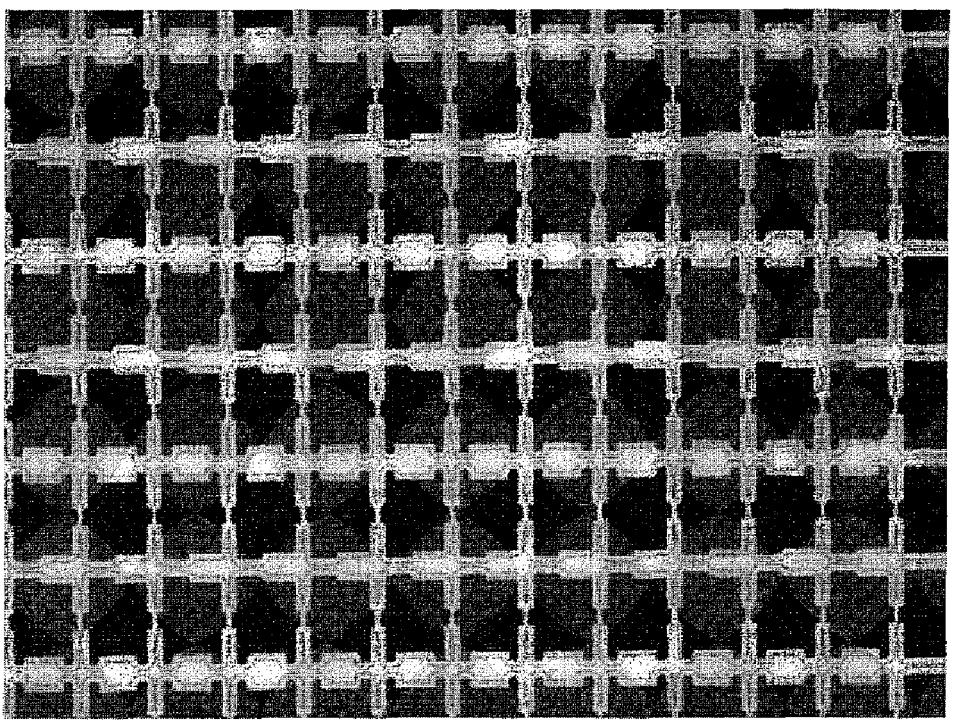

The samples manufactured in the above-described manner were observed with an optical microscope. The observation results at that time are shown in FIGS. 40A and 40B. Note that FIG. 40A is an optical micrograph of the sample subjected to the second etching for 240 seconds and FIG. 40B is an optical micrograph of the sample subjected to the second etching for 300 seconds. Here, observation with the optical microscope was conducted from the rear (substrate) side. In each of FIGS. 40A and 40B, the side surface of the pattern of the gate electrode is more on the inside than the side surface of the element region by an almost uniform distance, which is a favorable shape.

Figure 41A:
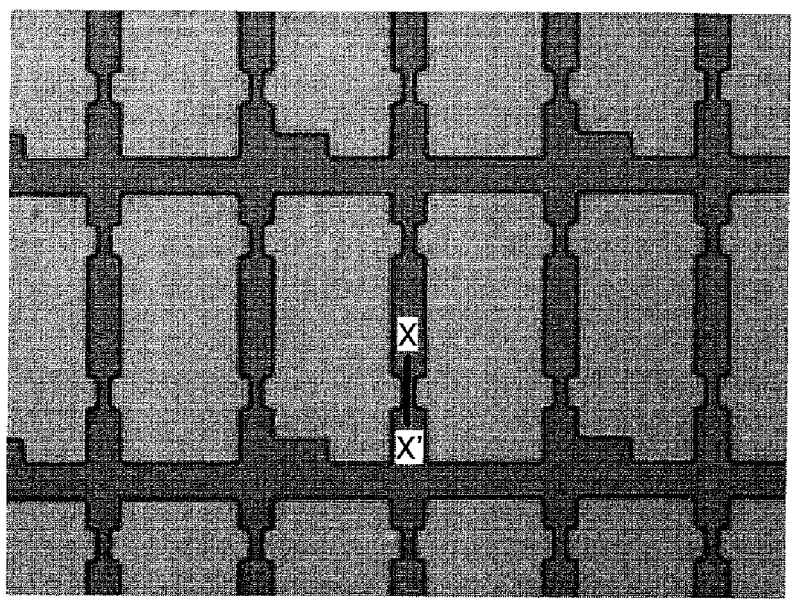
FIGS. 41A to 41C are STEM images which are explained in Embodiment 1 of the present invention.
Figure 41B:
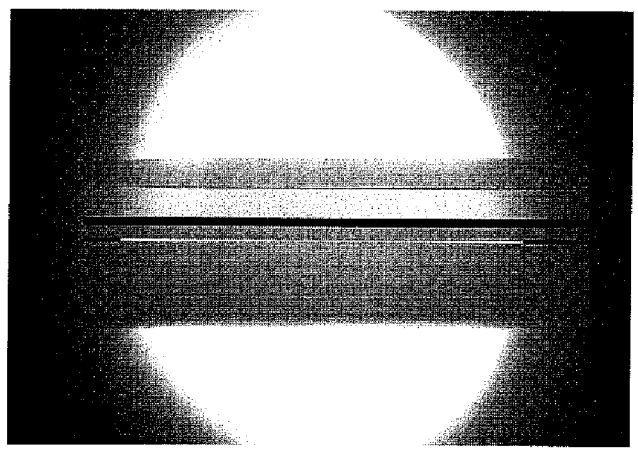
Figure 41C:
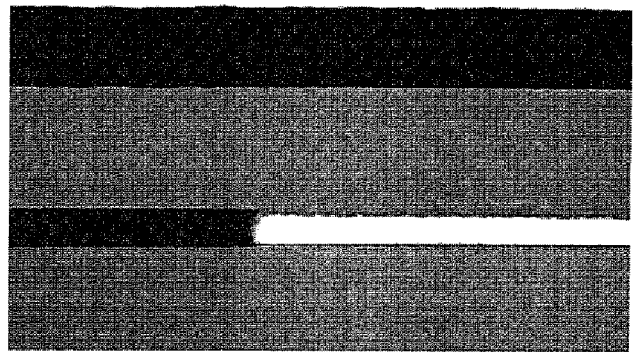

An end portion of a gate electrode layer of the sample manufactured in the above-described manner was processed with a focused ion beam (FIB) apparatus, and the processed sample was observed with a scanning transmission electron microscope (STEM). FIG. 41A shows a sample before the second etching is performed, which is observed at higher magnification than that of FIGS. 40A and 40B with an optical microscope. FIG. 41B is a STEM image after the second etching, taken along the line X-X' of FIG. 41A. FIG. 41C is an enlarged view of a part encircled by the dotted line in FIG. 41B. In FIG. 41C, a black substance is observed above and below the cavity. This is a substance generated by processing with the FIB apparatus. As shown in FIGS. 41A to 41C, by using the present invention, a cavity can be provided at an end portion of a gate electrode layer.

Figure 42:
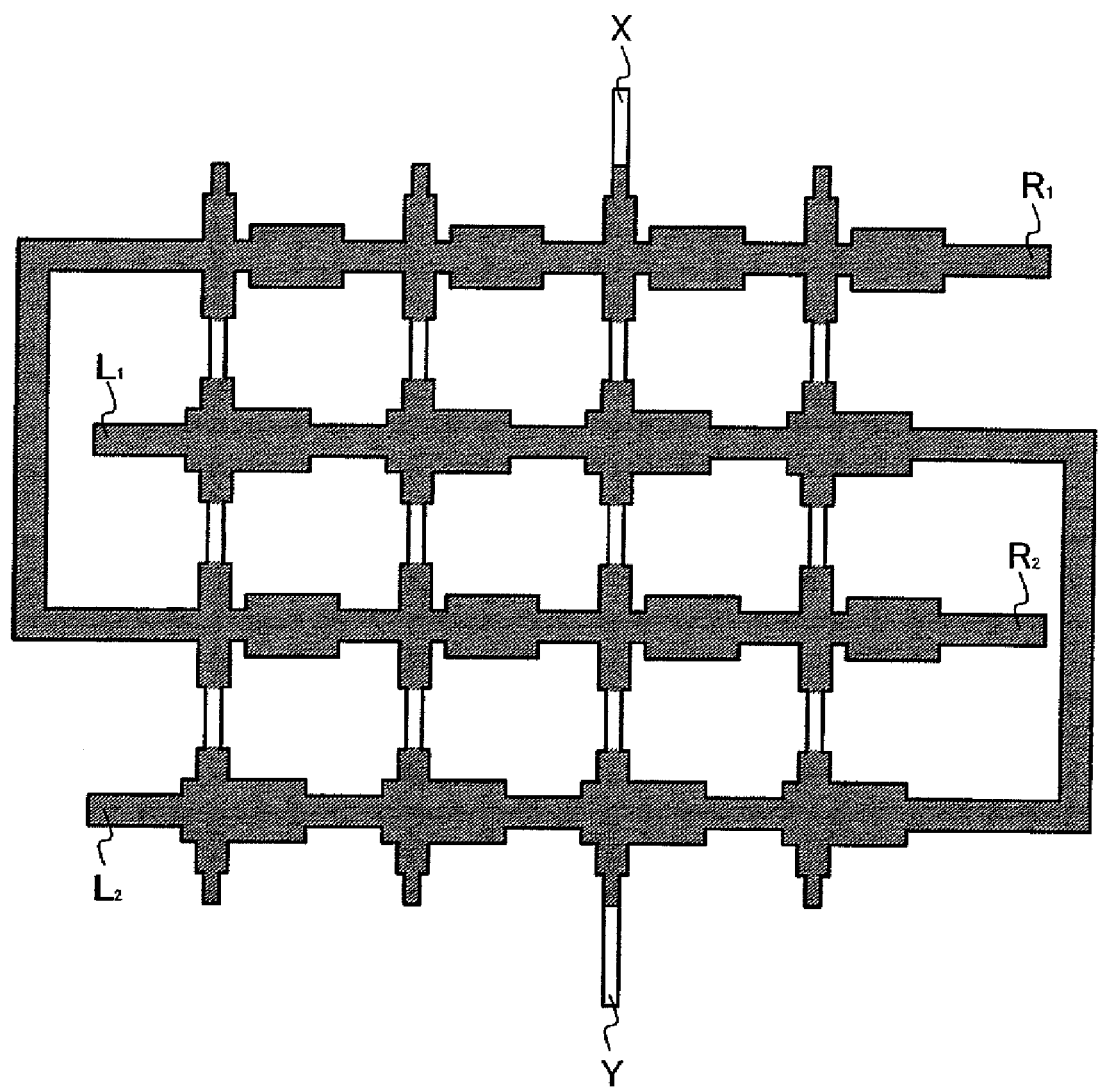
FIG. 42 illustrates a current test of Embodiment 1 of the present invention.

Next, a current test was performed to check whether adjacent gate wirings are insulated from each other in these samples. A top view of a sample used for the current test is illustrated in FIG. 42. Note that although $L_1$ to $L_8$, $R_1$ to $R_8$, X, and Y were used in the current test, $L_1$, $L_2$, $R_1$, $R_2$, X, and Y were used in FIG. 42 for simplicity. In FIG. 42, a source and drain electrode layer (etched second conductive film) is formed in a portion illustrated with a bold line, and a gate electrode layer (etched first conductive film) is formed in a portion with a hatch. In addition, $L_1$, $L_2$, $R_1$, and $R_2$ are the gate electrode layer, and X and Y are the source and drain electrode layer.

Figure 43A:
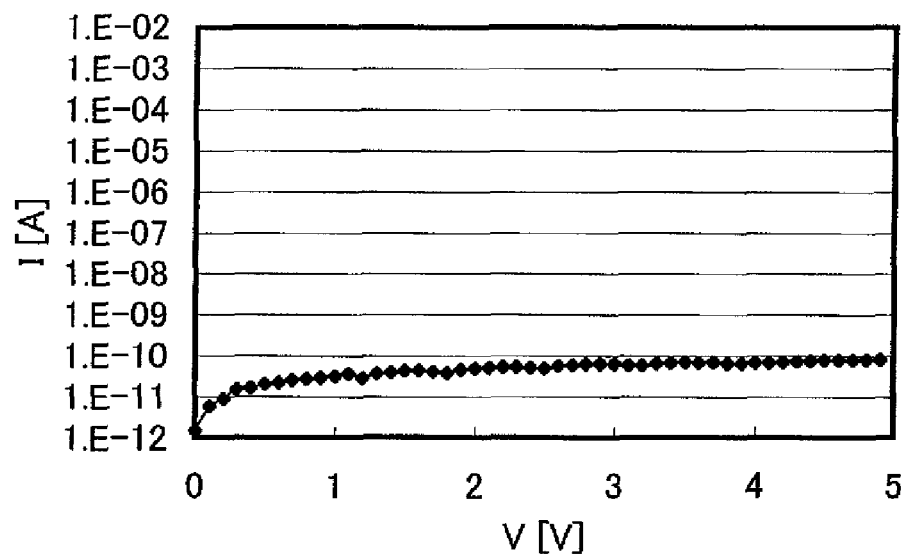
FIGS. 43A and 43B show results of a current test of Embodiment 1 of the present invention.

FIG. 43A shows the current value measured when a voltage is applied between $R_1$ and $L_1$. The maximum current is about $1.0 \times 10^{-10}$ (A), which shows that $R_1$ and $L_1$ are insulated from each other. That is, the adjacent two gate wirings are not electrically connected to each other and are completely disconnected from each other by the second etching.

Figure 43B:
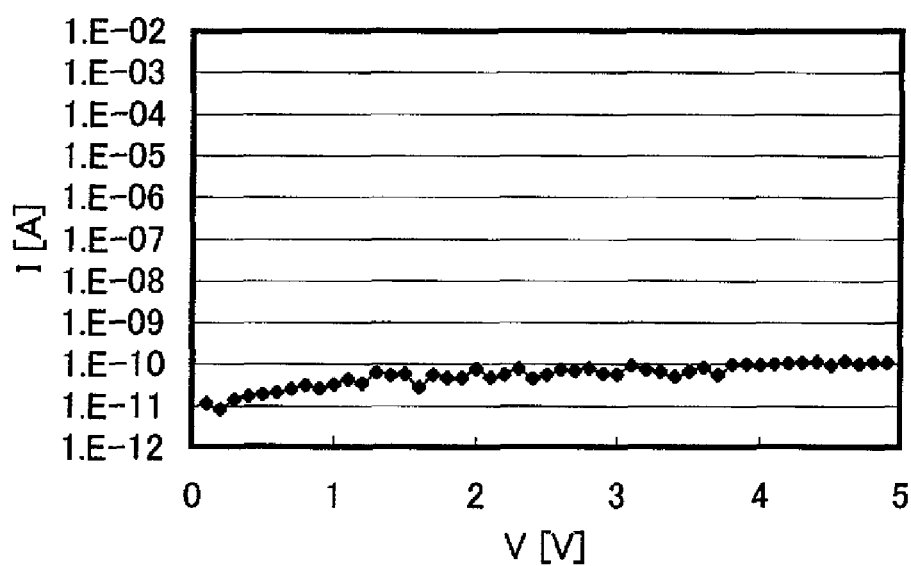

FIG. 43B shows the current value measured when a voltage is applied between X and $L_1$. The maximum current is about $1.0 \times 10^{-10}$ (A), which shows that X and $L_1$ are insulated from each other. That is, the gate wiring and the source wiring are not electrically connected to each other.

Figure 44A:
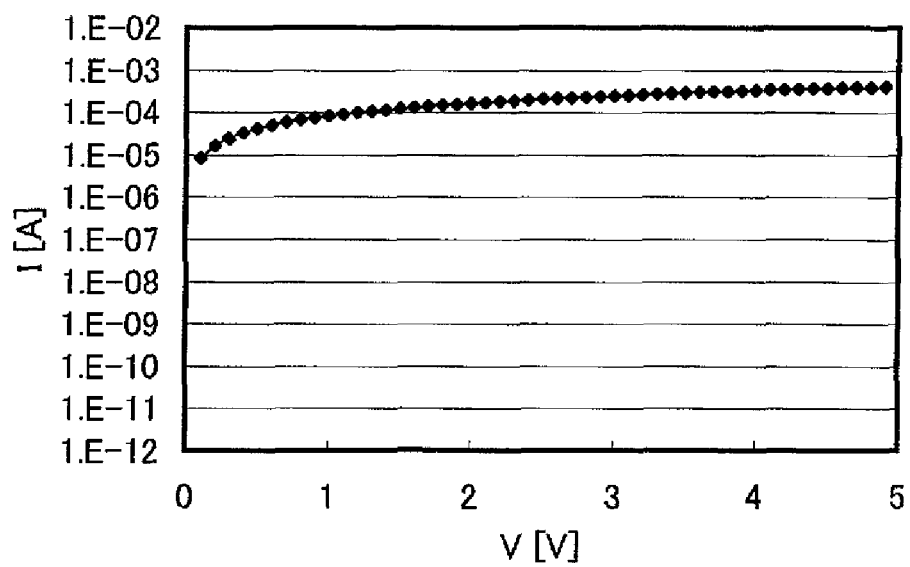
FIGS. 44A and 44B show results of a current test of Embodiment 1 of the present invention.

FIG. 44A shows the current value measured when a voltage is applied between $L_1$ and $L_2$. The minimum current is about $1.0 \times 10^{-5}$ (A), which shows that electric connection between $L_1$ and $L_2$ is maintained. That is, one gate wiring is not disconnected through the second etching.

Figure 44B:
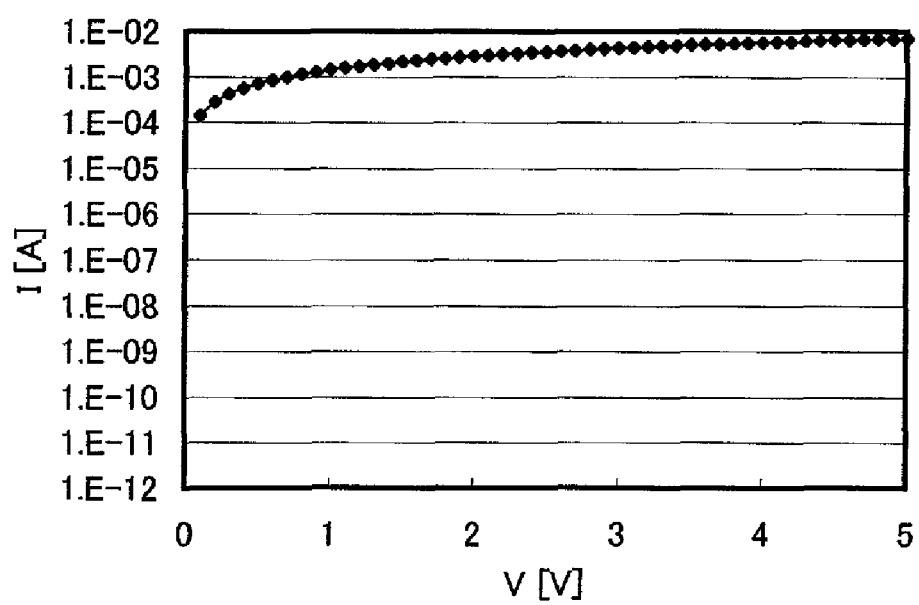

FIG. 44B shows the current value measured when a voltage is applied between X and Y. The minimum current is about $1.0 \times 10^{-4}$ (A), which shows that electric connection between X and Y is maintained. That is, the source wiring is not disconnected.

As described in this embodiment, a manufacturing method according to the present invention can be realized.

This application is based on Japanese Patent Application serial no. 2007-312348 filed with Japan Patent Office on Dec. 3, 2007, the entire contents of which are hereby incorporated by reference.

What is claimed is:

1. A manufacturing method of a thin film transistor, comprising the steps of:
    forming a first conductive film;
    forming an insulating film over the first conductive film;
    forming a semiconductor film over the insulating film;
    forming an impurity semiconductor film over the insulating film;
    forming a second conductive film over the impurity semiconductor film;
    forming a first resist mask over the second conductive film;
    first etching the insulating film, the semiconductor film, the impurity semiconductor film, and the second conductive film using the first resist mask to expose at least a surface of the first conductive film;
    second etching a portion of the first conductive film to form a gate electrode layer in such a manner that a width of the gate electrode layer is narrower than a width of the insulating film;
    forming a second resist mask over the second conductive film; and
    third etching the second conductive film, the impurity semiconductor film, and a part of the semiconductor film using the second resist mask to form source and drain electrode layers, source and drain region layers, and a semiconductor layer.

2. The manufacturing method of a thin film transistor according to claim 1, wherein the second etching is performed after forming the second resist mask.

3. The manufacturing method of a thin film transistor according to claim 1,
    wherein the first etching is dry etching, and
    wherein the second etching is wet etching.

4. A manufacturing method of a thin film transistor, comprising the steps of:
    forming a first conductive film;
    forming an insulating film over the first conductive film;
    forming a semiconductor film over the insulating film;
    forming an impurity semiconductor film over the insulating film;
    forming a second conductive film over the impurity semiconductor film;
    forming a first resist mask including a recessed portion, over the second conductive film;
    first etching the insulating film, the semiconductor film, the impurity semiconductor film, and the second conductive film using the first resist mask to expose at least a surface of the first conductive film;
    second etching a portion of the first conductive film to form a gate electrode layer in such a manner that a width of the gate electrode layer is narrower than a width of the insulating film;
    forming a second resist mask by making the first resist mask recede to expose a part of the second conductive film overlapping with the recessed portion of the first resist mask; and
    third etching the second conductive film, the impurity semiconductor film, and a part of the semiconductor film using the second resist mask to form a source and drain electrode layer, a source and drain region layer, and a semiconductor layer.

5. The manufacturing method of a thin film transistor according to claim 4, wherein the second etching is performed after forming the second resist mask.

6. The manufacturing method of a thin film transistor according to claim 4, wherein the first resist mask is formed using a multi-tone mask.

7. The manufacturing method of a thin film transistor according to claim 4,
wherein the first etching is dry etching, and
wherein the second etching is wet etching.

8. A thin film transistor comprising:
a gate electrode on an insulating surface;
an insulating film over the gate electrode;
a semiconductor layer over the insulating film;
an impurity semiconductor layer over the semiconductor layer; and
a conductive film over the impurity semiconductor layer,
wherein a cavity is formed adjacent to the gate electrode and between the insulating film and the insulating surface.

9. A thin film transistor according to claim 8,
wherein the semiconductor layer has a first recessed portion which is a channel region.

10. A thin film transistor according to claim 8,
wherein the semiconductor layer has a second recessed portion which overlaps with the cavity.

* * * * *